(12) United States Patent
Kawai et al.

(10) Patent No.: US 6,350,996 B1
(45) Date of Patent: Feb. 26, 2002

(54) LIGHT EMITTING DIODE DEVICE

(75) Inventors: Tatsundo Kawai, Hadano; Kazunori Ueno, Ebina, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/296,756

(22) Filed: Apr. 23, 1999

(30) Foreign Application Priority Data

Apr. 24, 1998 (JP) .............................................. 10-115068

(51) Int. Cl.[7] .............................................. H01L 33/00
(52) U.S. Cl. ............................ 257/88; 257/80; 257/81; 257/84; 257/103; 257/40
(58) Field of Search ............................. 257/88, 79, 80, 257/81, 84, 93, 103, 40

(56) References Cited

FOREIGN PATENT DOCUMENTS

| EP | 845770 | * | 6/1998 |
| JP | 07-57871 | | 3/1995 |
| JP | 9-16123 | * | 1/1997 |

* cited by examiner

*Primary Examiner*—Minh Loan Tran
(74) *Attorney, Agent, or Firm*—Fitzpatrick, Cella, Harper & Scinto

(57) ABSTRACT

A light emitting diode device includes a light emitting diode and a non-linear element which are arranged on a substrate. The non-linear element is composed of an organic compound layer.

21 Claims, 68 Drawing Sheets

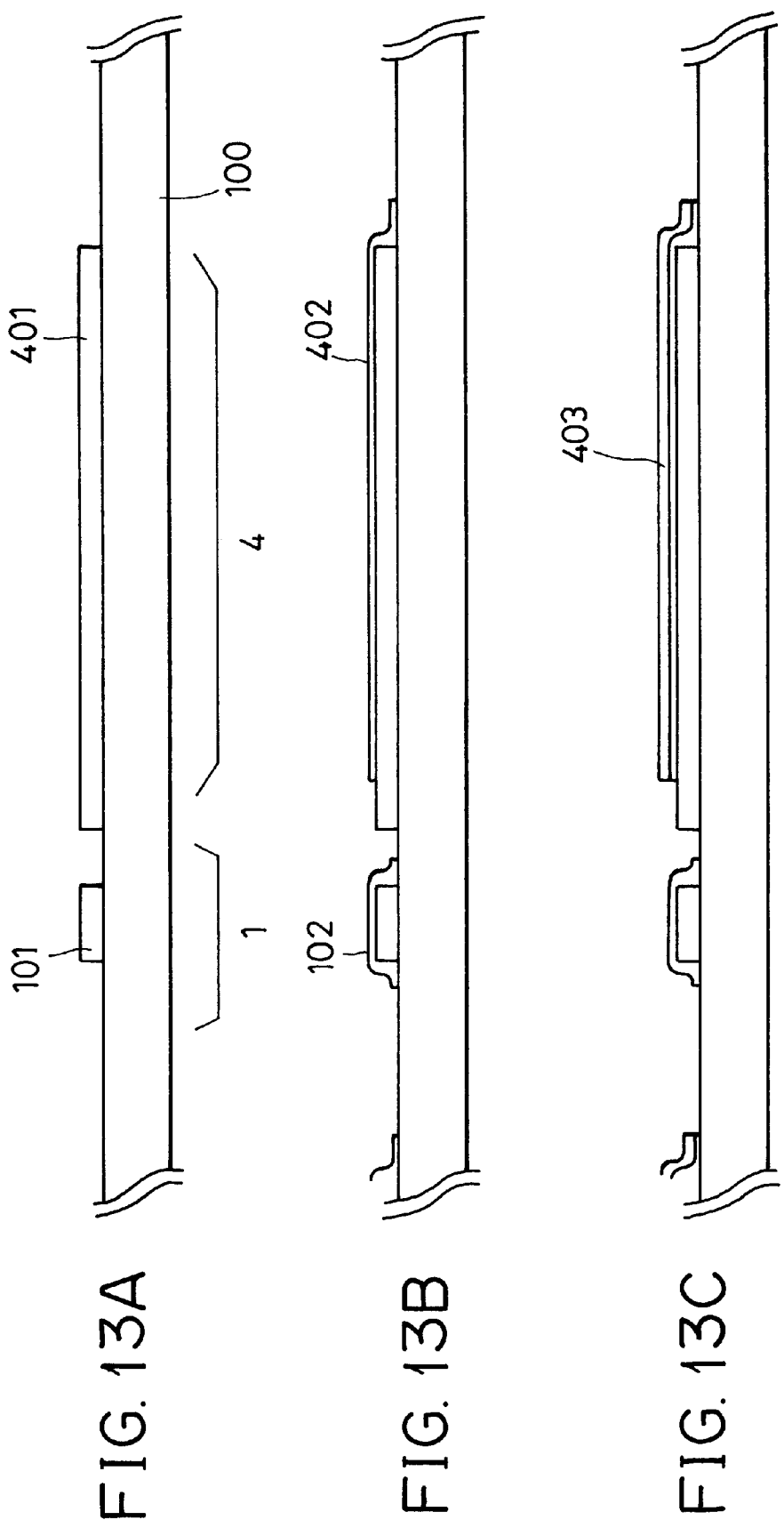

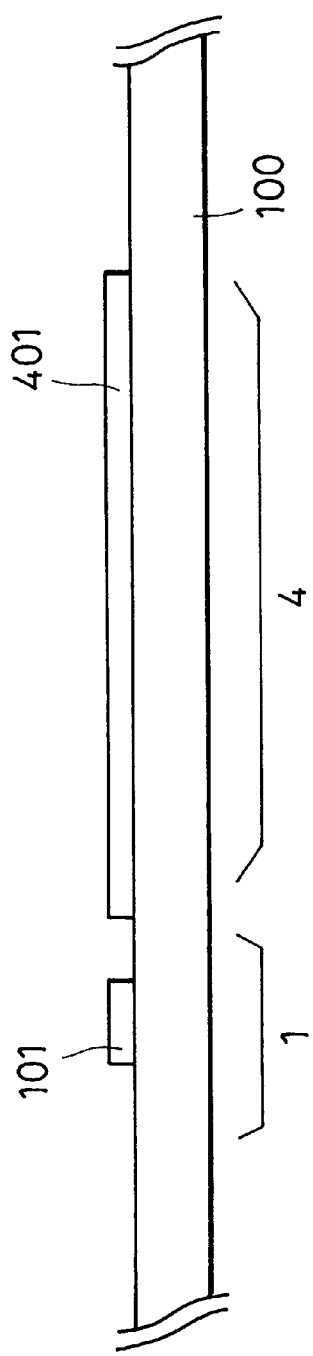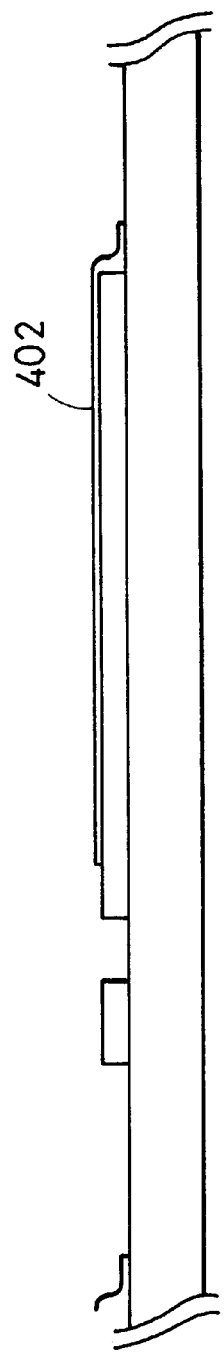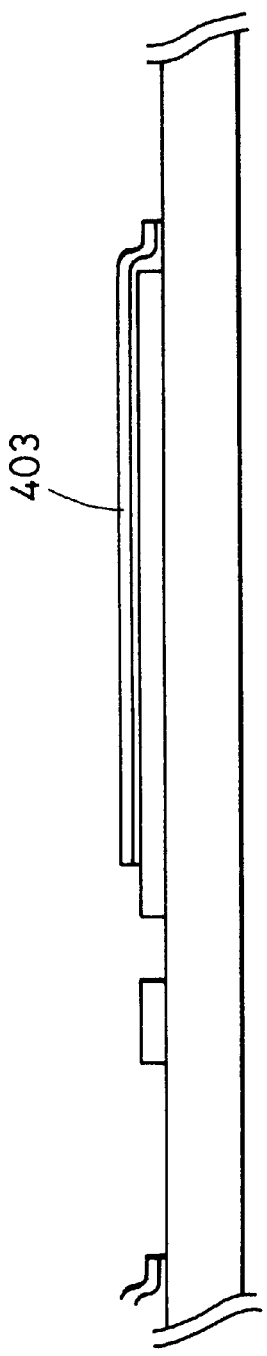

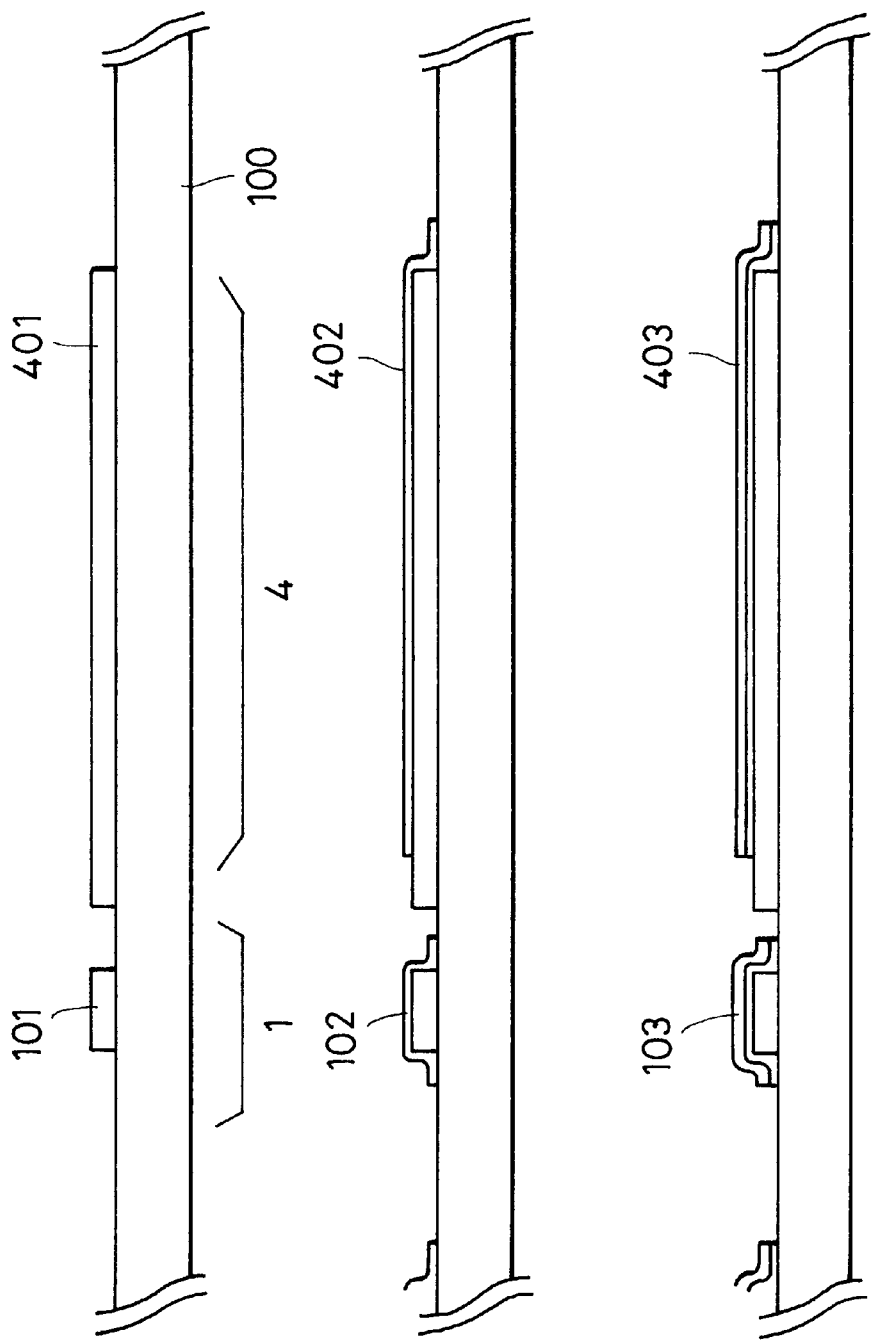

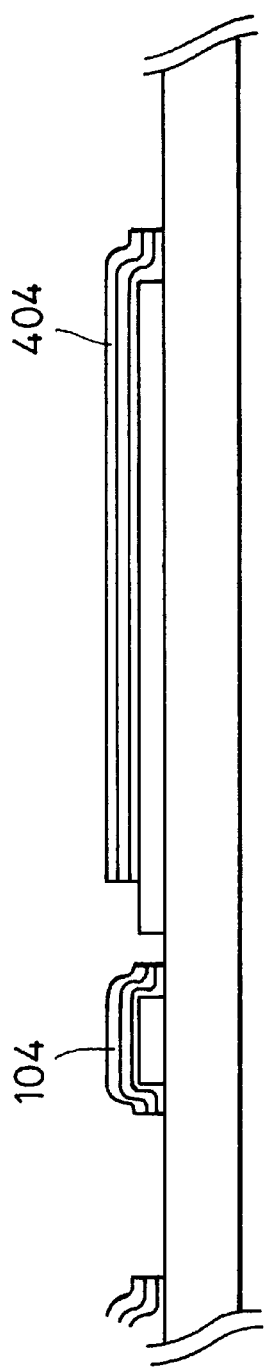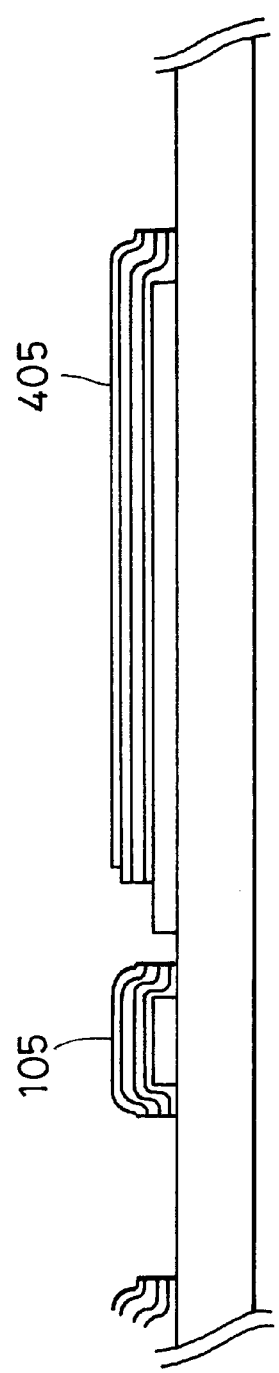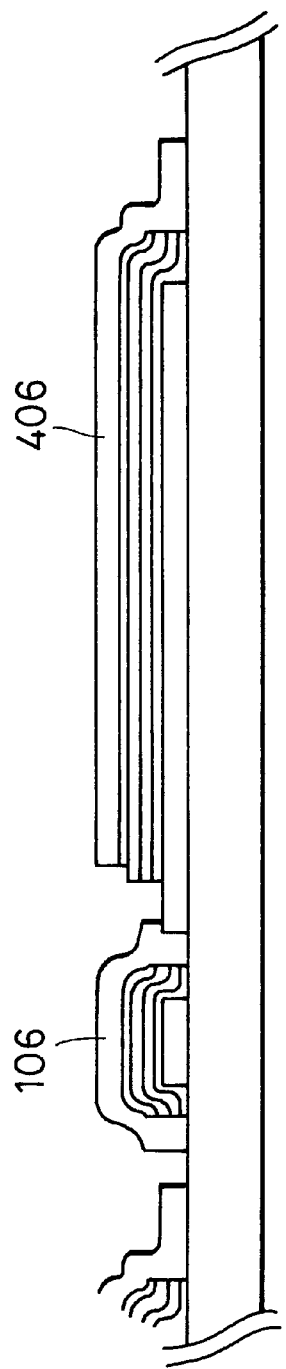

LIGHT SHIELDING LAYER

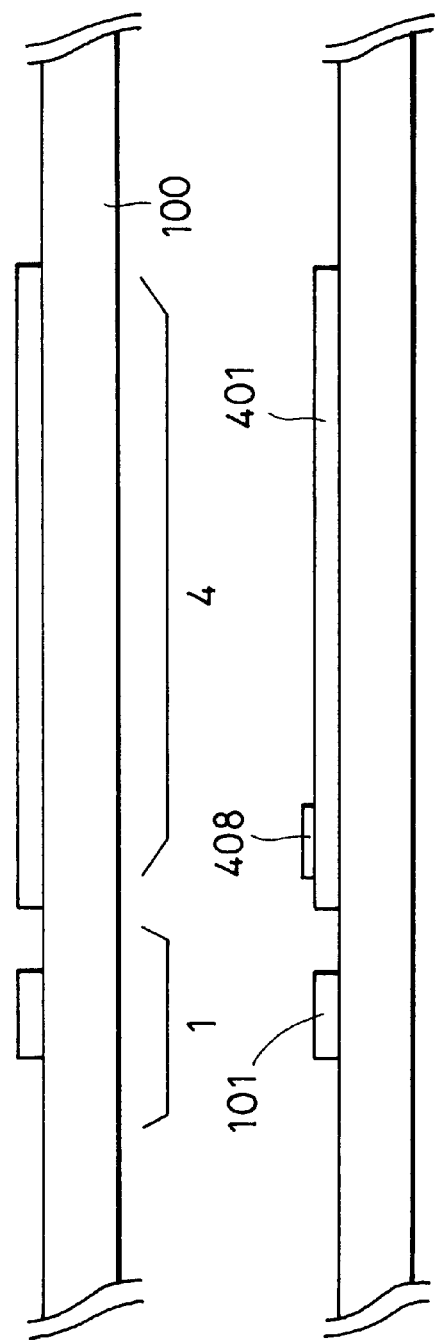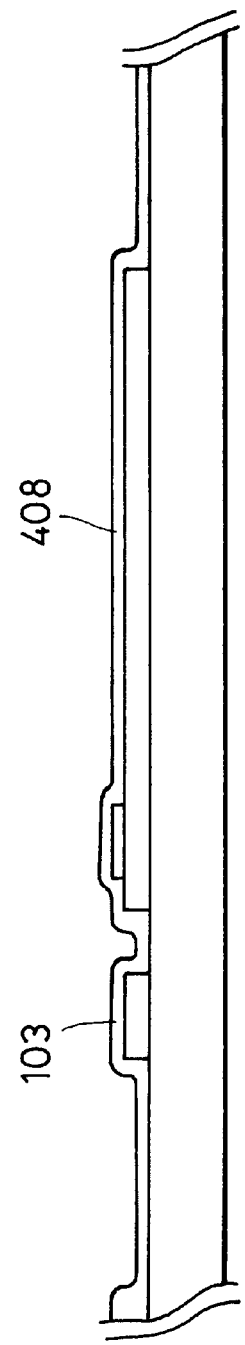
FIG. 23A
FIG. 23B
FIG. 23C

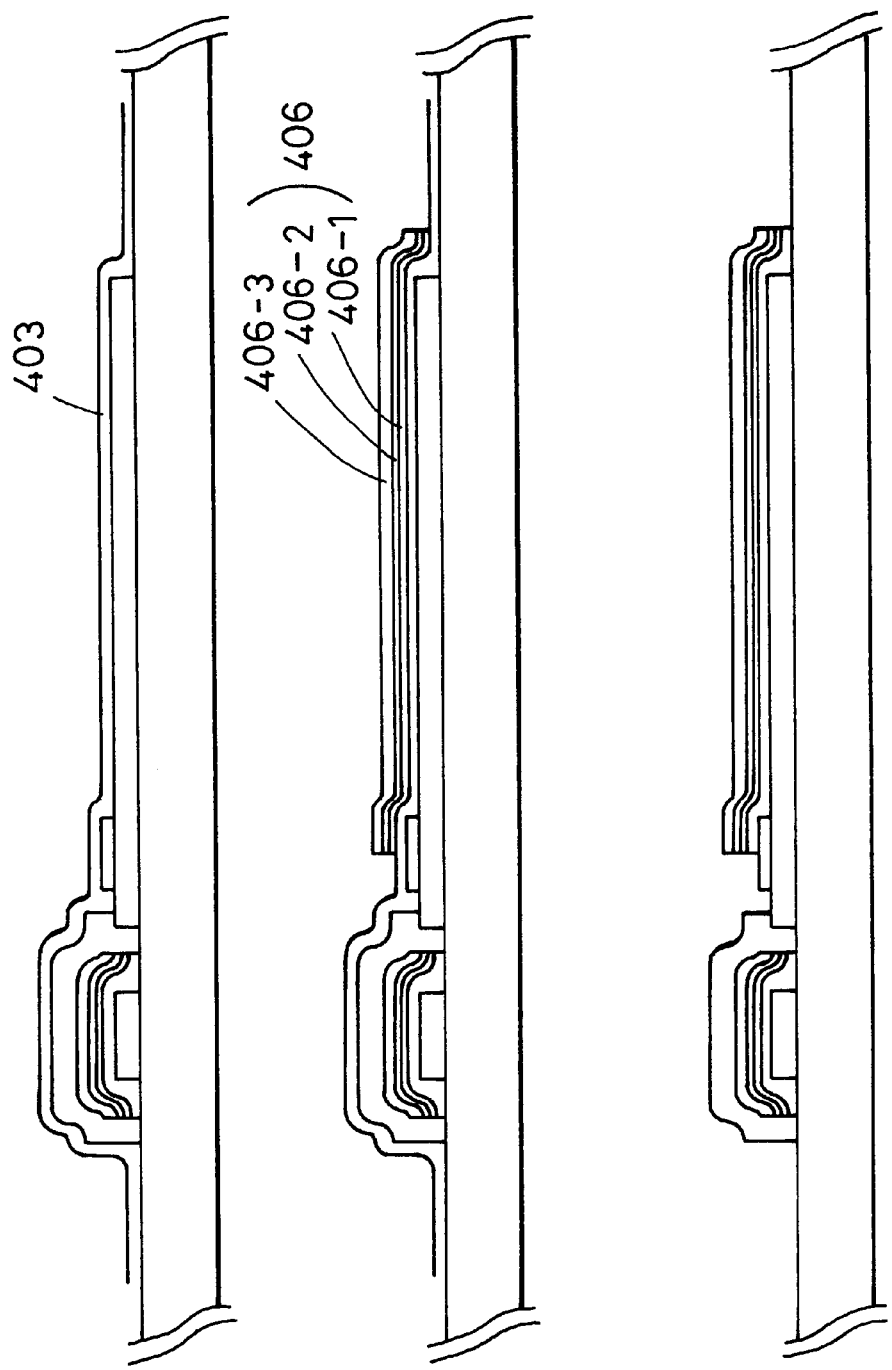

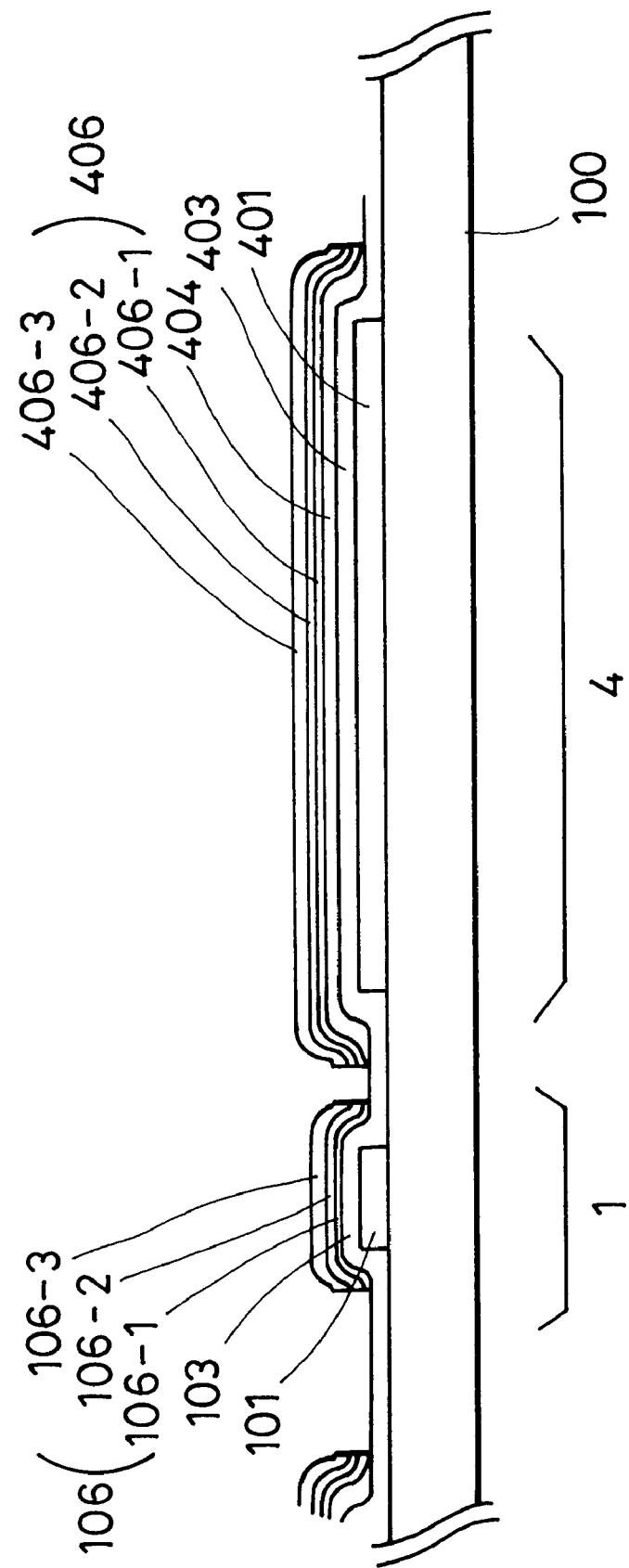

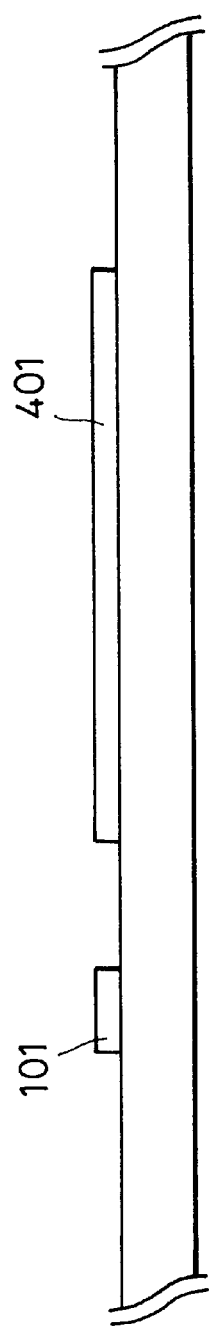
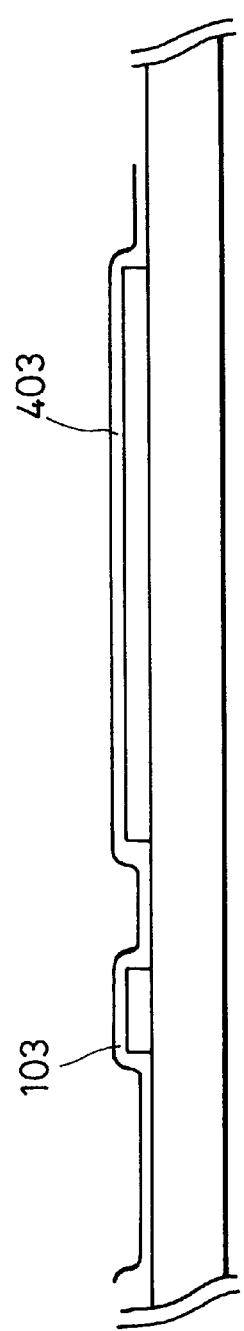
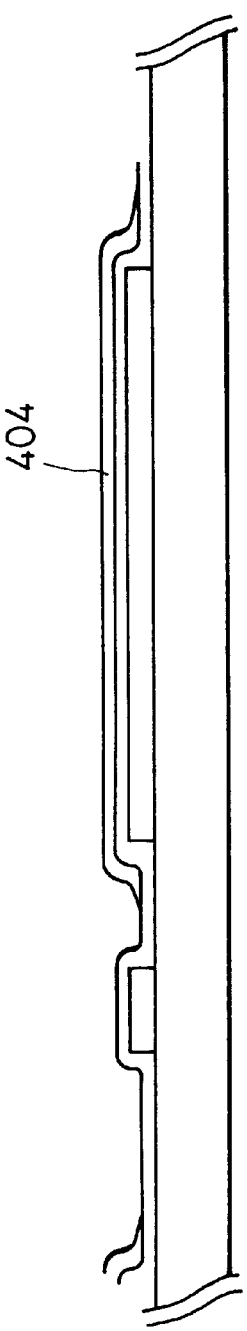

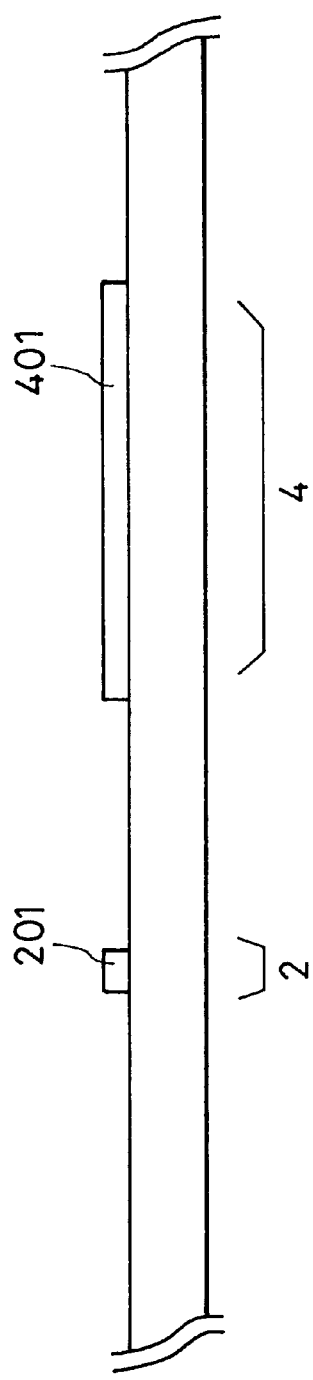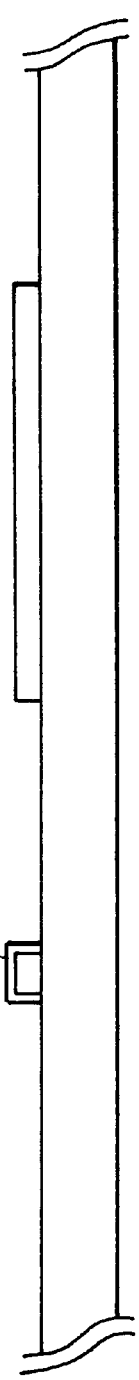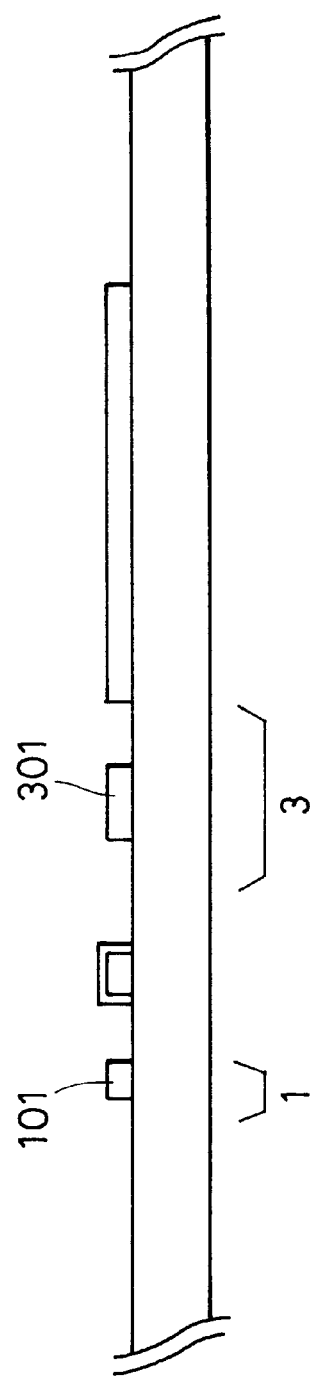

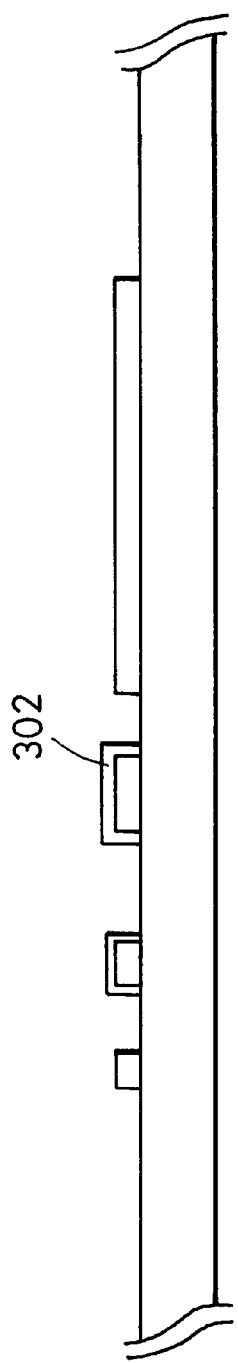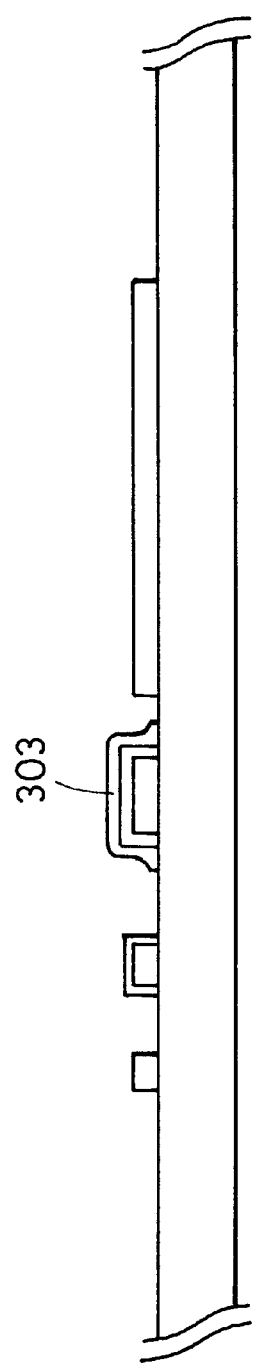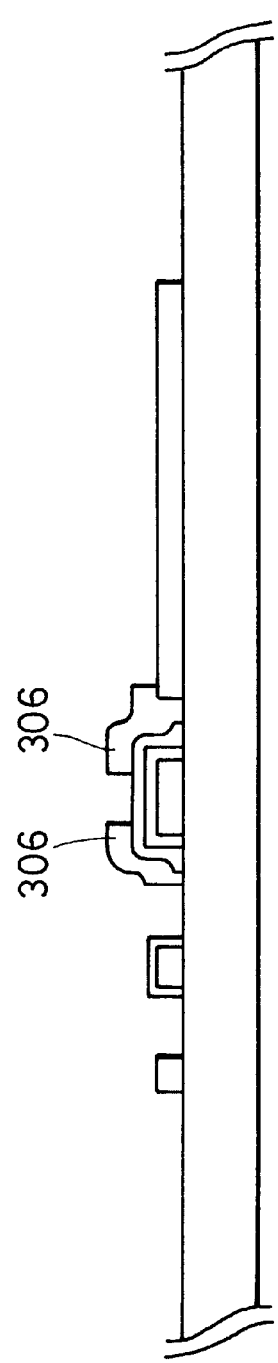

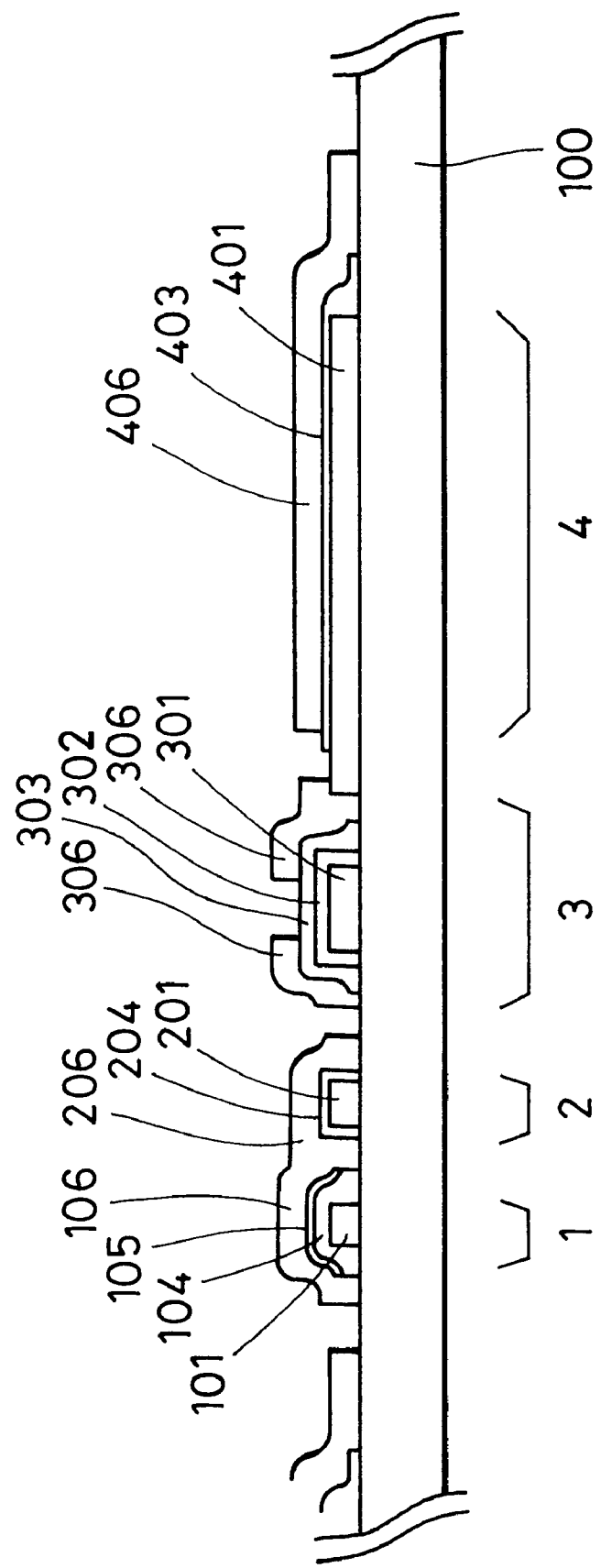

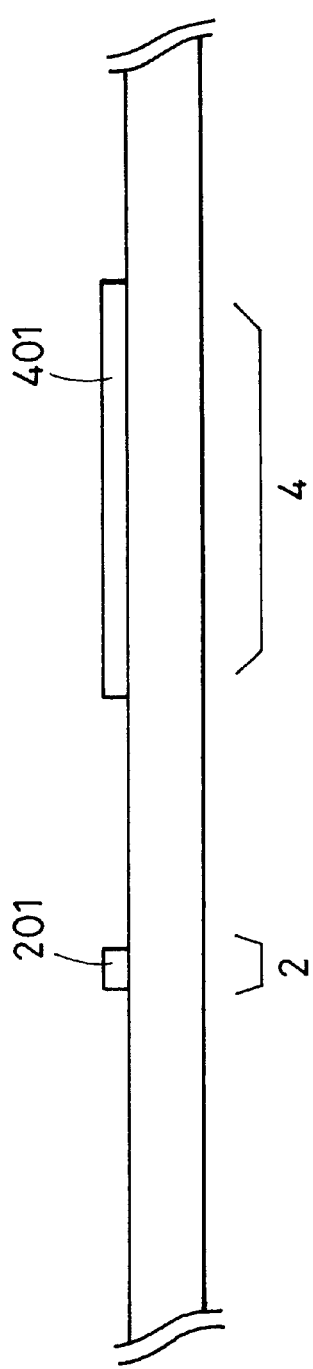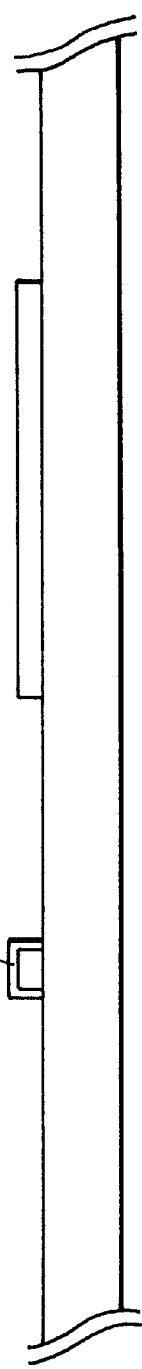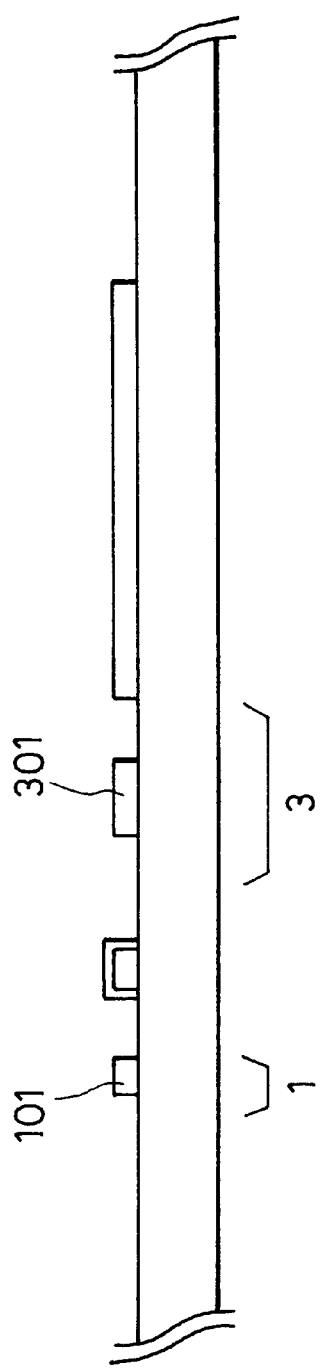

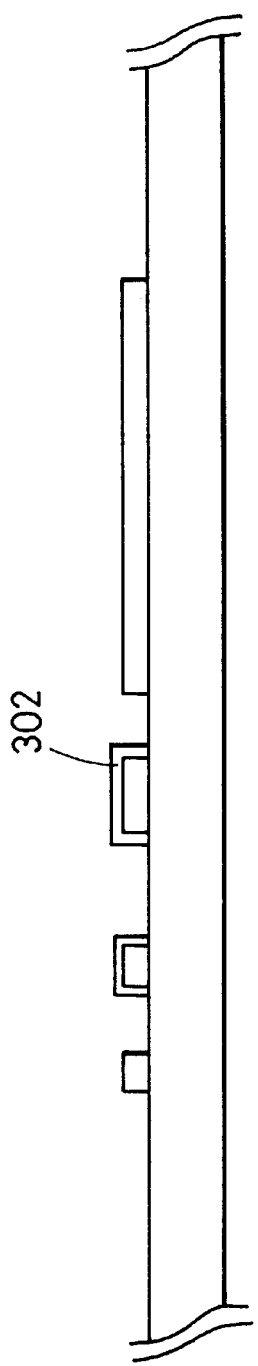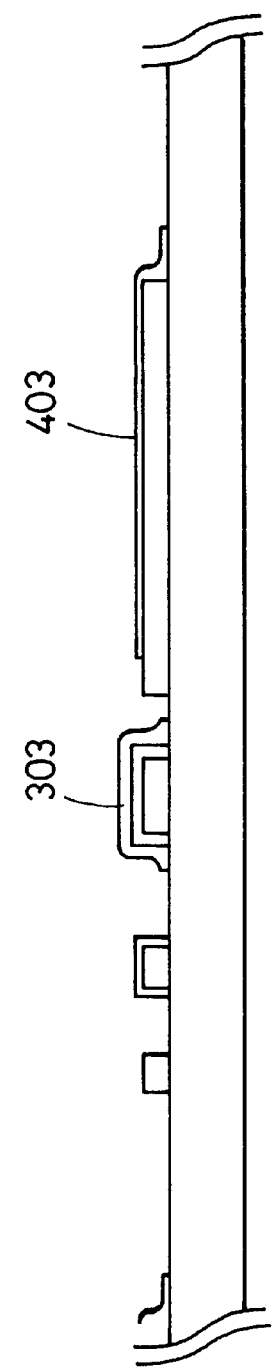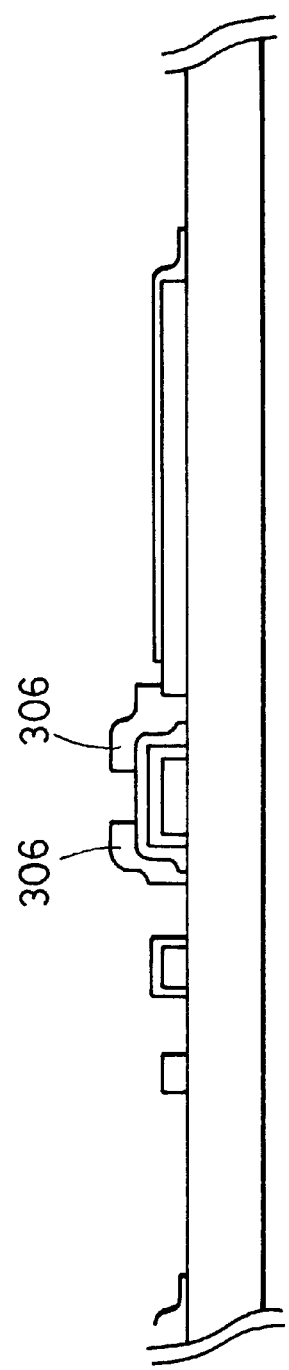

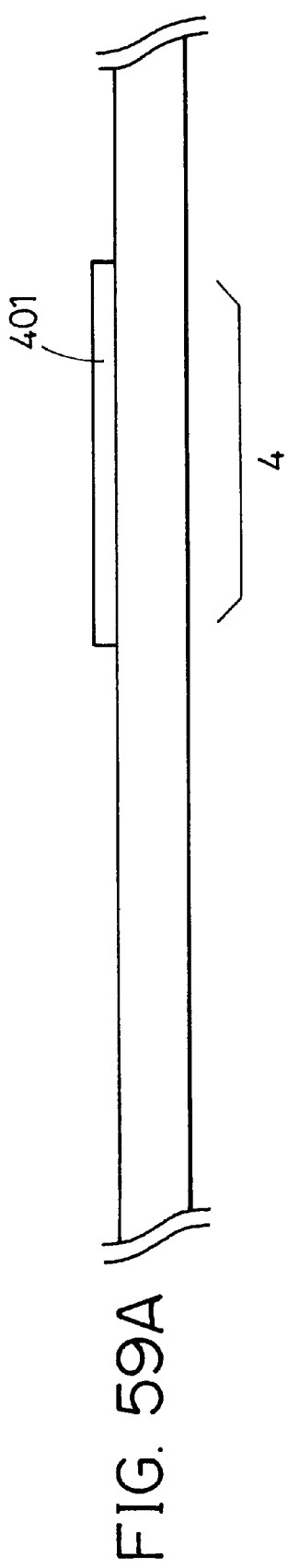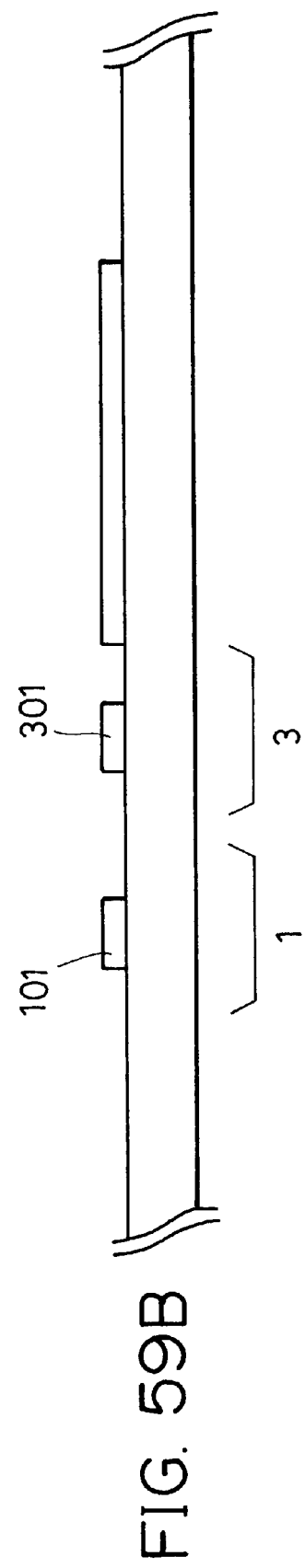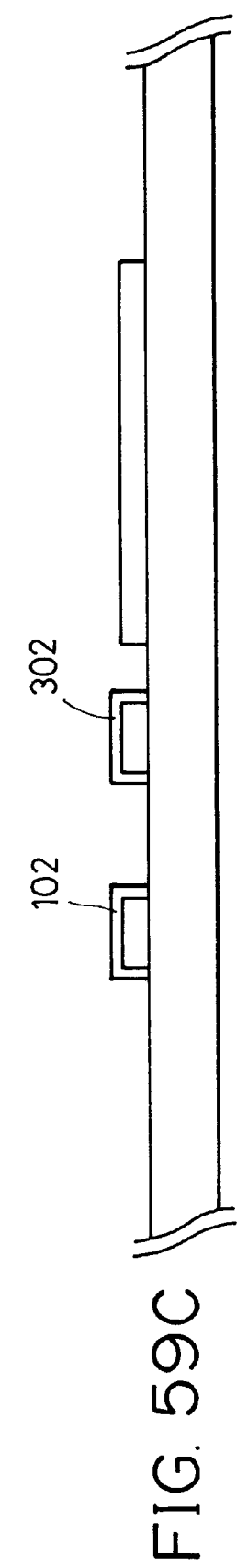

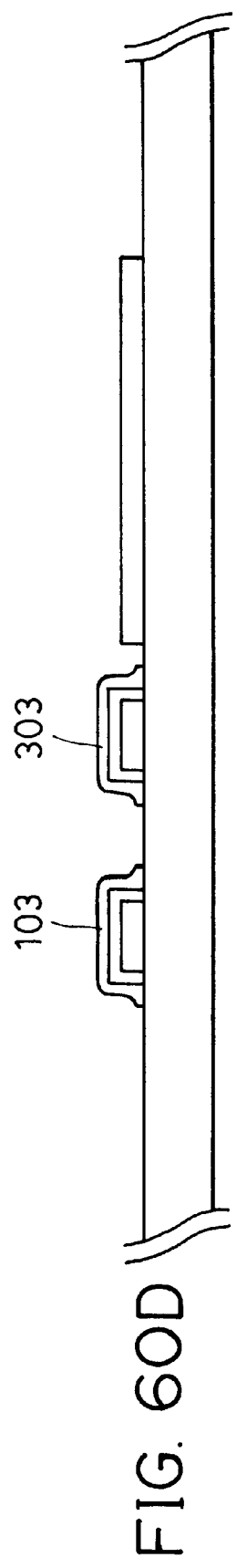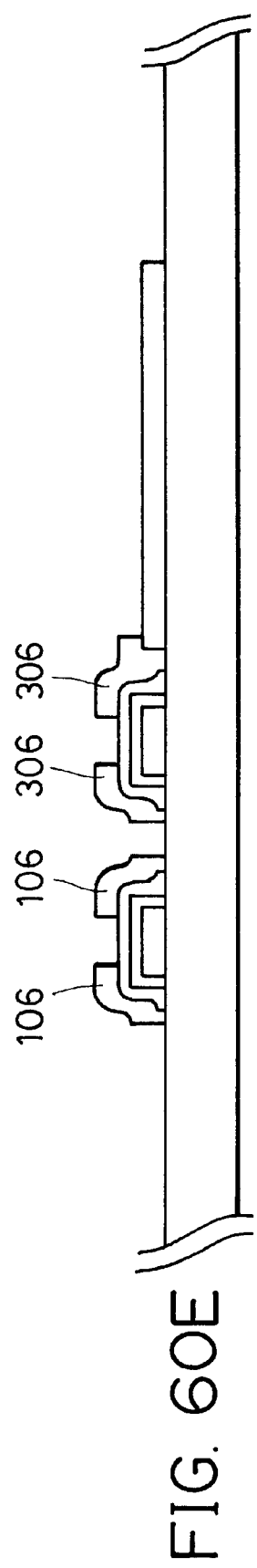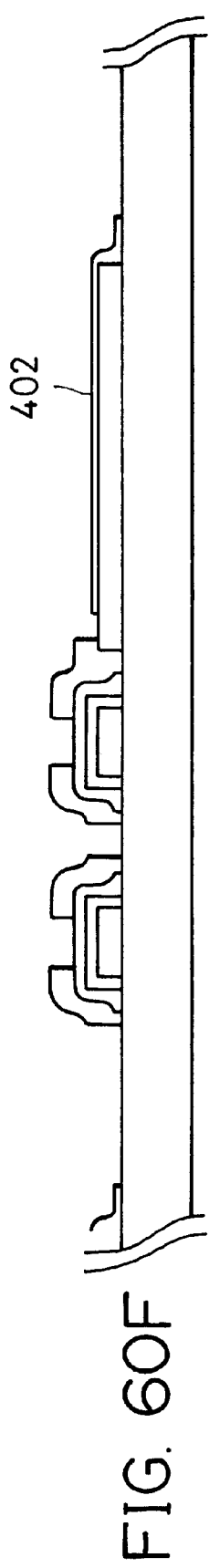

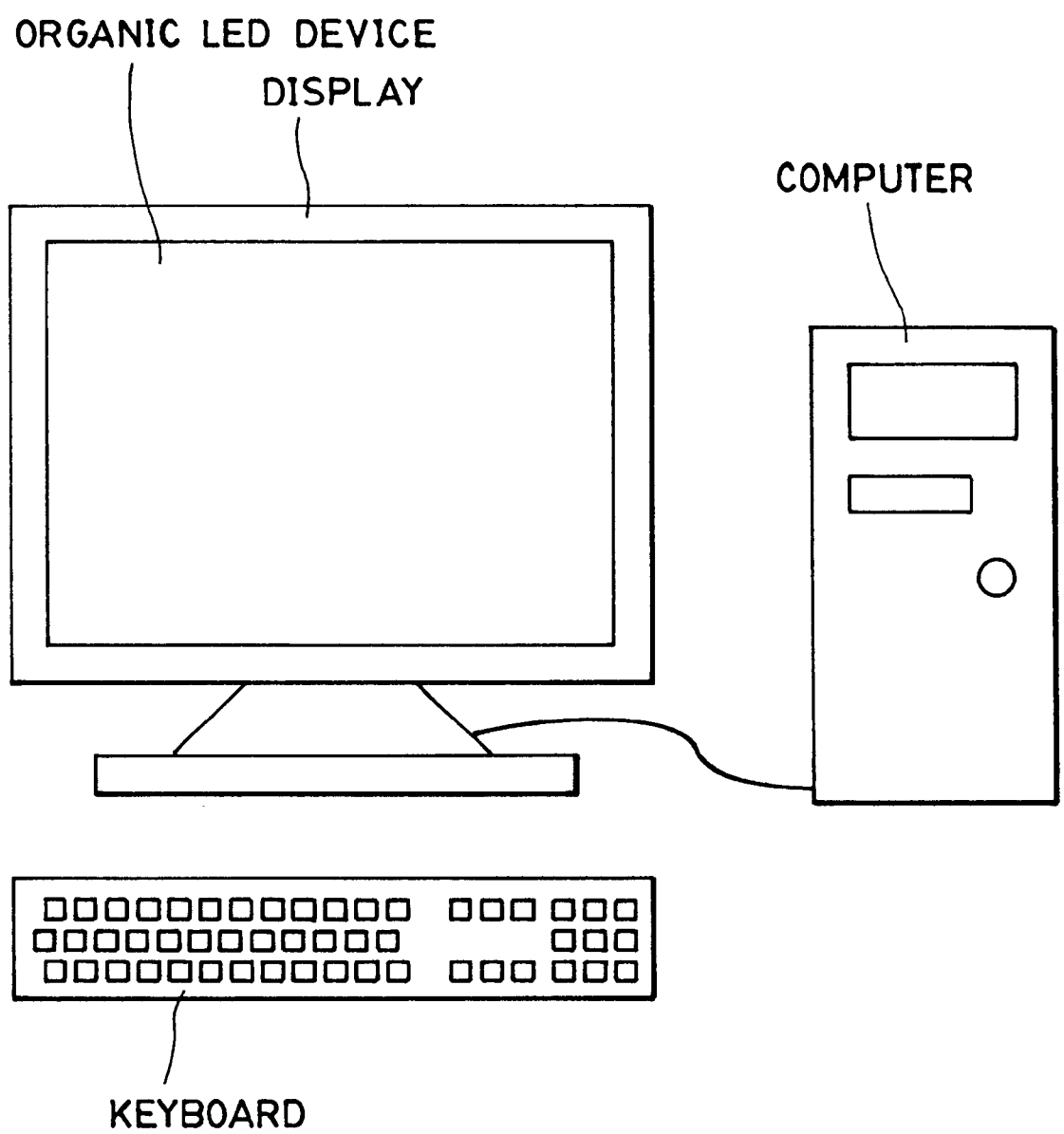

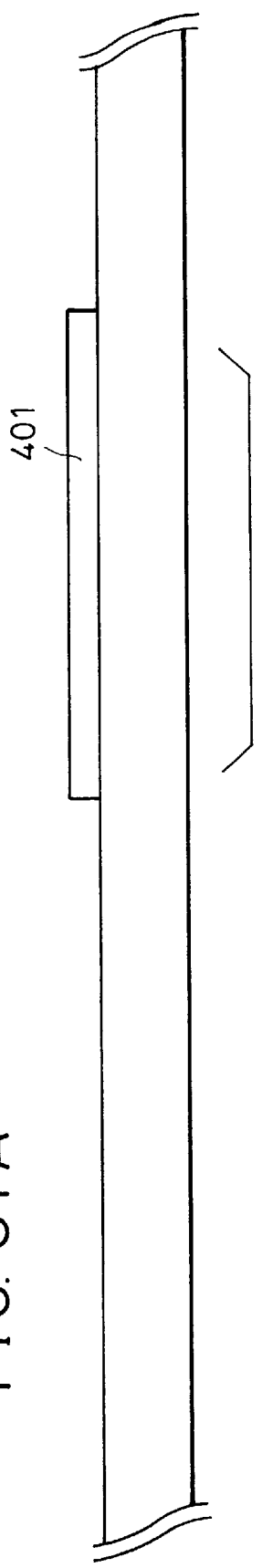
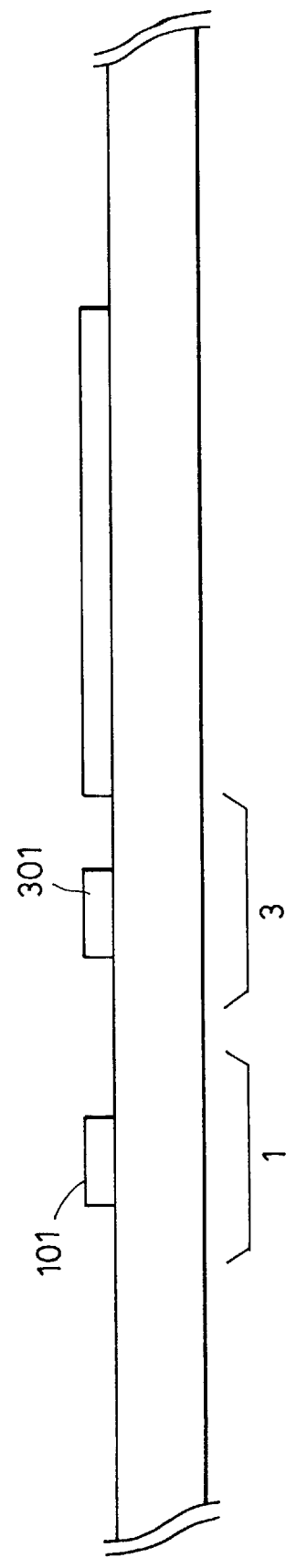
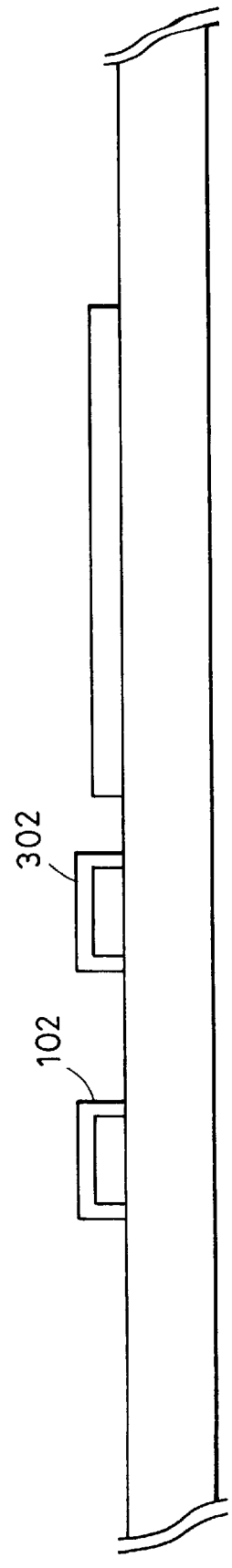
FIG. 67A
FIG. 67B
FIG. 67C

LIGHT EMITTING DIODE DEVICE

BACKGROUND OF THE INVENTION

1. Field of the Invention

The present invention relates to a light emitting diode device used for a copying machine, a printer, a display, an original illuminating light source of an image reading apparatus, and the like, and a method of manufacturing the light emitting diode device.

2. Description of the Related Art

A light emitting diode device, in which a plurality of pixels each comprising a micro light emitting portion are arranged to permit the emission of light from each of the pixels to be independently controlled, is conventionally used as a panel or a back light of a display device or the like; an internal writing head of an image forming apparatus such as a copying machine, a printer, or the like; or an original illuminating light source of an image reading apparatus.

Such a conventional light emitting diode device is produced by a method comprising arranging light emitting diode chips comprising an inorganic semiconductor crystal such as GaAs or AlInGaP in a one-dimensional or two-dimensional form, or a method comprising depositing a thin film of an inorganic material such as ZnS or the like on a substrate, and then patterning the thin film to form pixels.

An example of a display device using light emitting diode chips which is brought into practical use is a large outdoor display device of a several meters square in which packages of respective light emitting diode chips are arranged in a two-dimensional form.

Also an internal reading head of an image forming apparatus such as a copying machine, a printer, or the like is brought into practical use, in which light emitting chips each having many micro light emitting portions provided thereon are arranged in a one-dimensional form.

However, the method of arranging light emitting chips has the problem of causing difficulties in miniaturizing the apparatus and improving arrangement precision.

The method of depositing a thin film of an inorganic material such as ZnS or the like on a substrate, and then patterning the thin film to form pixels is suitable for miniaturizing the apparatus, and permits photolithographic patterning or the like with high precision. This method does not have the above-described problem, but has a problem in which the device cannot be driven with a direct current at a low voltage suitable for design of an electronic apparatus.

On the other hand, an organic thin film light emitting diode (organic light emitting element) has recently been developed, which can be formed in a thin film on a substrate of a large area, and which can be driven with a direct current. In order to solve the above problems, therefore, the use of an organic light emitting device as a light emitting device is proposed, in which light emitting portions comprising organic light emitting elements are arranged in a one-dimensional or two-dimensional form.

FIG. 70 shows a typical structure of an organic light emitting diode.

Referring to FIG. 70, the organic light emitting diode comprises a substrate 100, a transparent electrode 401 made of indium/tin oxide (ITO), a hole transport layer 403 made of an organic hole transport material such as an aromatic diamine (Formula 2) or the like, and an organic electron transport layer 404 made of an organic electron transport material such as tris(8-quinolinolato)aluminum complex (Formula 3).

The organic light emitting diode further comprises a cathode made of a material having a low work function, such as Al, a Mg:Ag alloy, or the like. When a voltage is applied between an anode and cathode, holes injected into the hole transport layer from the anode are recombined with electrons injected into the electron transport layer from the cathode through an electron injection layer to emit light.

As the simplest method for arranging a plurality of micro pixels each comprising such a light emitting diode to enable independent control of the emission of light from each of the pixels, a plurality of parallel stripe anodes are formed on a substrate, the hole transport layer and the electron transport layer are laminated on the anode, and stripe cathodes are further formed on the hole and electron transport layers perpendicularly to the anodes to form a simple matrix in which a pixel is formed at each of the intersections of the anodes and the cathodes. In order to drive this structure, for example, the lines of the cathodes formed in parallel stripes are successively connected to a negative power source and disconnected therefrom, and in synchronism therewith, the anodes are successively connected to a positive power source or disconnected therefrom. By this operation, each of the pixels is flashed only at a moment when the cathode connected to the corresponding pixel is connected to the negative power source depending upon whether or not the anode is connected to the positive power source at that moment.

In this simple method, since only one of the plurality of cathode lines is connected to the negative power source at a moment, only the pixels connected to the line connected to the negative power source are flashed depending upon whether or not the anodes are connected to the positive power source, all other pixels being turned off regardless of whether the anodes are connected to the positive power source. This operation has the property that the lighting duty of the pixels decreases with an increase in the number of lines of the cathodes.

Therefore, this method has the drawback that although the luminance is high at a lighting moment, the effective luminance as an average luminance for a predetermined time decreases as the number of pixels increases to increase the number of cathode lines.

In order to improve this point, a light emitting diode device has been proposed in which a non-linear element such as a transistor or capacitor is provided on each of the pixels.

Of devices using the above-mentioned organic light emitting diode, an example of light emitting diode devices in which light emitting portions used in a display device are arranged in a two-dimensional form is described below.

FIG. 71 is a drawing showing an equivalent circuit of a single pixel in such a light emitting diode device.

The circuit shown in FIG. 71 comprises a first thin film transistor (address transistor) 1 which constitutes a pixel, a storage capacitor 2, a second thin film transistor (driving transistor), and an organic light emitting diode 4. The circuit further comprises an electrode Ps connected to the source electrode of the address transistor, an electrode Pm connected to the second side of the storage capacitor and the gate electrode of the driving transistor, an electrode Pg connected to the gate electrode of the address transistor, an electrode Pc connected to the first side of the storage capacitor and the source electrode of the driving transistor, and an electrode Pled connected to a cathode of the organic light emitting diode 4.

A selection signal is applied to the electrode Pg, a data signal is applied to the electrode Ps, and a potential appears in the electrode Pm by charge and discharge of the storage capacitor according to the data signal. The electrodes Pc and Pled are at fixed potentials.

The circuit is operated as described below.

When the selection signal applied to the electrode Pg is brought to a selection state (high-potential state), the potential of the electrode Pg decreases. As a result, conduction occurs between the source and drain of the address transistor, and a current flows in and out of the storage capacitor 2 according to the data signal applied to the electrode Ps to set a potential difference between the source and gate electrodes of the driving transistor, i.e., a potential difference between the electrodes Pc and Pm, to a value corresponding to the data signal applied to the electrode Ps. Therefore, a current flows through the driving transistor 3 according to the data signal, and the organic light emitting diode 4 emits light with a luminance corresponding to the data signal. When the selection signal applied to the electrode Pg is brought to a non-selection state (low-potential state), the source and drain of the address transistor are made nonconductive, and no current flows in and out of the storage capacitor 2 through the address transistor 1 even if the data signal applied to the electrode Pd changes. Therefore, there is little change in the potential difference between the electrodes Pc and Pm, thereby hardly, if at all, affecting the emission of light from the organic light emitting diode 4.

FIG. 72 is a plan view showing four pixels in a portion of such an organic light emitting device.

Each of the pixels comprises a first thin film transistor (address transistor) 1, a second thin film transistor (driving transistor) 3, and a light emitting element 4 which constitutes a light emitting portion.

FIG. 73 is a sectional view of thin film transistors which constitute each of pixels of a conventional organic light emitting diode device.

A driving transistor comprises a substrate 100, a gate electrode 301 made of amorphous silicon, a gate insulating layer 302 made of $SiO_2$, an active layer 303 made of amorphous silicon, and source and drain electrodes 306 made of Al.

In such a light emitting diode device, an address transistor, a driving transistor and a storage capacitor are provided in each of pixels to store charge in the storage capacitor according to a data signal during the selection period, thereby continuously emitting light from the light emitting element during the non-selection period according to the stored charge. Therefore, even in a device in which many pixels are arranged, the light emission duty of each pixel is high, and the effective luminance does not deteriorate.

However, in a conventional light emitting diode device, since a transistor of each of the pixels is made of polycrystalline silicon or amorphous silicon, after the process for forming a transistor made of polycrystalline silicon or amorphous silicon on a substrate, the process for forming an organic light emitting element must be further carried out. For example, a labor-intensive and time-consuming process is required, in which an amorphous silicon film is deposited by a plasma CVD apparatus and then scanned by a laser beam and annealed to be converted to a polycrystalline silicon film. This causes an increase in cost.

On the other hand, Japanese Patent Laid-Open No. 7-57871 discloses an active matrix field light emitting display device comprising a three-terminal field light emitting element and a thin film transistor, both of which are provided in each of pixels, wherein the thin film transistor is made of an organic semiconductor thin film. The use of the organic semiconductor thin film for the thin film transistor has the advantage that it is unnecessary to deposit an a-Si film and form an island.

However, the light emitting display device disclosed in this publication uses the three-terminal light emitting elements, and thus the actual manufacturing process, which requires much time, must be taken into consideration because the structure is relatively complicated as compared with a general diode type. Also control means is required for driving the light emitting display device.

SUMMARY OF THE INVENTION

The present invention has been achieved in consideration of the above problems, and an object of the present invention is to provide a light emitting diode device in which the emission duty of pixels is high, the time-average effective luminance for a predetermined time is high, and the manufacturing cost is low.

Another object of the present invention is to provide a light emitting diode device having a simple configuration and high controllability.

A further object of the present invention is to provide a light emitting diode device comprising a light emitting diode and a non-linear element, which are arranged on a substrate, wherein the non-linear element is composed of an organic compound layer.

A still further object of the present invention is to provide a method of manufacturing a light emitting diode device comprising a light emitting diode and a non-linear element which are arranged on a substrate, wherein each of the light emitting diode and the non-linear element is composed of an organic compound layer.

The manufacturing method includes a mode in which the organic compound layers which respectively constitute the light emitting diode and the non-linear element comprise different materials.

The manufacturing method includes a mode in which the organic compound layers which respectively constitute the light emitting diode and the non-linear element comprise the same material.

The light emitting diode device and the manufacturing method therefor of the present invention permit the formation of a simple structure and a non-linear element using an organic compound layer. This can simplify the process and decrease the cost, as compared with a conventional method of forming a non-linear element by using amorphous silicon or polycrystalline silicon. In addition, by using, as the non-linear element, an element such as a diode, a MIM element, or the like, in which the resistance of the element is controlled for a current flowing in the thickness direction of the organic layer, it is possible to relax limits to material selection, and obtain an element having well-balanced characteristics and cost.

The light emitting diode device and the manufacturing method therefor of the present invention permits realization of an organic light emitting element having a simple structure, high emission strength, and little cross talk by a simplified process.

Further objects, features and advantages of the present invention will become apparent from the following description of the preferred embodiments with reference to the attached drawings.

BRIEF DESCRIPTION OF THE DRAWINGS

FIGS. 13A–13C are schematic drawings showing a method of manufacturing the device in accordance with the second embodiment of the present invention;

FIGS. 16A–16C are schematic drawings showing a method of manufacturing the device in accordance with the third embodiment of the present invention;

FIGS. 19A–19C are schematic drawings showing a method of manufacturing the device in accordance with the fourth embodiment of the present invention;

FIGS. 20D–20F are a schematic drawings showing the method of manufacturing the device in accordance with the fourth embodiment of the present invention;

FIGS. 23A–23C are schematic drawings showing a method of manufacturing the device in accordance with the fifth embodiment of the present invention;

FIGS. 25G–25I are schematic drawings showing a method of manufacturing the device in accordance with the fifth embodiment of the present invention;

FIG. 27 is a schematic drawing showing the configuration of a device of a sixth embodiment of the present invention;

FIGS. 28A–28C are schematic drawings showing a method of manufacturing the device in accordance with the sixth embodiment of the present invention;

FIGS. 48A–48C are schematic drawings showing a method of manufacturing the device in accordance with the twelfth embodiment of the present invention;

FIGS. 49D–49F are schematic drawings showing the method of manufacturing the device in accordance with the twelfth embodiment of the present invention;

FIG. 52 is a schematic drawing showing the configuration of a device of a thirteenth embodiment of the present invention;

FIGS. 53A–53C are schematic drawings showing a method of manufacturing the device in accordance with the thirteenth embodiment of the present invention;

FIGS. 54D–54F are schematic drawings showing the method of manufacturing the device in accordance with the thirteenth embodiment of the present invention;

FIGS. 59A–59C are schematic drawings showing a method of manufacturing the device in accordance with the fourteenth embodiment of the present invention;

FIGS. 60D–60F are schematic drawings showing the method of manufacturing the device in accordance with the fourteenth embodiment of the present invention;

FIG. 63 is a schematic drawing showing a display device using the device of the present invention, and a computer system;

FIGS. 67A–67C are schematic drawings showing a method of manufacturing the device shown in FIG. 66;

DESCRIPTION OF THE PREFERRED EMBODIMENT

Non-linear elements having a region in which a flowing current is not proportional to the applied voltage include an element having a diode configuration.

Figure 1:
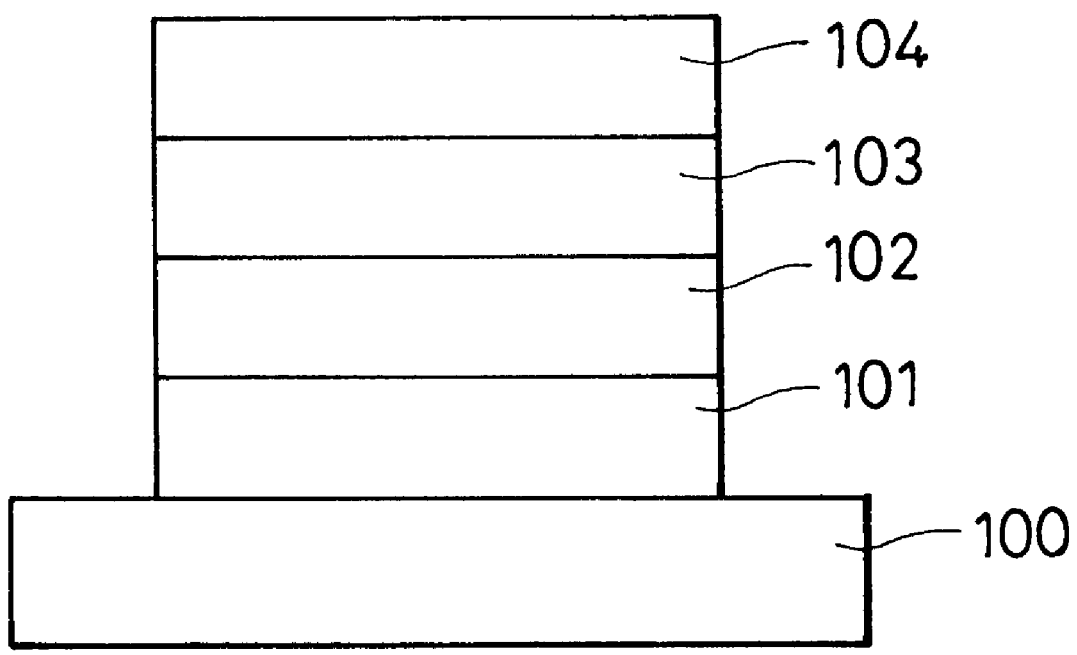
FIG. 1 is a schematic drawing showing an example of the configuration of a diode which can be applied to the present invention.

FIG. 1 shows a typical example of the diode configuration.

The diode configuration shown in FIG. 1 comprises a substrate 100; an anode 101 made of a metal having a high work function, such as Au, Ag, or the like, or indium/tin oxide (ITO); a hole transport layer 102 capable of conducting holes in the layer; an electron transport layer 103 capable of conducting electrons in the layer; and a cathode 104 made of a metal having a low work function, such as Al, Mg, or the like.

The electron transport layer 103 may be made of a polymeric semiconductor which forms a π electron conjugate orbit, or a material which can conduct electrons in a low-molecular deposited film by a hopping conduction mechanism in which electrons are conducted between molecules through the lowest unoccupied molecular orbit (LUMO). Alternatively, the electron transport layer 103 may be made of a material which can conduct electrons between the molecules dispersed in a polymeric mother material by a hopping conduction mechanism. The electron transport layer 103 may also be realized by inserting such material which can conduct electrons in a low molecular deposited film by hopping conduction into the main chain or side chains of a polymer, or other various forms.

The hole transport layer 102 may be made of a polymeric semiconductor which forms π electron conjugate orbits, or a material which can conduct holes in a low-molecular deposited film by the hopping conduction mechanism in which holes are conducted between molecules through the highest occupied molecular orbit (HOMO). Alternatively, the hole transport layer 102 may be made of a material which can conduct holes between the molecules dispersed in a polymeric mother material by the hopping conduction mechanism. The hole transport layer 102 may also be realized by inserting such material which can conduct electrons in a low molecular deposited film by hopping conduction into the main chain or side chains of a polymer, or other various forms.

The layer structure of a diode is not limited to the above-mentioned structure.

The hole transport layer and the electron transport layer are not necessarily required, and for example, only the electron transport layer is provided to employ the energy barrier formed between the electron transport layer and an electrode according to characteristics. Conversely, a hole injection layer may be provided between the hole transport layer and the anode, or between the electron transport layer and the cathode, or a light emitting layer and recombination layer may be further provided between the hole transport layer and the electron transport layer. There are other various layer structures.

Such an element shows voltage-current characteristics (diode characteristics) similar to a diode comprising an inorganic semiconductor such as silicon or the like.

Figure 2:
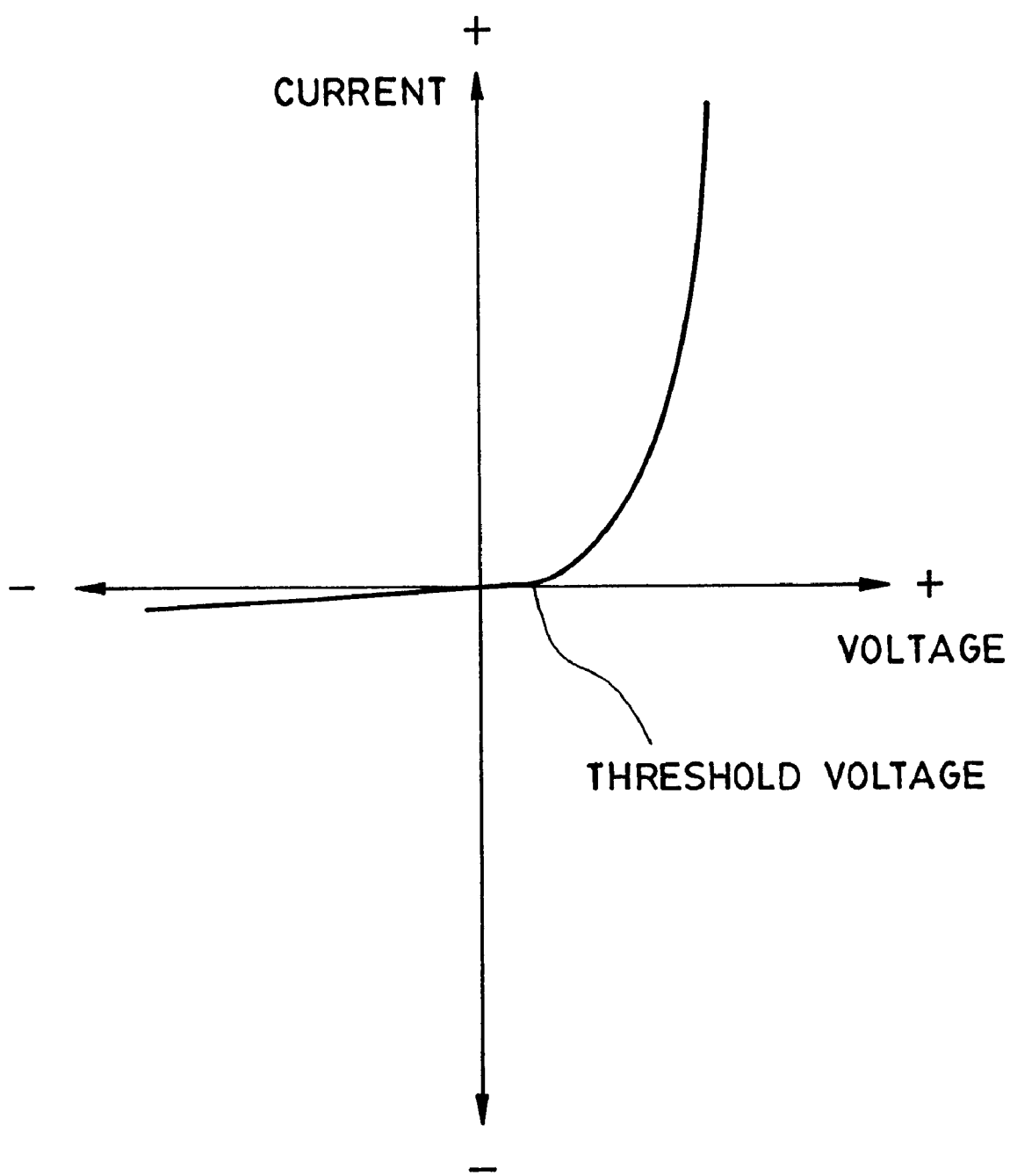
FIG. 2 is a drawing showing an example of diode characteristics.

FIG. 2 is a graph showing an example of the diode characteristics.

In FIG. 2, the voltage applied between the anode and cathode is shown on the abscissa, and the current flowing through an element is shown on the ordinate.

If a forward voltage applied so that the potential of the anode is higher than that of the cathode is marked by plus, and the reverse voltage is marked by minus, with the forward voltage applied, a current abruptly starts to flow when the applied voltage becomes higher than the forward threshold voltage. With the reverse voltage applied, substantially no current flows, but a reverse current abruptly starts to flow when the reverse voltage becomes a value higher than the breakdown voltage.

In other words, when the voltage applied between the anode and the cathode is higher than the forward threshold voltage, and when the voltage is lower than the reverse breakdown voltage, an element has low resistance. When the applied voltage is between the forward threshold voltage and the reverse breakdown voltage, the element has high resistance. Namely, non-linear characteristics are exhibited.

In such an element, unlike an organic thin film field effect transistor, no current flows in the plane direction of an organic layer, but a current flows in the thickness direction of the organic layer. Namely, in this element, unlike an organic thin film field effect transistor, the resistance value of the element is not controlled for the current flowing in the plane direction of the organic layer, while the resistance value of the element is controlled for the current flowing in the thickness direction of the organic layer. Therefore, with the organic layer having a small thickness of, for example, about 100 nm or less, the value of resistance of the element for the current flowing in the thickness direction of the organic layer can be kept down even if the organic layer has low mobility. In addition, in a configuration in which a current flows in the plane direction of the organic layer, as in an organic thin film field effect transistor, a channel for a current has a small sectional area, while in a configuration in which a current flows in the thickness direction of the organic layer, the effective area of the element corresponds to the sectional area of a current channel, and the current channel thus has a large sectional area, thereby causing the effect of keeping down the resistance of the organic layer.

There is thus the advantage of obtaining an element allowing material selection in a wide range, and having well-balanced characteristics and cost, while the organic thin film field effect transistor has limits to usable organic materials due to limits to mobility.

The non-linear element of the present invention can also be composed of an MIM (Metal-Insulator-Metal) element or transistor.

EMBODIMENTS

The present invention will be described in detail below with reference to embodiments.

First Embodiment

Figure 3:
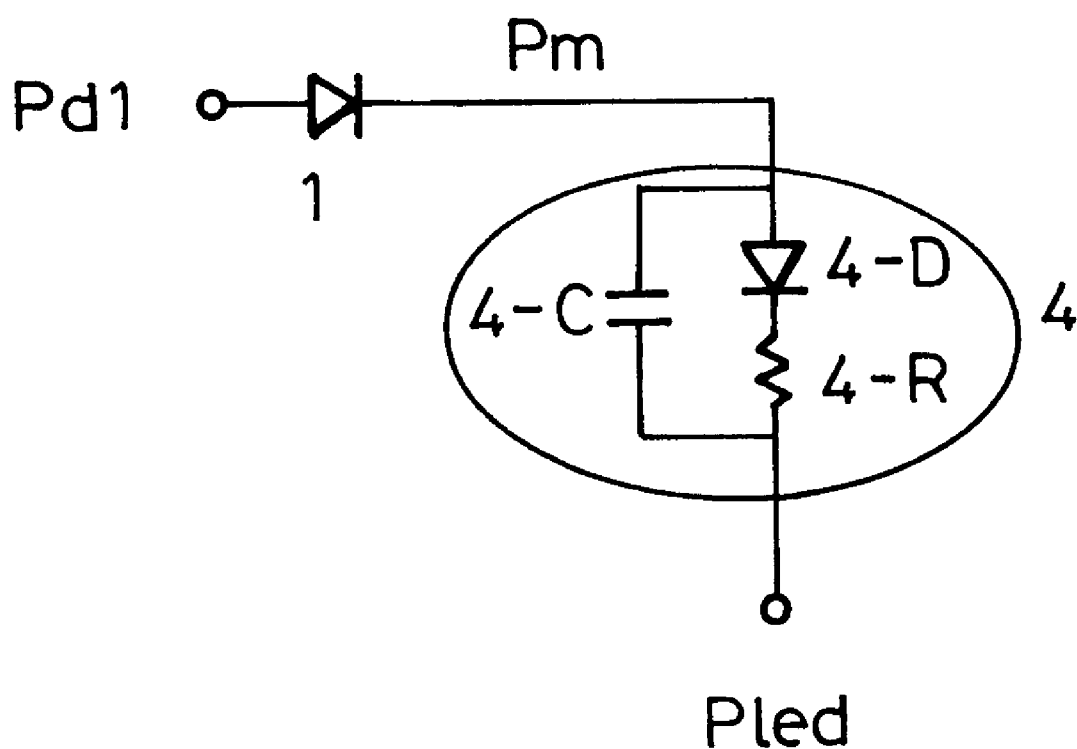
FIG. 3 is a drawing showing an equivalent circuit of a single pixel in a device in accordance with a first embodiment of the present invention.

FIG. 3 is a drawing showing an equivalent circuit of a single pixel in a light emitting diode device of the present invention. The circuit shown in FIG. 3 comprises a diode (writing diode) 1 which constitutes the pixel, and an organic light emitting diode 4 serving as a light emitting portion and having an equivalent capacity component 4-C, an equivalent resistance component 4-R and an equivalent diode component 4-D. The circuit also comprises an electrode Pd connected to the anode of the writing diode 1, and an electrode Pled connected to the cathode of the organic light emitting diode 4. A data signal is applied to the electrode Pd, and a selection signal is applied to the electrode Pled.

The circuit is operated as described below.

When the selection signal applied to the electrode Pled is brought to a selection state (low-potential state), the potential of the electrode Pled decreases. As a result, a forward voltage higher than the threshold voltage is applied to the writing diode 1 to bring about a conduction state. Thus, a current flows in the equivalent capacity component 4-C possessed by the organic light emitting diode 4 serving as a light emitting portion according to the data signal applied to the electrode Pd. The charge stored in the equivalent capacity component 4-C during the selection period according to the data signal applied to the electrode Pd flows out through the equivalent resistance component 4-R and the equivalent diode component 4-D, which are possessed by the organic light emitting diode 4 serving as a light emitting portion, to emit light from the organic light emitting diode 4 with a luminance corresponding to the signal or for an emission time corresponding to the signal. When the selection signal applied to the electrode Pled is brought to a non-selection state (high-potential state), the voltage applied to the writing diode 1 is lower than the threshold voltage to bring about a non-conduction state. Even when the selection signal is in the non-selection state, the charge stored in the equivalent storage capacity continuously flows into the organic light emitting diode 4 to continuously emit light. The emission of light is substantially finished at the time the stored charge becomes a predetermined amount or less. During the time the selection signal applied to the electrode Pled is in the non-selection state (high-potential state), the writing diode 1 is in the non-conduction state, and thus no current flows in and out of the equivalent capacity component 4-C even if the data signal applied to the electrode Pd changes, thereby causing substantially no effect on the emission of light from the organic light emitting diode 4.

Figure 4:
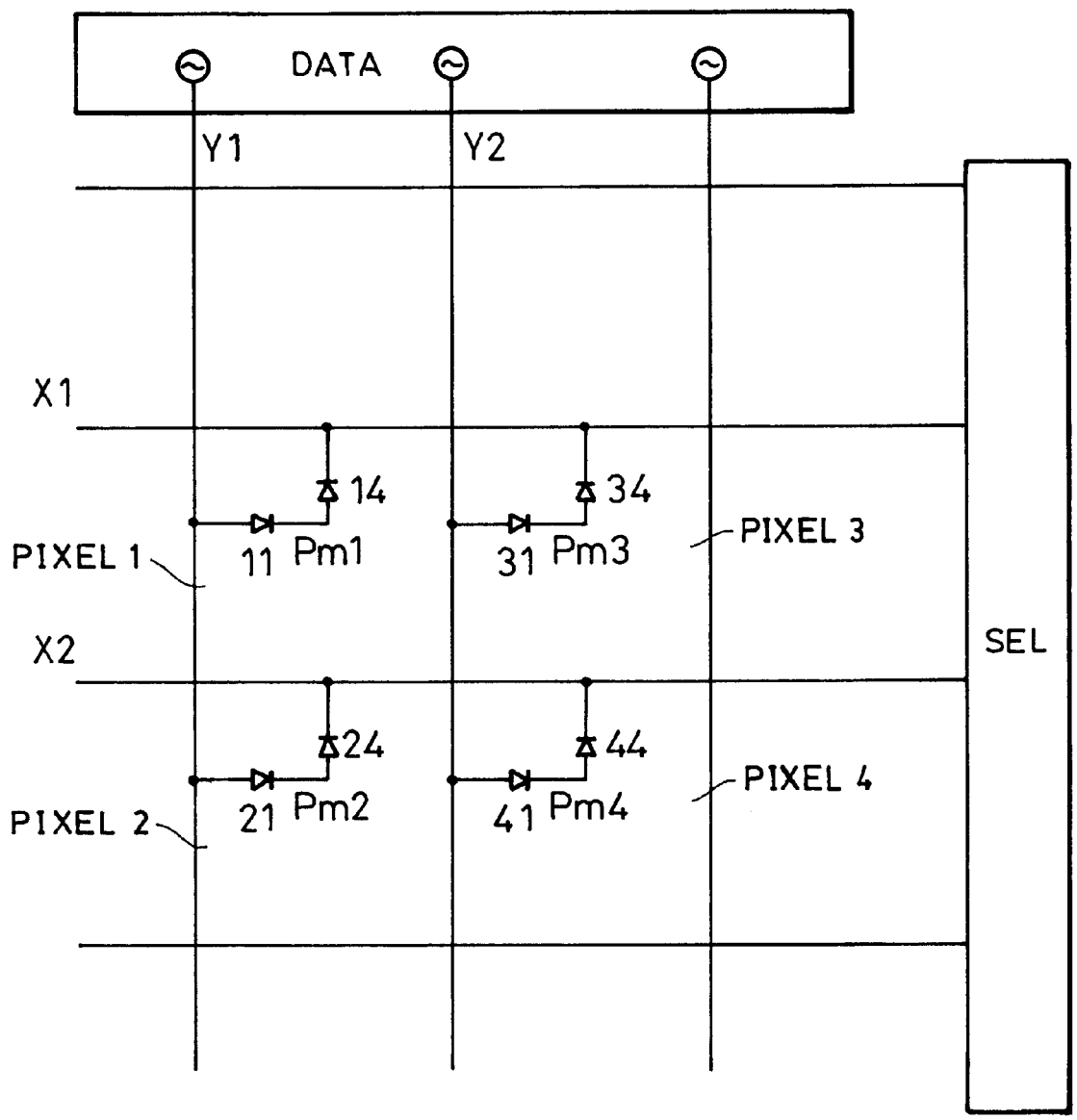
FIG. 4 is a drawing showing equivalent circuits in a whole device in which the pixels shown in FIG. 3 are arranged in a two-dimensional form.

FIG. 4 is a drawing showing the equivalent circuits of a whole light emitting diode device in which the pixels shown in FIG. 3 are arranged in a two-dimensional form.

In FIG. 4, the equivalent capacity component and the equivalent resistance component possessed by the organic light emitting diode serving as a light emitting portion are omitted.

FIG. 4 shows the organic light emitting diode device comprising four pixels including a pixel 1, a pixel 2, a pixel 3 and a pixel 4. Both anodes of writing diodes 11 and 21 of the pixels 1 and 2, respectively, are connected to a data signal line Y1. Both anodes of writing diodes 31 and 41 of the pixels 3 and 4, respectively, are connected to a data signal line Y2.

On the other hand, the cathodes of the organic light emitting diodes of the pixels 1 and 2 are connected to different selection signal lines X1 and X2, respectively. The cathodes of the organic light emitting diodes of the pixels 3 and 4 are also connected to the selection signal lines X1 and X2, respectively.

The data signal lines Y1 and Y2 are connected to a data signal circuit DATA having signal sources for respectively operating the lines. Each of the signal sources may function as a voltage source which generates a voltage signal, or a current source which generates a current signal.

On the other hand, the selection signal lines X1 and X2 are connected to a selection circuit SEL.

Figure 5:
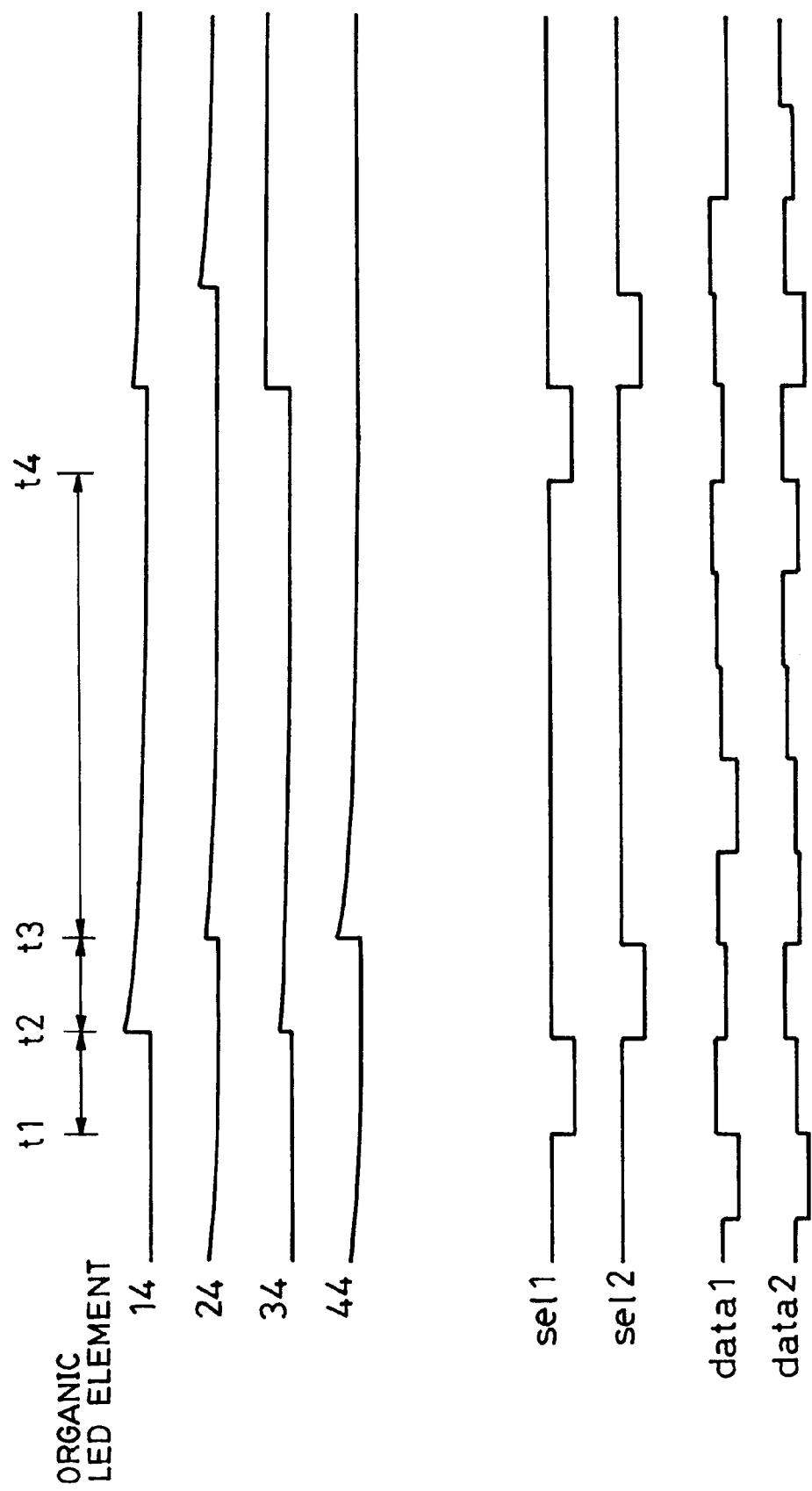
FIG. 5 is a drawing showing drive timing of the device shown in FIG. 4.

FIG. 5 is a drawing showing drive timing of the organic light emitting diode device shown in FIG. 4.

FIG. 5 shows luminances of organic light emitting diodes 14, 24, 34 and 44 which serve as light emitting portions of the pixels 1, 2, 3 and 4, respectively, selection signals sel1 and sel2 applied to the selection signal lines X1 and X2, respectively, and data signals data1 and data2 applied to the data signal lines Y1 and Y2, respectively.

At time t1, the selection signal sel1 applied to the selection signal line X1 is turned on to be brought to the low-potential state, and the selection signal sel2 applied to the selection signal line X2 is turned off to be bought to the high-potential state. As a result, both writing diodes 11 and 31 of the respective pixels 1 and 3 connected to the selection signal line X1 are brought to the conduction state, and thus a current flows into the equivalent capacity components 14-C and 34-C respectively possessed by the organic light emitting diodes according to the data signals data1 and data2 applied to the data signal lines Y1 and Y2, respectively. At the same time, the current gradually flows out through the equivalent resistance components and the equivalent diode components respectively possessed by the organic light emitting diodes to emit light from the organic light emitting diodes 14 and 34 with luminances corresponding to the signals, or for emission times corresponding to the signals.

At time t2, the selection signal sel2 applied to the selection signal line X2 is turned on to be brought to the low-potential state, and the selection signal sel1 applied to the selection signal line X1 is turned off to be brought to the high-potential state. As a result, the voltages applied to the writing diodes 11 and 31 of the pixels 1 and 3 connected to the selection signal line X1 are lower than the threshold voltage to cause the non-conduction state. The organic light emitting diodes 14 and 34 continuously emit light, and the emission of light is substantially finished at the time the charges stored in the equivalent capacity components 14-C and 34-C become a predetermined amount or less.

At the same time, both writing diodes 21 and 41 of the respective pixels 2 and 4 connected to the selection signal line X2 are brought to the conduction state, and thus a current flows into the equivalent capacity components 24-C and 44-C respectively possessed by the organic light emitting diodes according to the data signals data1 and data2 applied to the data signal lines Y1 and Y2, respectively. At the same time, the current gradually flows out through the equivalent resistance components and the equivalent diode components respectively possessed by the organic light emitting diodes to emit light from the organic light emitting diodes 24 and 44 with luminances corresponding to the signals, or for emission times corresponding to the signals.

At time t3, the selection signal sel2 applied to the selection signal line X2 is turned off to be brought to the high-potential state. As a result, the voltages applied to the writing diodes 21 and 41 of the pixels 2 and 4 connected to the selection signal line X2 are lower than the threshold voltage to cause the non-conduction state. The organic light emitting diodes 24 and 44 continuously emit light, and the emission of light is substantially finished at the time the charges stored in the equivalent capacity components 24-C and 44-C become a predetermined amount or less.

In this way, the timing is slightly shifted to emit light from the pixels 1 and 3, and the pixels 2 and 4 with luminances corresponding to the data signals, or for emission times corresponding to the data signals.

Figure 6:
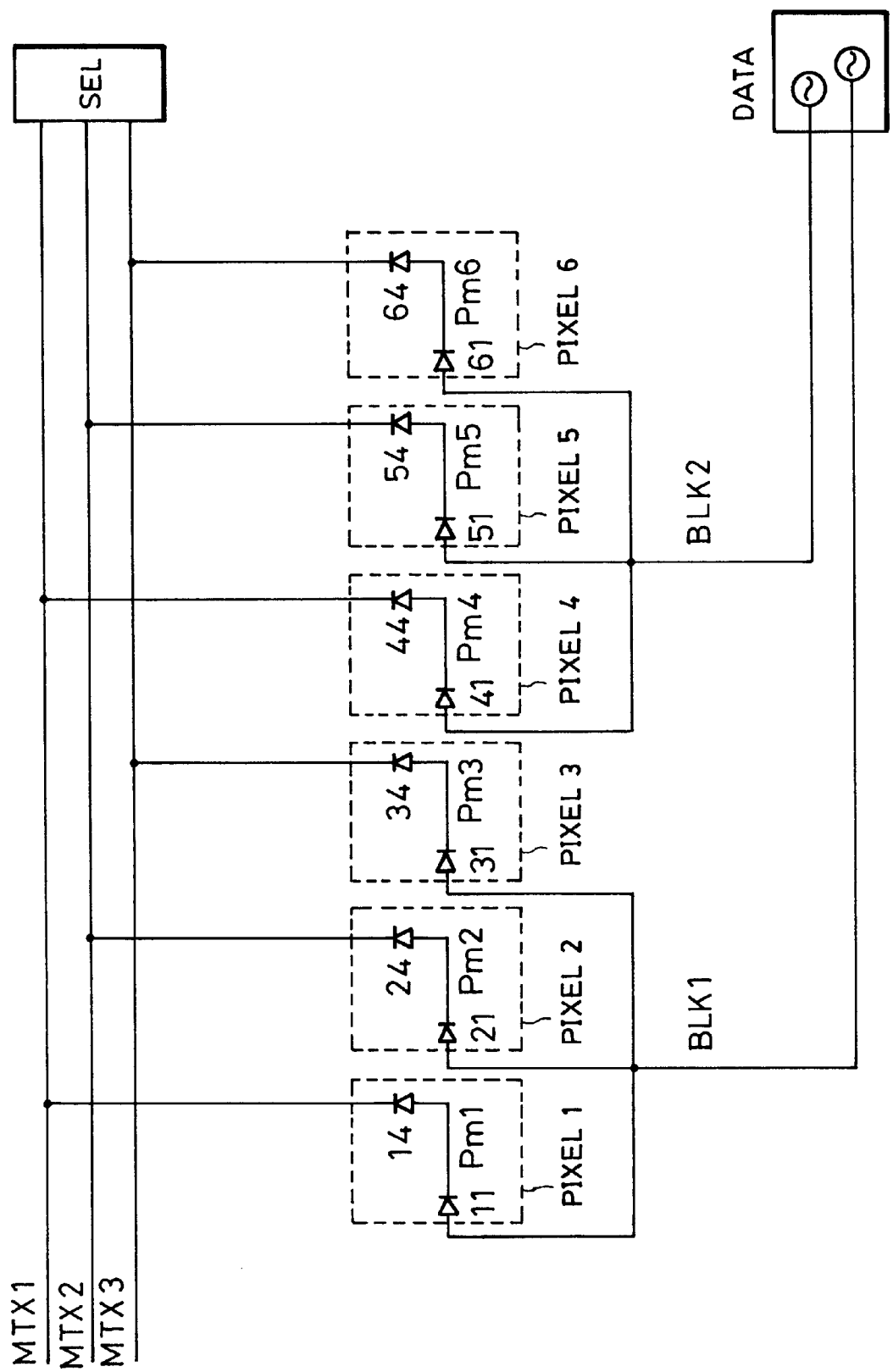
FIG. 6 is a drawing showing equivalent circuits in a whole device in which the pixels shown in FIG. 3 are arranged in a one-dimensional form.

FIG. 6 is a drawing showing the equivalent circuits of a whole organic light emitting diode device in which the pixels shown in FIG. 3 are arranged in a one-dimensional form.

In FIG. 6, the equivalent capacity components and the equivalent resistance components of organic light emitting diode serving as a light emitting portion are omitted.

FIG. 6 shows the organic light emitting diode device comprising six pixels including pixels 1, 2, 3, 4, 5 and 6. The anodes of writing diodes 11, 21 and 32 of the respective pixels 1, 2 and 3 are connected to a data signal line BLK1. The anodes of writing diodes 41, 51 and 61 of the respective pixels 4, 5 and 6 are connected to a data signal line BLK2.

On the other hand, the cathodes of the organic light emitting diodes of the respective pixels 1, 2 and 3 are connected to selection signal lines MTX1, MTX2 and MTX3, respectively. Also the cathodes of the organic light emitting diodes of the respective pixels 4, 5 and 6 are connected to selection signal lines MTX1, MTX2 and MTX3, respectively.

The selection signal lines MTX1, MTX2 and MTX3 are connected to a selection circuit SEL, for example, such as a shift register. The data signal lines BLK1 and BLK2 are connected to a data signal circuit DATA having signal sources respectively operating the lines. Each of the signal sources may function as a voltage source which generates a voltage signal, or a current source which generates a current signal.

Figure 7:
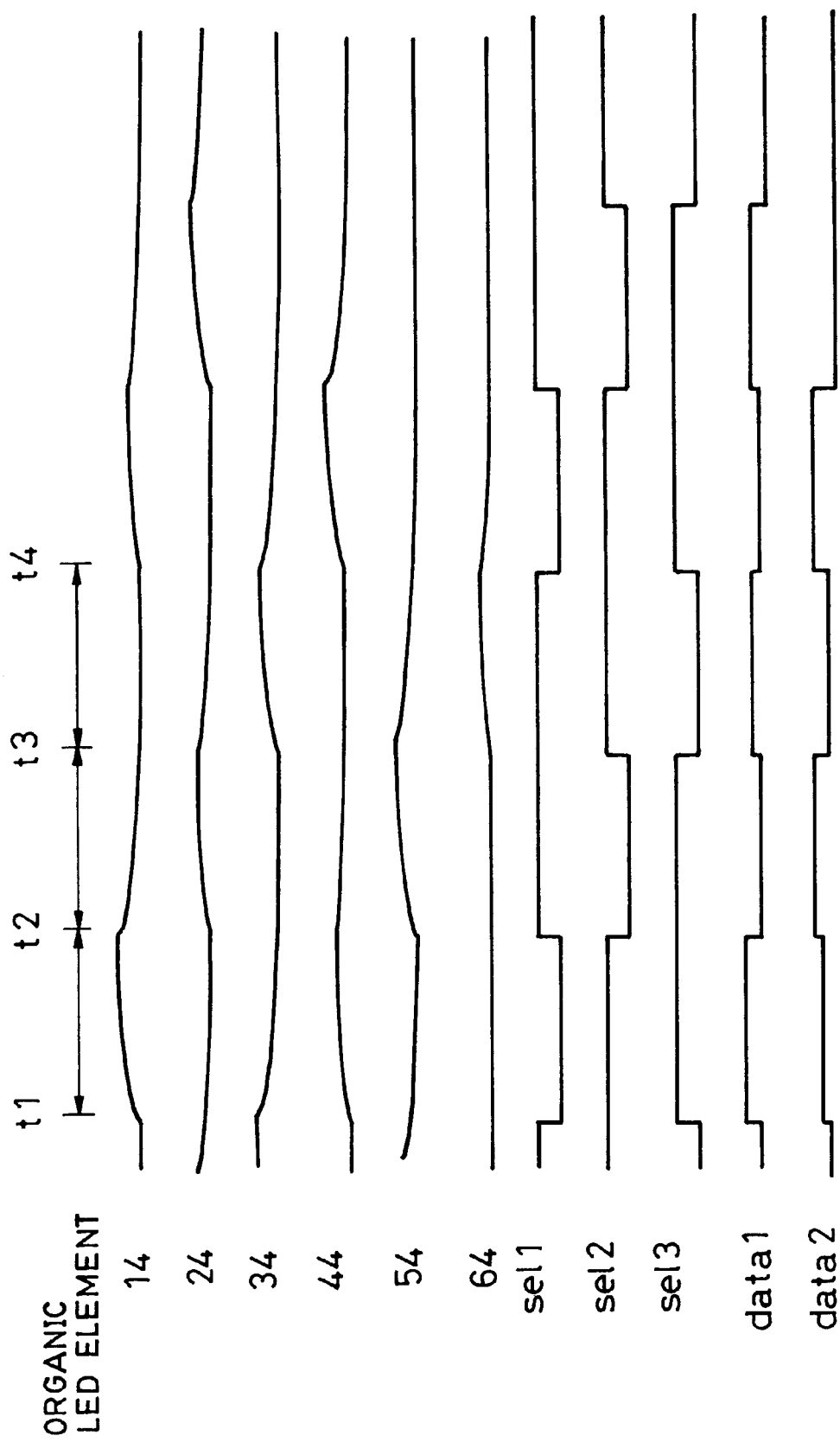
FIG. 7 is a drawing showing drive timing of the device shown in FIG. 6.

FIG. 7 is a drawing showing drive timing of the light emitting diode device shown in FIG. 6.

FIG. 7 shows luminances of organic light emitting diodes 14, 24, 34, 44, 54 and 64 serving as light emitting portions of the pixels 1, 2, 3, 4, 5 and 6, respectively, selection signals sel1, sel2 and sel3 applied to the selection signal lines MTX1, MTX2 and MTX3, respectively, and data signals data1 and data2 applied to the data signal lines BLK1 and BLK2, respectively.

At time t1, the selection signal sel1 applied to the selection signal line MTX1 is turned on to be brought to the low-potential state, and the selection signals sel2 and sel3 applied to the selection signal lines MTX2 and MTX3, respectively are turned off to be brought to the high-potential state. As a result, the writing diodes 11 and 41 of the respective pixels 1 and 4 connected to the selection signal line MTX1 are brought to the conduction state, and thus a current flows into the equivalent capacity components 14-C and 44-C possessed by the organic light emitting diodes 14 and 44 according to the data signals data1 and data2 applied to the data signal lines BLK1 and BLK2, respectively, at this time. At the same time, the current gradually flows out through the equivalent resistance components and the equivalent diode components possessed by the organic light emitting diodes to emit light from the organic light emitting diodes 14 and 44 with luminances corresponding to the signals, or for emission times corresponding to the signals.

At time t2, the selection signal sel2 applied to the selection signal line MTX2 is turned on to be brought to the low-potential state, and the selection signals sel1 and sel3 applied to the selection signal lines MTX1 and MTX3, respectively, are turned off to be brought to the high-potential state. As a result, the voltages applied to the writing diodes 11 and 41 of the respective pixels 1 and 4 connected to the selection signal line MTX1 are lower than the threshold voltage to cause the non-conduction state. The organic light emitting diodes 14 and 44 continuously emit light, and the emission of light is substantially finished at the time the charges stored in the equivalent capacity components 14-C and 44-C become a predetermined amount or less.

At the same time, the writing diodes 21 and 51 of the respective pixels 2 and 5 connected to the selection signal line MTX2 are brought to the conduction state, and thus a current flows into the equivalent capacity components 24-C and 54-C possessed by the organic light emitting diodes 24 and 54 according to the data signals data1 and data2 applied to the data signal lines BLK1 and BLK2, respectively, at this time. At the same time, the current gradually flows out through the equivalent resistance components and the equivalent diode components possessed by the organic light emitting diodes to emit light from the organic light emitting diodes 24 and 54 with luminances corresponding to the signals, or for emission times corresponding to the signals.

At time t3, the selection signal sel3 applied to the selection signal line MTX3 is turned on to be brought to the low-potential state, and the selection signals sel1 and sel2 applied to the selection signal lines MTX1 and MTX2, respectively, are turned off to be brought to the high-potential state. As a result, the voltages applied to the writing diodes 21 and 51 of the respective pixels 2 and 5 connected to the selection signal line MTX2 are lower than the threshold voltage to cause the non-conduction state. The organic light emitting diodes 24 and 54 continuously emit light, and the emission of light is substantially finished at the time the charges stored in the equivalent capacity components 24-C and 54-C become a predetermined amount or less.

At the same time, the writing diodes 31 and 61 of the respective pixels 3 and 6 connected to the selection signal line MTX3 are brought to the conduction state, and thus a current flows into the equivalent capacity components 34-C and 64-C possessed by the organic light emitting diodes 34 and 64 according to the data signals data1 and data2 applied to the data signal lines BLK1 and BLK2, respectively, at this time. At the same time, the current gradually flows out through the equivalent resistance components and the equivalent diode components possessed by the organic light emitting diodes to emit light from the organic light emitting diodes 34 and 64 with luminances corresponding to the signals, or for emission times corresponding to the signals.

In this way, the timing is successively slightly shifted to emit light from the pixels 1 and 4, the pixels 2 and 5, and the pixels 3 and 6 with luminances corresponding to the data signals.

Figure 8:
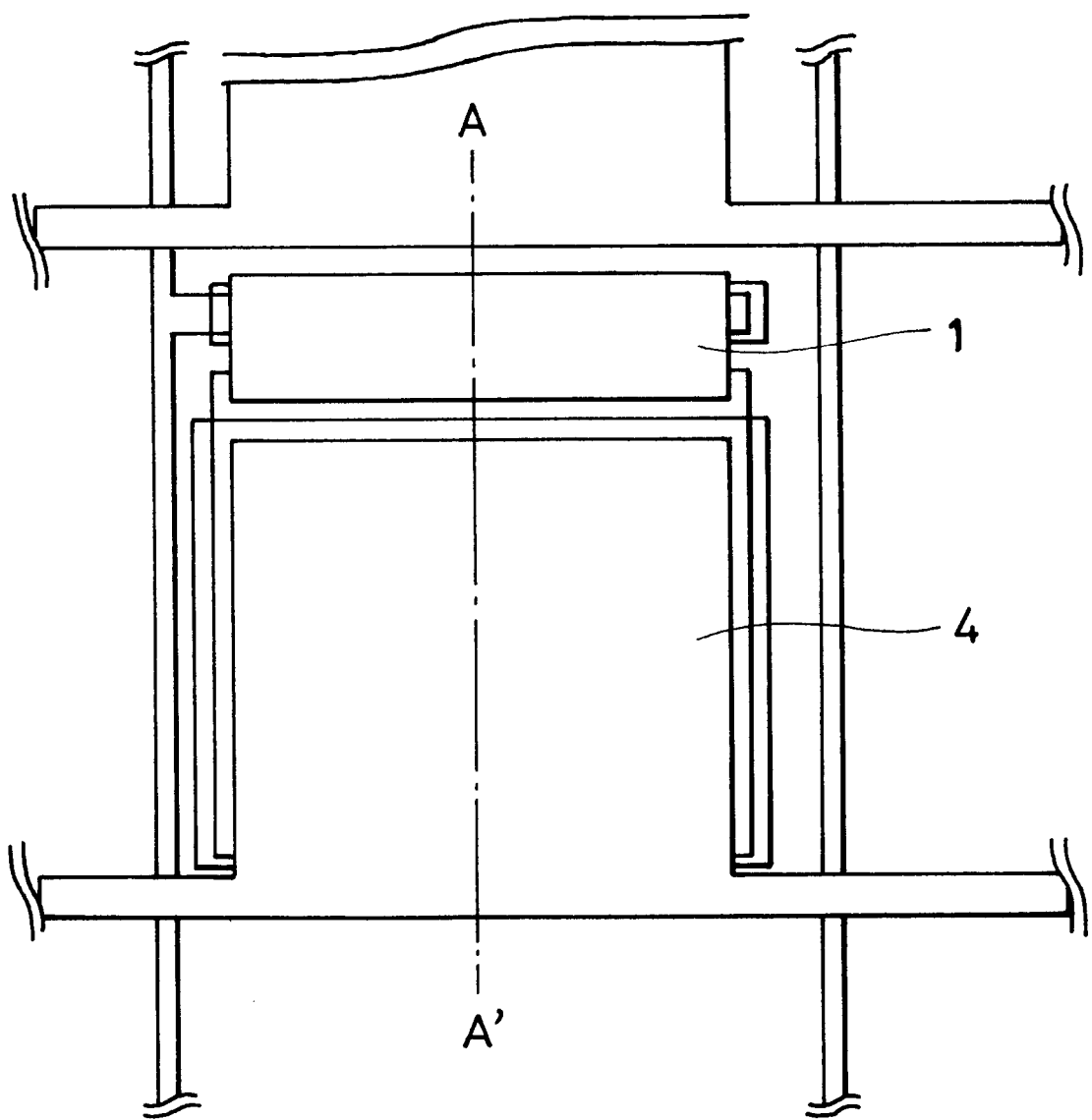
FIG. 8 is a plan view of a single pixel in the device in accordance with the first embodiment of the present invention.

FIG. 8 is a plan view showing a single pixel of an organic light emitting diode device.

The single pixel shown in FIG. 8 comprises a diode (writing diode) 1, and an organic light emitting diode 4 serving as a light emitting portion.

Figure 9:
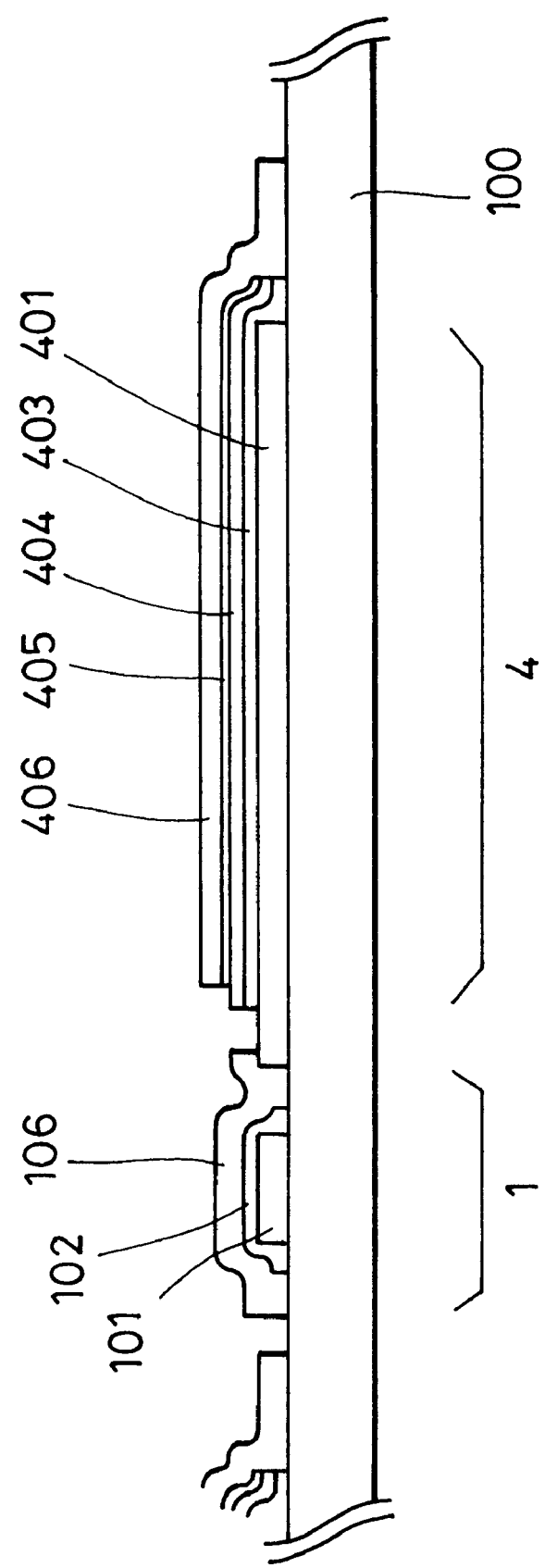
FIG. 9 is a sectional view of the configuration of the device of the first embodiment taken along line A–A' in FIG. 8.

FIG. 9 is a sectional view of the organic light emitting diode device shown in FIG. 8 taken along line A–A' in FIG. 8.

Referring to FIG. 9, the single pixel comprises the diode (writing diode) 1, the organic light emitting diode 4 serving as a light emitting diode, and a substrate 100. The writing diode 1 comprises a transparent electrode 101 made of indium/tin oxide (ITO) and serving as an anode thereof, a hole injection/transport layer 102 made of copper phthalocyanine (Formula 1), and an Al cathode 106. The organic light emitting diode 4 comprises a transparent electrode 401 made of indium/tin oxide (ITO) and serving as an anode thereof, a hole transport layer 403 made of aromatic diamine (Formula 2), an electron transport layer 404 made of tris(8-quinolinolato)aluminum complex (Formula 3) or the like, an electron injection layer 405 made of LiF, and an Al cathode 406.

Figure 10:
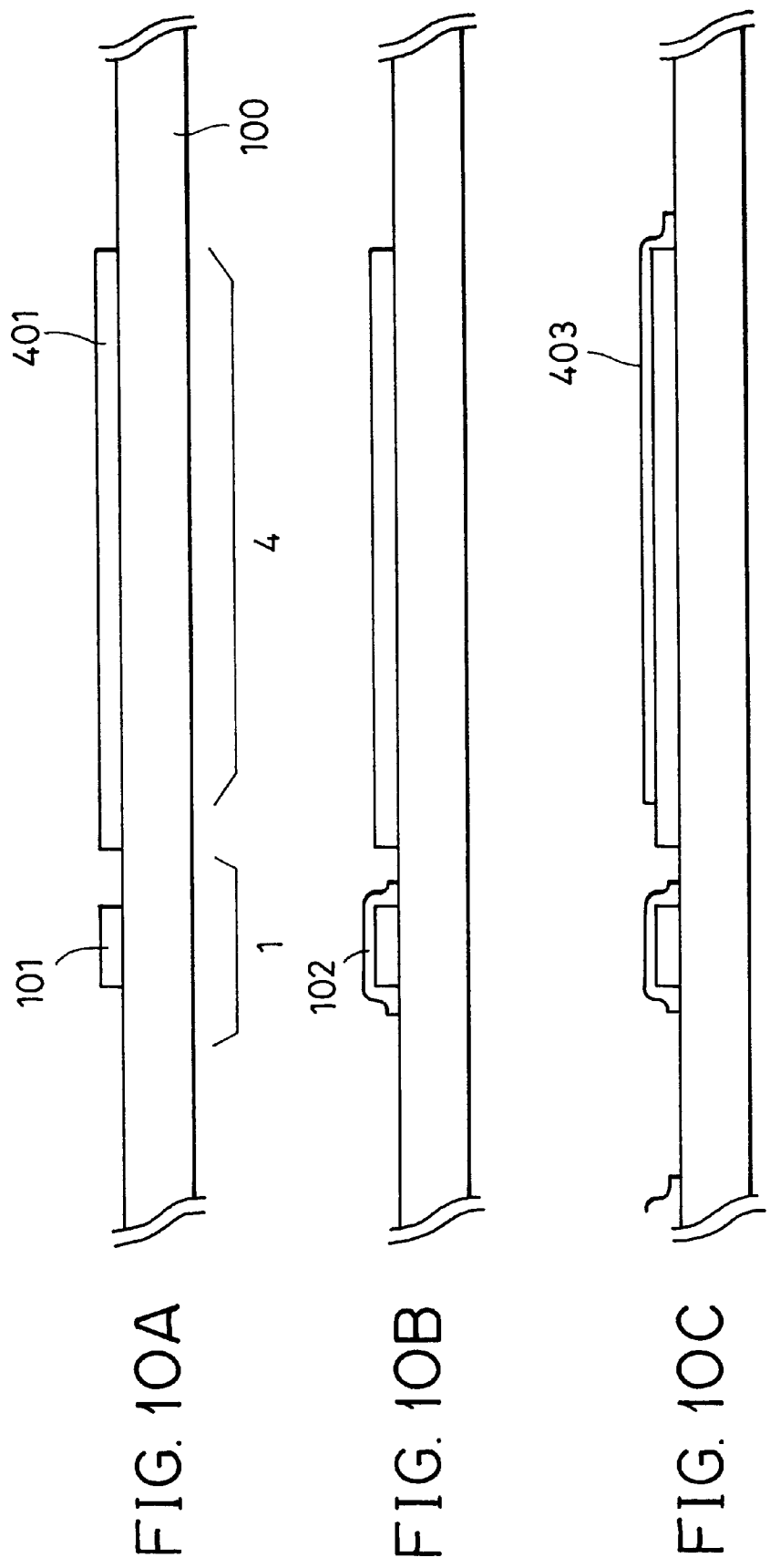
FIGS. 10A–10C are schematic drawings showing a method of manufacturing the device in accordance with the first embodiment of the present invention.
Figure 11:
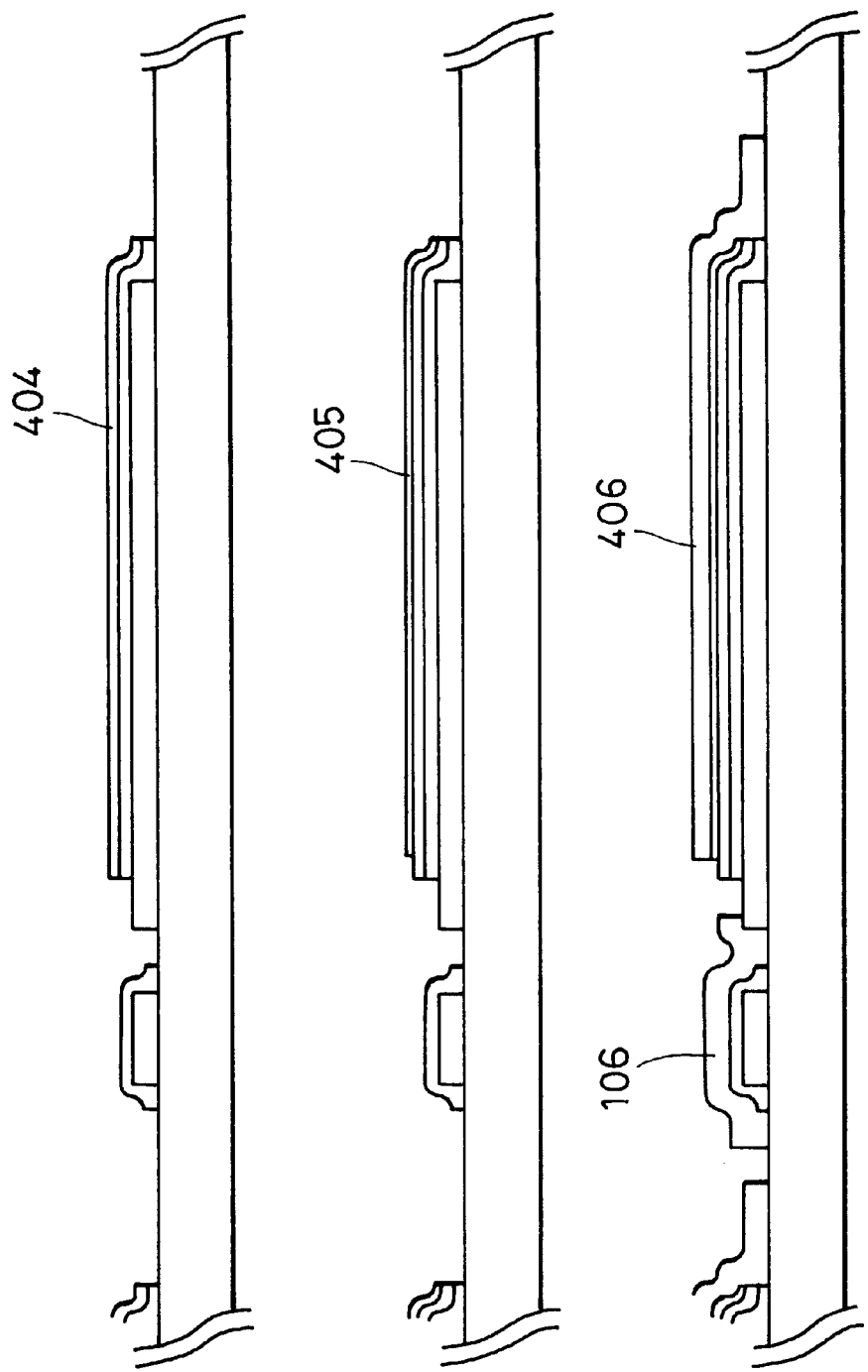
FIGS. 11D–11F are schematic drawings showing the method of manufacturing the device in accordance with the first embodiment of the present invention.

FIGS. 10 and 11 are schematic drawings showing the process for manufacturing the organic light emitting diode device of this embodiment.

As shown in FIG. 10A, indium/tin oxide (ITO) is deposited to 0.15 µm on a portion of the cleaned glass substrate 100 having good flatness, in which the light emitting portion (the organic light emitting diode) is formed, and a portion thereof in which the writing diode is formed, by sputtering, and then patterned by photolithography.

Next, as shown in FIG. 10B, an organic hole transport material is deposited to 0.01 µm on the ITO layer in the diode portion by a vacuum deposition method to form an organic hole transport layer. As the organic hole transport material, copper phthalocyanine represented by Formula 1 is used.

As shown in FIG. 10C, an organic hole transport material is deposited to 0.05 µm on the ITO layer in the light emitting portion by the vacuum deposition method to form an organic hole transport layer. As the organic hole transport material, aromatic diamine represented by Formula 2 is used.

Next, as shown in FIG. 11D, an organic electron transport material is deposited to 0.05 µm on the organic hole transport layer in the light emitting portion to form an organic electron transport layer. At this time, the organic electron transport material is selected, and a fluorescent material or the like is doped, according to the desired color emitted light. In this embodiment, when green emitted light is desired, tris(8-quinolinolato)aluminum complex (Formula 3) is used as the organic electron transport material, and a fluorescent material represented by Formula 4 is simultaneously binary-deposited. When red emitted light is desired, tris(8-quinolinolato)aluminum complex (Formula 3) is used as the organic electron transport material, and a fluorescent material represented by Formula 5 is simultaneously binary-deposited. When blue emitted light is desired, a distyryl derivative represented by Formula 6 is used as the organic electron transport material, a fluorescent material represented by Formula 7 is simultaneously binary-deposited, and tris(8-quinolinolato) aluminum complex (Formula 3) is further used as the organic electron transport material to form the organic electron transport layer.

Then, as shown in FIG. 1E, an electron injection material is deposited to 0.001 µm on the organic electron transport layer of the light emitting portion to form an electron injection layer. As the electron injection material, LiF is used.

Next, as shown in FIG. 11F, a metal having a low work function is deposited to 0.15 µm on the organic electron injection layer in the light emitting portion, and on the organic hole transport layer in the diode portion to form a cathode layer. As the metallic material, Al is used.

The organic hole transport layer, the organic electron transport layer, the electron injection layer and the cathode layer are continuously formed without breaking a vacuum.

The organic hole transport layer, the organic electron transport layer, and the electron injection layer are easily attacked by a solvent or the like, or very thin, and thus these layers can be patterned by photolithography with difficulties. In this embodiment, these layers are patterned by a mask deposition method in which vacuum deposition is performed through a mask having appropriate apertures.

In this embodiment, the diode portion comprises a diode using an energy barrier produced between the electrode layer and the organic hole transport layer.

In the diode portion, a thin organic layer is formed by using, as the organic hole transport material, copper phthalocyanine which is a porphyrin compound having good film formability. This enables a reduction in resistance of the organic layer, and achievement of the diode characteristic of sharp build-up. There is also the advantage that copper phthalocyanine is more thermally stable than the aromatic diamine used for the organic hole transport layer of the light emitting portion.

Unlike the organic light emitting element which constitutes the light emitting portion, the writing diode need not emit light. It is rather preferable to avoid excessive emission of light from the writing diode, and interference with an image. The writing diode of this embodiment comprises only one organic layer made of copper phthalocyanine, and thus has the advantage that the emission efficiency is low because of substantially no emission recombination of electrons and holes, thereby causing no excessive emission of light.

In order to minimize the area of the writing diode as a non-light emitting portion in a pixel to ensure a large area of the light emitting portion, or to instantaneously pass a more current through the writing diode as compared with the light emitting portion, the writing diode preferably has a higher allowable current density. Therefore, the writing diode preferably comprises an organic layer having low electric resistance and high heat resistance, and has the diode characteristic of sharp build-up.

The aromatic diamine represented by Formula 2 and used for the organic hole transport layer of the organic light emitting diode serving as the light emitting portion has a glass transition point of about 70° C. and thus has low heat resistance, and is thus easily crystallized by the heat generated by itself at a higher current density to deteriorate element characteristics. However, the use of aromatic diamine for the light emitting portion has an advantage from the viewpoint of emission efficiency, and thus these materials are properly used for the light emitting portion and the writing diode portion.

Second Embodiment

The equivalent circuits of a light emitting diode device of this embodiment are the same as the first embodiment.

Figure 12:
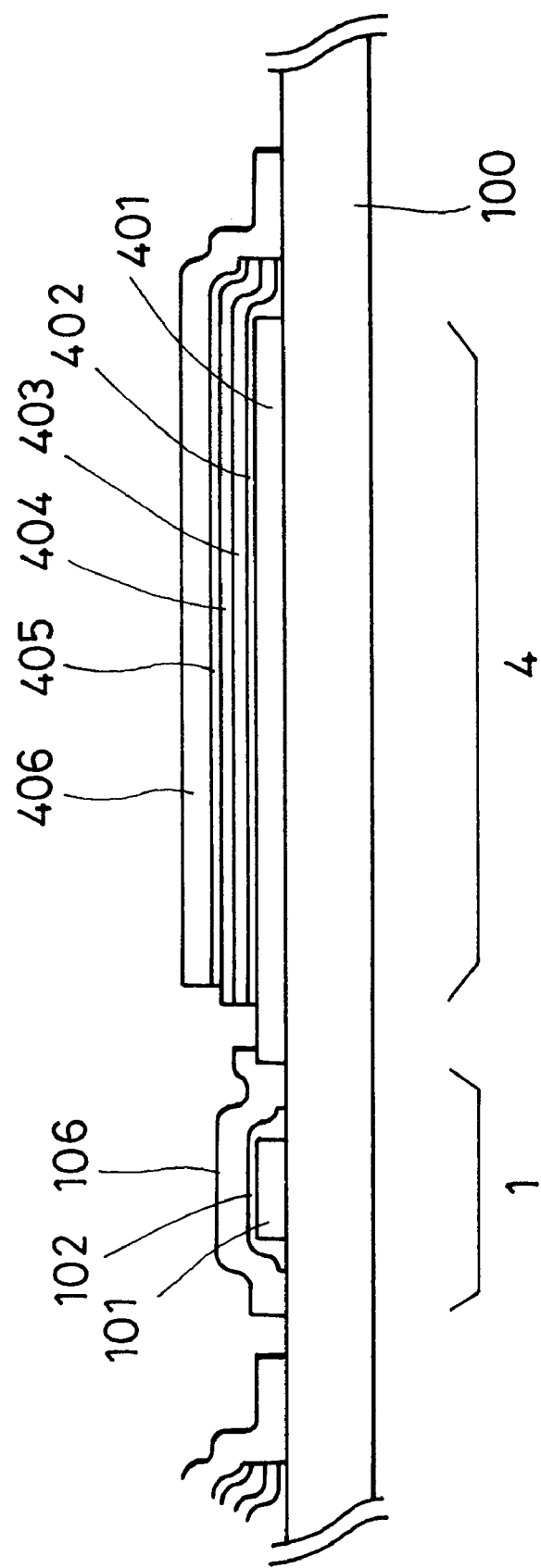
FIG. 12 is a schematic drawing showing the configuration of a device of a second embodiment of the present invention.

FIG. 12 is a schematic sectional view showing the construction of the organic light emitting diode device of this embodiment.

Referring to FIG. 12, each of pixels comprises a diode (writing diode) 1, an organic light emitting diode 4 serving as a light emitting portion, and a substrate 100.

The writing diode 1 comprises a transparent electrode 101 serving as an anode and made of indium/tin oxide (ITO), a hole injection/transport layer 102 made of copper phthalocyanine (Formula 1), and a cathode 106 made of Al.

The organic light emitting diode 4 comprises a transparent electrode 401 serving as an anode and made of indium/tin oxide (ITO), a hole injection layer 402 made of copper phthalocyanine (Formula 1), a hole transport layer 403 made of aromatic diamine (Formula 2), an electron transport layer 404 made of tris(8-quinolinolato)aluminum complex (Formula 3), an electron injection layer 405 made of LiF, and a cathode 406 made of Al.

Figure 14D:
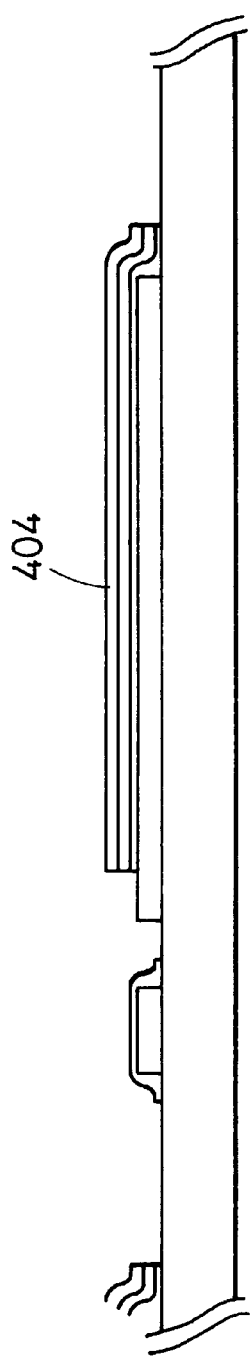
FIGS. 14D–14F are schematic drawings showing the method of manufacturing the device in accordance with the second embodiment of the present invention.
Figure 14E:
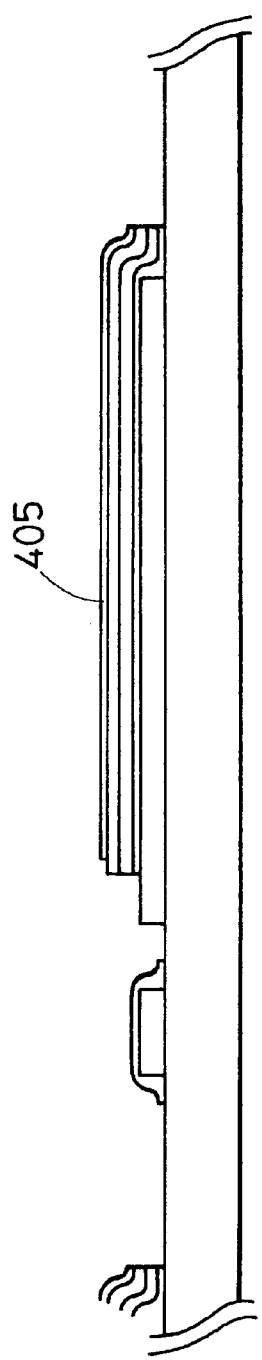
Figure 14F:
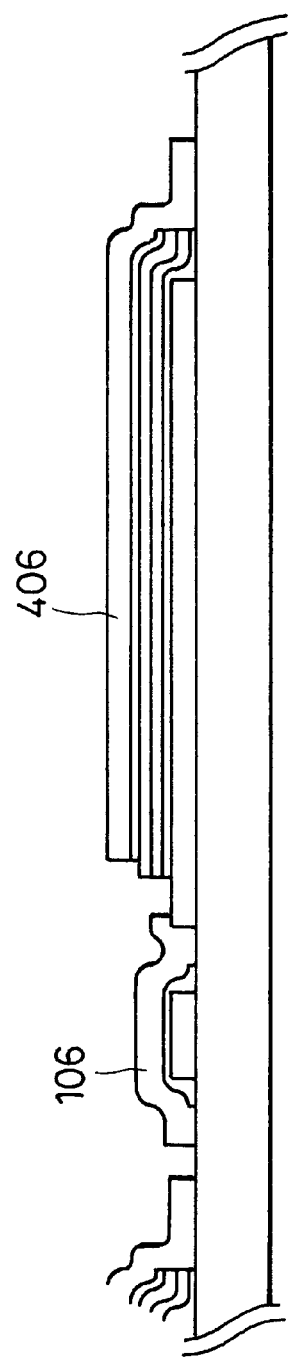

FIGS. 13 and 14 are schematic sectional views showing the process for manufacturing the organic light emitting diode device of this embodiment.

First, as shown in FIG. 13A, an indium/tin oxide (ITO) is deposited to 0.15 $\mu$m, by sputtering, on a portion of the cleaned glass substrate 100 with good flatness, in which the light emitting portion is formed, and on a portion thereof in which the writing diode is formed, and then patterned by photolithography.

Next, as shown in FIG. 13B, an organic hole transport material is deposited to 0.01 $\mu$m on the ITO layers of the light emitting portion and the writing diode portion a vacuum deposition method to form organic hole transport layers. As the organic hole transport material, copper phthalocyanine represented by Formula 1 is used. In the light emitting portion, this layer functions as an organic hole injection layer.

Then, as shown in FIG. 13C, an organic hole transport material is deposited to 0.05 $\mu$m on the organic hole injection layer of the light emitting portion by the vacuum deposition method to form an organic hole transport layer. As the organic hole transport material, aromatic diamine represented by Formula 2 is used.

Next, as shown in FIG. 14D, an organic electron transport material is deposited to 0.05 $\mu$m on the organic hole transport layer of the light emitting portion to form an organic electron transport layer. At this time, the organic electron transport material is selected, and a fluorescent material is doped, according to the desired color emitted light. In this embodiment, when green emitted light is desired, tris(8-quinolinolato)aluminum complex (Formula 3) is used as the organic electron transport material, and a fluorescent material represented by Formula 4 is simultaneously binary-deposited. When red emitted light is desired, tris(8-quinolinolato)aluminum complex (Formula 3) is used as the organic electron transport material, and a fluorescent material represented by Formula 5 is simultaneously binary-deposited. When blue emitted light is desired, a distyryl derivative represented by Formula 6 is used as the organic electron transport material, a fluorescent material represented by Formula 7 is simultaneously binary-deposited, and tris(8-quinolinolato)aluminum complex (Formula 3) is further used as the organic electron transport material to form the organic electron transport layer.

Then, as shown in FIG. 12E, an electron injection material is deposited to 0.001 $\mu$m on the organic electron transport layer of the light emitting portion to form an electron injection layer. As the electron injection material, LiF is used.

Next, as shown in FIG. 12F, a metal having a low work function is deposited to 0.15 $\mu$m on the organic electron injection layer in the light emitting portion, and on the organic hole transport layer of the diode portion to form a cathode layer. As the metallic material, Al is used.

In this embodiment, copper phthalocyanine which is a porphyrin compound and used as the organic hole transport material in the diode portion is also used for the organic hole injection layer of the light emitting portion to simultaneously form both layers. By using copper phthalocyanine for the organic hole injection layer of the light emitting portion, hole injection properties of the light emitting portion are improved, and crystallization of aromatic diamine due to self heat generation is suppressed, thereby improving durability. In addition, the organic hole injection layer of the light emitting portion is formed by using copper phthalocyanine at the same time as the hole transport layer of the diode portion, thereby preventing a decrease in productivity.

Third Embodiment

The equivalent circuits of a light emitting diode device of this embodiment are the same as the first embodiment.

Figure 15:
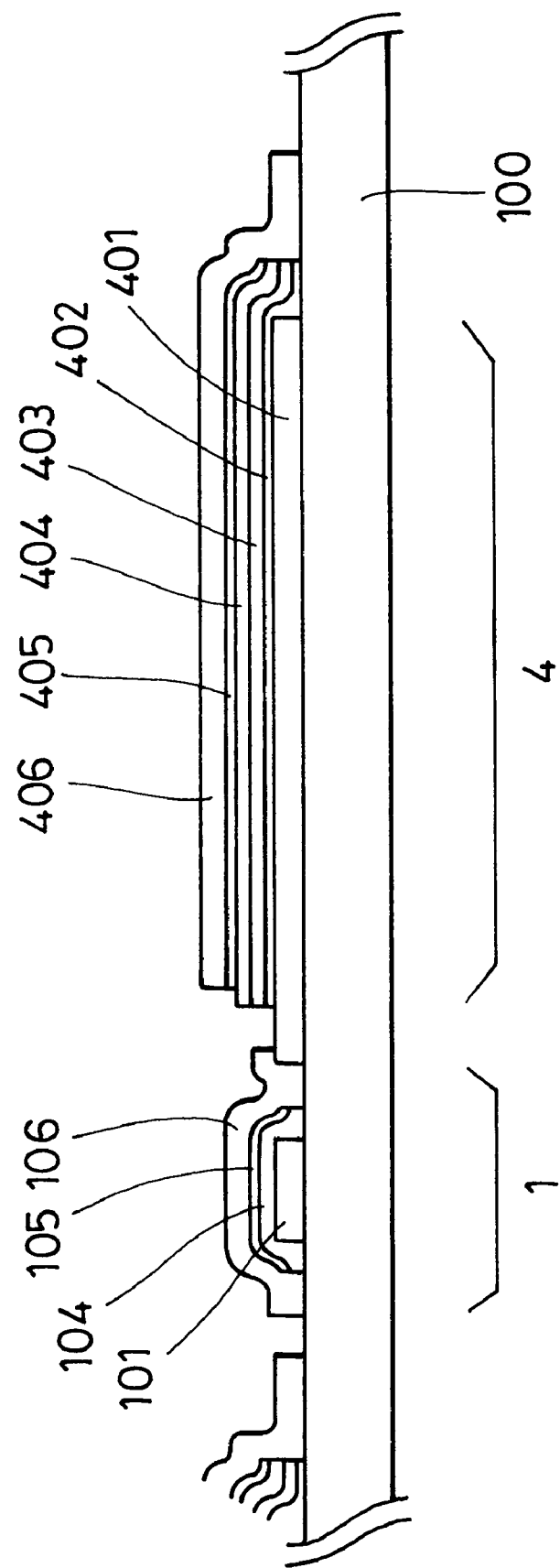
FIG. 15 is a schematic drawing showing the configuration of a device of a third embodiment of the present invention.

FIG. 15 is a schematic sectional view showing the construction of the organic light emitting diode device of this embodiment.

Referring to FIG. 15, each of pixels comprises a diode (writing diode) 1, an organic light emitting diode 4 serving as a light emitting portion, and a substrate 100.

The writing diode 1 comprises a transparent electrode 101 serving as an anode and made of indium/tin oxide (ITO), an electron transport layer 104 made of tris(8-quinolinolato) aluminum complex (Formula 3), an electron injection layer 105 made of LiF, and a cathode 106 made of Al.

The organic light emitting diode 4 comprises a transparent electrode 401 serving as an anode and made of indium/tin oxide (ITO), a hole injection layer 402 made of copper phthalocyanine (Formula 1), a hole transport layer 403 made of aromatic diamine (Formula 2), an electron transport layer 404 made of tris(8-quinolinolato)aluminum complex (Formula 3), an electron injection layer 405 made of LiF, and a cathode 406 made of Al.

FIGS. 16 and 17 are schematic sectional views showing the process for manufacturing the organic light emitting diode device of this embodiment.

First, as shown in FIG. 16A, indium/tin oxide (ITO) is deposited to 0.15 $\mu$m, by sputtering, on a portion of the cleaned glass substrate 100 with good flatness in which the light emitting portion is formed, and on a portion thereof in which the writing diode is formed, and then patterned by photolithography.

Next, as shown in FIG. 16B, an organic hole injection material is deposited to 0.01 $\mu$m on the ITO layer of the light emitting portion by the vacuum deposition method to form an organic hole injection layer. As the organic hole injection material, copper phthalocyanine represented by Formula 1 is used.

Then, as shown in FIG. 16C, an organic hole transport material is deposited to 0.05 $\mu$m on the organic hole injection layer of the light emitting portion by the vacuum deposition method to form an organic hole transport layer. As the organic hole transport material, aromatic diamine represented by Formula 2 is used.

Figure 17D:
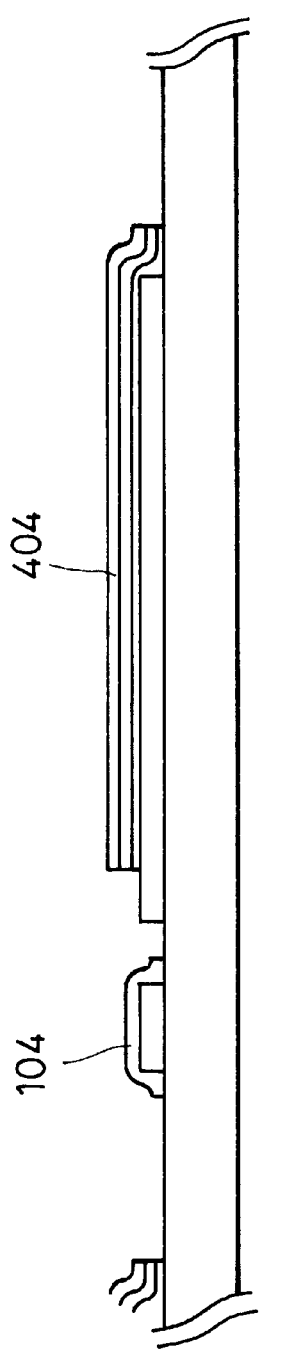
FIGS. 17D–17F are schematic drawings showing the method of manufacturing the device in accordance with the third embodiment of the present invention.

Next, as shown in FIG. 17D, an organic electron transport material is deposited to 0.05 $\mu$m on the organic hole transport layer of the light emitting portion to form an organic electron transport layer. At this time, the organic electron transport material is selected, and a fluorescent material is doped, according to the desired color emitted light. In this embodiment, when green emitted light is desired, tris(8-quinolinolato)aluminum complex (Formula 3) is used as the organic electron transport material, and a fluorescent material represented by Formula 4 is simultaneously binary-deposited. When red emitted light is desired, tris(8-quinolinolato)aluminum complex (Formula 3) is used as the organic electron transport material, and a fluorescent material represented by Formula 5 is simultaneously binary-deposited. When blue emitted light is desired, a distyryl derivative represented by Formula 6 is used as the organic electron transport material, a fluorescent material represented by Formula 7 is simultaneously binary-deposited, and tris(8-quinolinolato)aluminum complex (Formula 3) is further used as the organic electron transport material to form the organic electron transport layer.

Figure 17E:
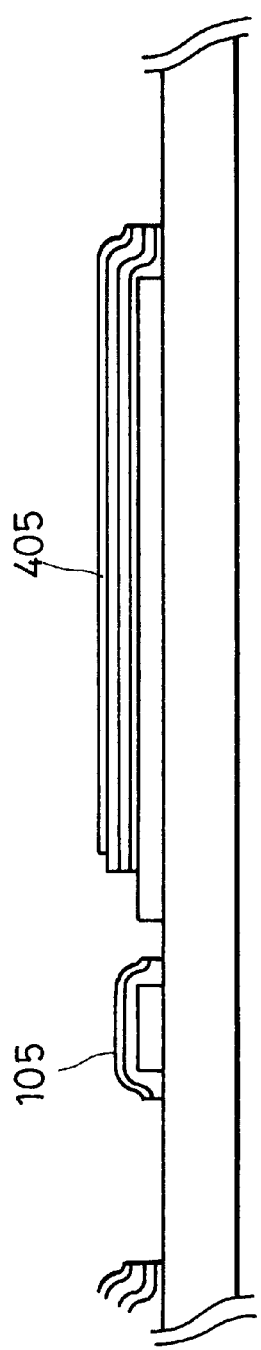

Then, as shown in FIG. 17E, an organic electron transport material is deposited to 0.05 $\mu$m on the ITO layer of the diode portion to form an electron transport layer. As the organic electron transport material, tris(8-quinolinolato) aluminum complex (Formula 3) is used.

Figure 17F:
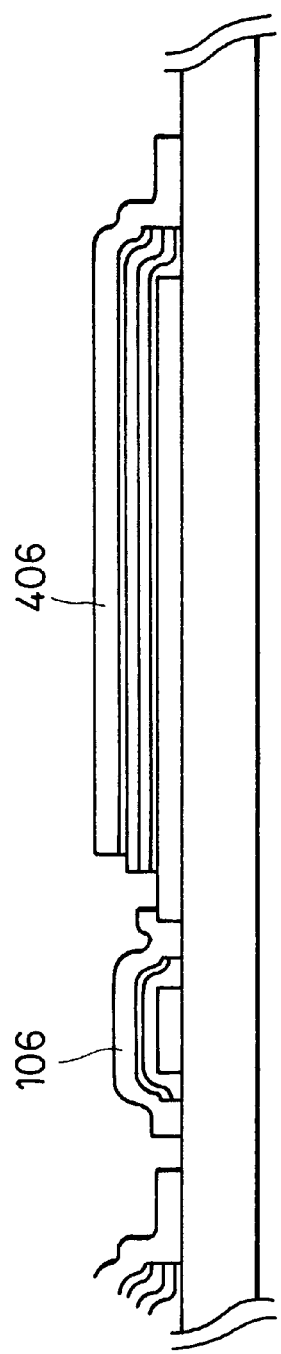

Next, as shown in FIG. 17F, an electron injection material is deposited to 0.001 $\mu$m on these organic electron transport layers to form electron injection layers. As the electron injection material, LiF is used.

Next, as shown in FIG. 17G, a metal having a low work function is deposited to 0.15 $\mu$m on the organic electron injection layers to form cathode layers. As the metallic material, Al is used.

In this embodiment, tris(8-quinolinolato)aluminum complex (Formula 3) is used as the organic electron transport material to form the organic electron transport layer as an organic layer in the diode portion. Since tris(8-quinolinolato)aluminum complex (Formula 3) is thermally stable, as compared with the aromatic diamine used for the organic hole transport layer in the light emitting portion, this construction has the advantage of increasing the heat resistance of the diode.

Fourth Embodiment

The equivalent circuits of a light emitting diode device of this embodiment are the same as the first embodiment.

Figure 18:
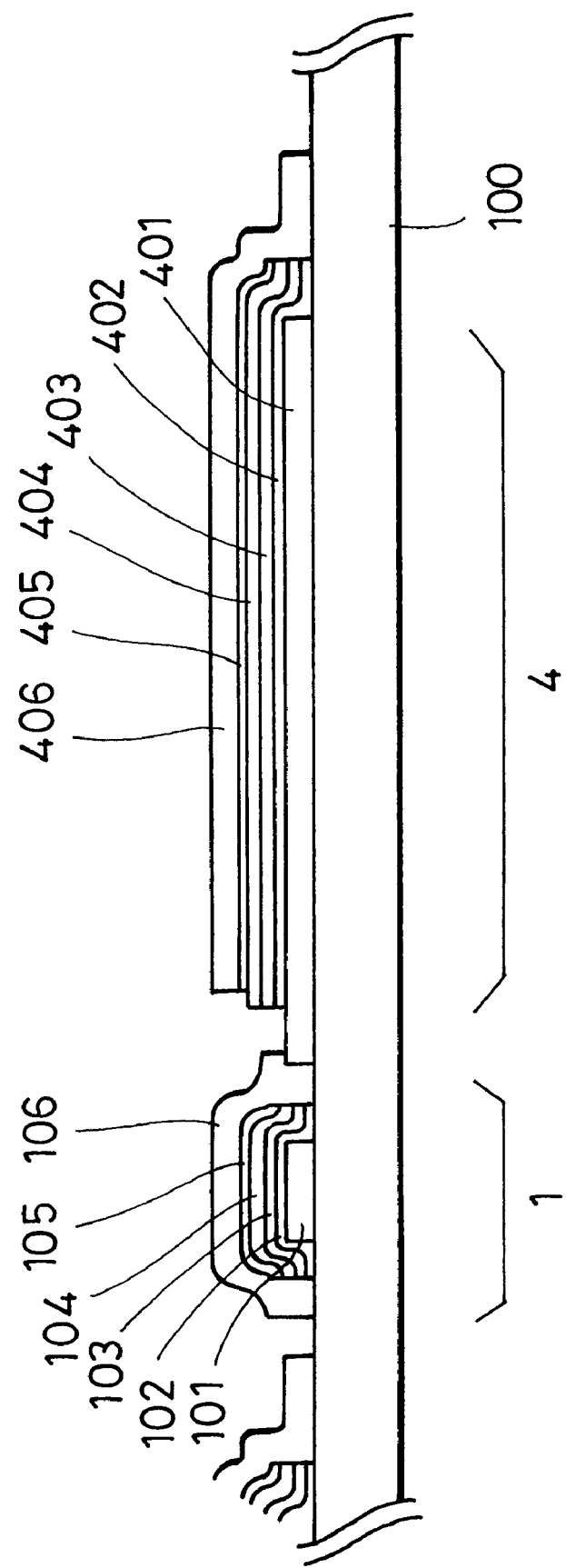
FIG. 18 is a schematic drawing showing the configuration of a device of a fourth embodiment of the present invention.

FIG. 18 is a schematic sectional view showing the construction of the organic light emitting diode device of this embodiment.

Referring to FIG. 18, each of pixels comprises a diode (writing diode) 1, an organic light emitting diode 4 serving as a light emitting portion, and a substrate 100.

The writing diode 1 comprises a transparent electrode 101 serving as an anode and made of indium/tin oxide (ITO), a hole injection layer 102 made of copper phthalocyanine (Formula 1), a hole transport layer 103 made of aromatic diamine (Formula 2), an electron transport layer 104 made of tris(8-quinolinolato)aluminum complex (Formula 3), an electron injection layer 105 made of LiF, and a cathode 106 made of Al.

The organic light emitting diode 4 comprises a transparent electrode 401 serving as an anode and made of indium/tin oxide (ITO), a hole injection layer 402 made of copper phthalocyanine (Formula 1), a hole transport layer 403 made of aromatic diamine (Formula 2), an electron transport layer 404 made of tris(8-quinolinolato)aluminum complex (Formula 3), an electron injection layer 405 made of LiF, and a cathode 406 made of Al.

FIGS. 19 and 20 are schematic sectional views showing the process for manufacturing the organic light emitting diode device of this embodiment.

First, as shown in FIG. 19A, indium/tin oxide (ITO) is deposited to 0.15 $\mu$m, by sputtering, on a portion of the cleaned glass substrate 100 with good flatness in which the light emitting portion is formed, and on a portion thereof in which the writing diode is formed, and then patterned by photolithography.

Next, as shown in FIG. 19B, an organic hole injection material is deposited to 0.01 $\mu$m on the ITO layers of the light emitting portion and the diode portion by the vacuum deposition method to form organic hole injection layers. As the organic hole injection material, copper phthalocyanine represented by Formula 1 is used.

Then, as shown in FIG. 19C, an organic hole transport material is deposited to 0.05 $\mu$m to form an organic hole transport layer. As the organic hole transport material, aromatic diamine represented by Formula 2 is used.

Next, as shown in FIG. 20D, an organic electron transport material is deposited to 0.05 $\mu$m on the organic hole transport layer of the light emitting portion to form an organic electron transport layer. At this time, the organic electron transport material is selected, and a fluorescent material is doped, according to the desired color emitted light. In this embodiment, when green emitted light is desired, tris(8-quinolinolato)aluminum complex (Formula 3) is used as the organic electron transport material, and a fluorescent material represented by Formula 4 is simultaneously binary-deposited. When red emitted light is desired, tris(8-quinolinolato)aluminum complex (Formula 3) is used as the organic electron transport material, and a fluorescent material represented by Formula 5 is simultaneously binary-deposited. When blue emitted light is desired, a distyryl derivative represented by Formula 6 is used as the organic electron transport material, a fluorescent material represented by Formula 7 is simultaneously binary-deposited, and tris(8-quinolinolato)aluminum complex (Formula 3) is further used as the organic electron transport material to form the organic electron transport layer.

Then, as shown in FIG. 20E, an organic electron transport material is deposited to 0.05 μm on the organic hole transport layer of the diode portion to form an electron transport layer. As the organic electron transport material, tris(8-quinolinolato)aluminum complex (Formula 3) is used.

Next, as shown in FIG. 20F, an electron injection material is deposited to 0.001 μm on these organic electron transport layers to form electron injection layers. As the electron injection material, LiF is used.

Figure 21G:
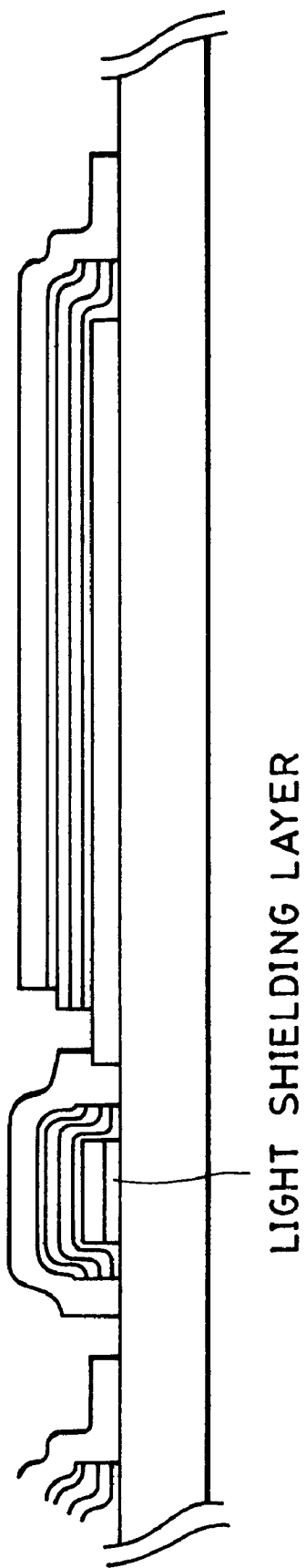
FIG. 21G is a drawing showing an example in which a light shielding layer is provided on the transparent electrode side of a diode.

Next, as shown in FIG. 21G, a metal having a low work function is deposited to 0.15 μm on the organic electron injection layers to form cathode layers. As the metallic material, Al is used.

In this embodiment, the organic light emitting diode serving as the light emitting portion and the writing diode of each of the pixels has a common layer structure, and thus the constituent organic layers of both diodes can be simultaneously deposited, thereby improving productivity.

On the other hand, since the organic light emitting diode serving as the light emitting portion and the writing diode of each of the pixels have a common layer structure, there is the possibility that the writing diode emits light under some conditions. When the emission of light from the writing diode is unallowable in practical use, a light shielding layer is preferably provided on the transparent electrode side of the diode, as shown in FIG. 21, or a light shielding electrode made of, for example, Au or the like in this embodiment, is preferably used in place of the transparent electrode of the diode.

In the embodiments other than this embodiment, when a reverse voltage is applied to the writing diode, a leak current occurs due to incidence of a light beam to cause a current to flow into the equivalent capacity component 4-C of the organic light emitting diode, thereby causing an operation error in which the emission of light from the organic light emitting diode 4 does not correspond to the initial data signal. Where the operation error has an unallowable effect, a light shielding layer is preferably provided on the transparent electrode side of the diode, or a light shielding electrode made of, for example, Au or the like is preferably used in place of the transparent electrode of the diode.

Fifth Embodiment

The equivalent circuits of a light emitting diode device of this embodiment are the same as the first embodiment.

Figure 22:
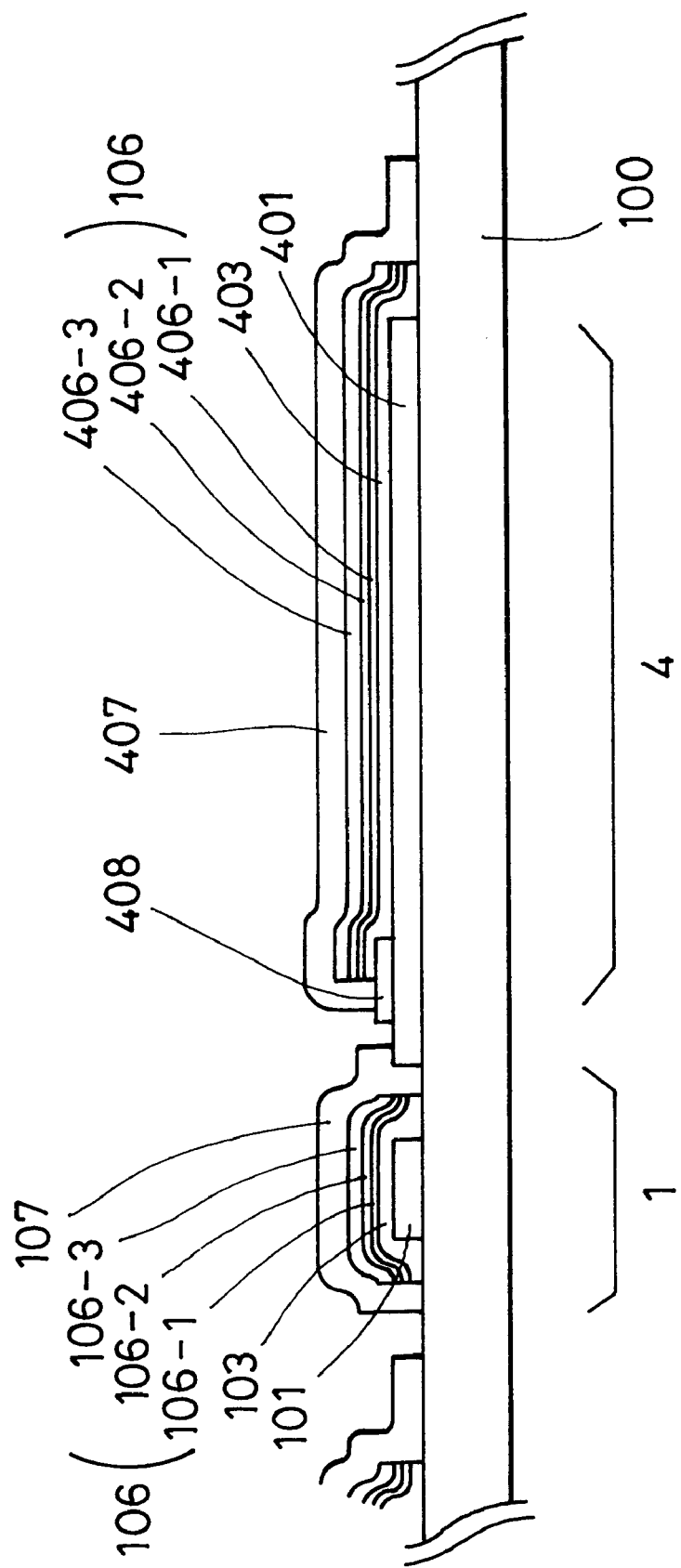
FIG. 22 is a schematic drawing showing the configuration of a device of a fifth embodiment of the present invention.

FIG. 22 is a schematic sectional view showing the construction of the organic light emitting diode device of this embodiment.

Referring to FIG. 22, each of pixels comprises a diode (writing diode) 1, an organic light emitting diode 4 serving as a light emitting portion, and a substrate 100.

The writing diode 1 comprises a transparent electrode 101 serving as an anode and made of indium/tin oxide (ITO), an electron hole transport layer 103 made of an organic material comprising poly(N-vinylcarbazole) (PVK) (Formula 8) and tris(8-quinolinolato)aluminum complex (Formula 3) dispersed therein, a cathode 106 comprising three layers including a MgAg alloy layer 106-1 formed by co-depositing Mg and Ag, an Ag layer 106-2 and an Al layer 106-3, a protective layer 107 made of Al, and an insulation layer 108 made of silicon nitride.

The organic light emitting diode 4 comprises a transparent electrode 401 serving as an anode and made of indium/tin oxide (ITO); an organic electron hole transport emission layer 403 made of an organic material obtained by dispersing tris(8-quinolinolato)aluminum complex (Formula 3) or oxadiazole derivative (Formula 10) and a dye such as Nile red (Formula 5), coumarin 6 (Formula 9), coumarin 47, or the like, which is selected according to the desired color emitted light, in poly(N-vinylcarbazole) (PVK) (Formula 8); a cathode 406 comprising three layers including a MgAg alloy layer 406-1 formed by co-depositing Mg and Ag, an Ag layer 406-2 and an Al layer 406-3; a protective layer 407 made of Al, and an insulation layer 408 made of silicon nitride.

FIGS. 23, 24, 25 and 26 are schematic sectional views showing the process for manufacturing the organic light emitting diode device of this embodiment.

First, as shown in FIG. 23A, indium/tin oxide (ITO) is deposited to 0.15 μm on the cleaned glass substrate 100 with good flatness by sputtering.

As shown in FIG. 23B, a silicon nitride layer is deposited to 0.1 μm on the ITO layer by a plasma CVD method, and then patterned by photolithography.

Next, as shown in FIG. 23C, a solution obtained by dissolving poly(N-vinylcarbazole) (PVK) (Formula 8) as an organic hole transport material and tris(8-quinolinolato) aluminum complex (Formula 3) as an organic electron transport material in an appropriate solvent is coated to 0.05 μm over the entire surface by a spin coating method to deposit an organic electron hole transport layer.

Figure 24D:
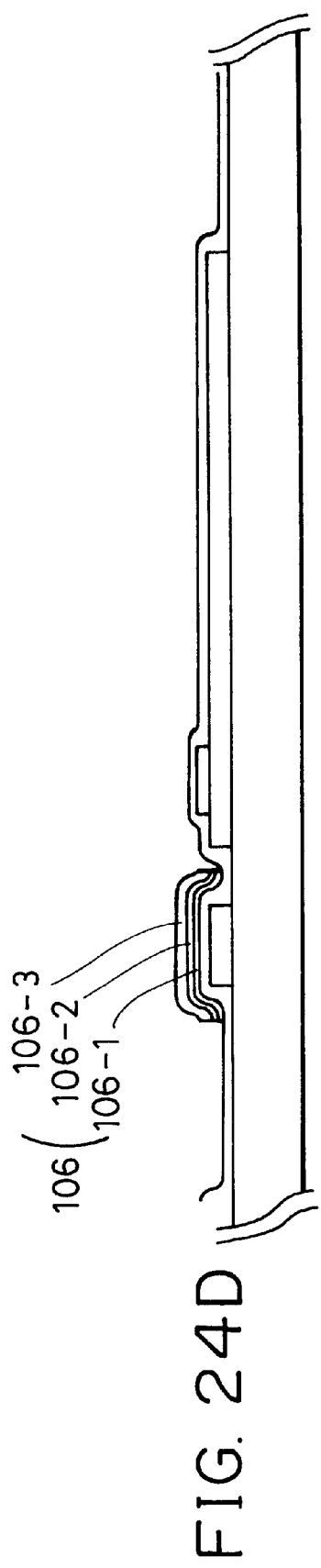
FIGS. 24D–24F are schematic drawings showing the method of manufacturing the device in accordance with the fifth embodiment of the present invention.

Then, as shown in FIG. 24D, Mg which is a metal having a low work function is binary-deposited as an alloy with Ag on the organic electron hole transport layer by the binary deposition method. Then, in order to protect the Mg:Ag layer and ensure electrical conduction, Ag is deposited to 0.05 μm on the Mg:Ag alloy layer, and Al is further deposited to 0.1 μm thereon to form a cathode layer. The cathode layer is formed only in the diode portion and the periphery thereof by using a mask deposition method in which vacuum deposition is performed through a mask having appropriate apertures.

Figure 24E:
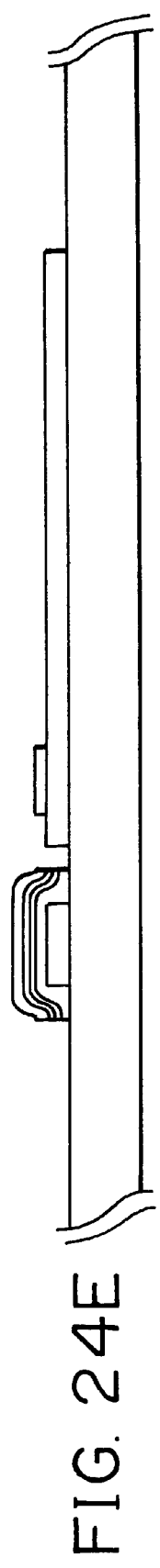

Then, as shown in FIG. 24E, the organic electron hole transport layer is removed by using oxygen plasma except the portion covered with the patterned metallic cathode layer to again expose the surfaces of the ITO layer and the silicon nitride layer.

Figure 24F:
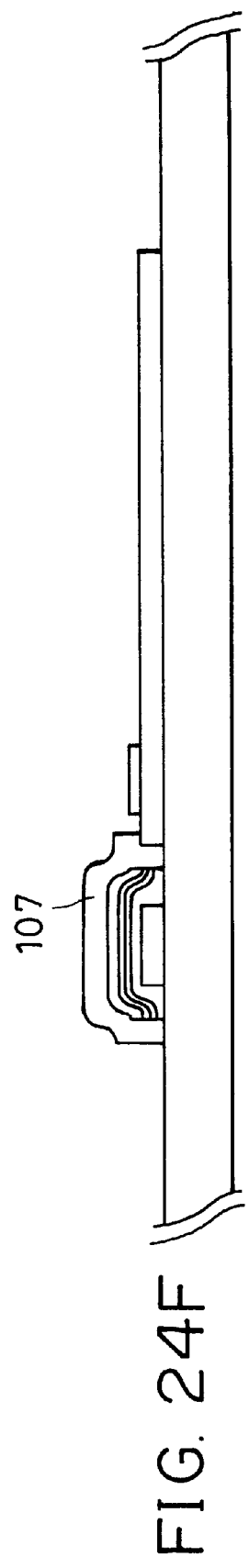
Figure 26J:
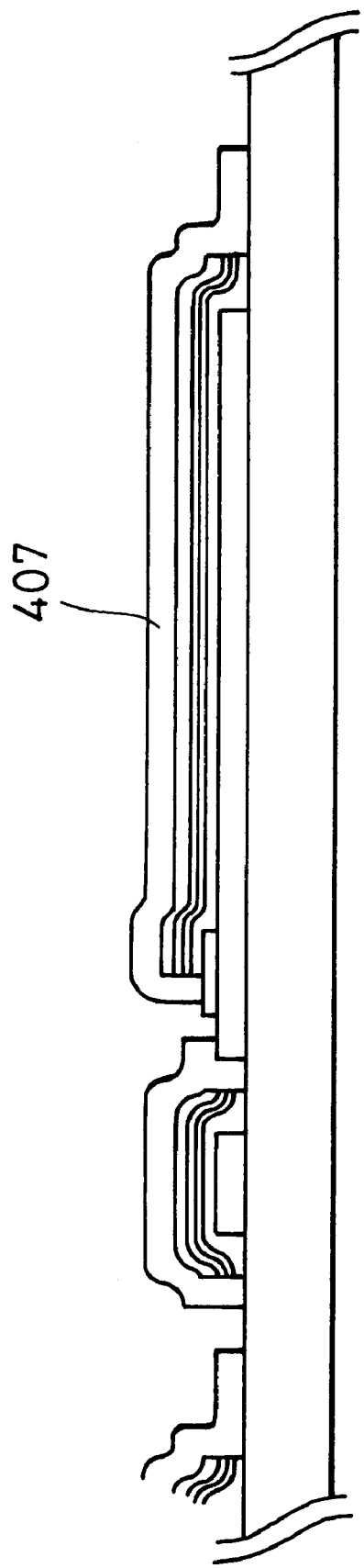
FIG. 26J is a schematic drawing showing the method of manufacturing the device in accordance with the fifth embodiment of the present invention.

Next, as shown in FIG. 24F, Al is deposited to 0.4 μm to cover up to the ends of the element to form a cathode layer.

As shown in FIG. 25G, a solution obtained by dissolving poly(N-vinylcarbazole) (PVK) (Formula 8) and an organic electron transport material and a fluorescent material, which are selected according to the desired color emitted light, is coated to 0.1 μm over the entire surface by the spin coating method to deposit an electron hole transport emission layer.

At this time, when red emitted light is desired, tris(8-quinolinolato)aluminum complex (Formula 3) is used s the organic electron transport material, an nile red (Formula 5)

is sued as a fluorescent material. When green emitted light is desired, tris(8-quinolinolato)aluminum complex (Formula 3) is used s the organic electron transport material, an nile red (Formula 5) is used as a fluorescent material. When green emitted light is desired, tris(8-quinolinolato) aluminum complex (Formula 3) is used as the organic electron transport material, and coumarin 6 (Formula 9) is used as a fluorescent material. When blue emitted light is desired, oxadiazole derivative represented by Formula 10 is used as the organic electron transport material, and coumarin 47 is used as a fluorescent material.

Then, as shown in FIG. 25H, Mg which is a metal having a low work function is binary-deposited as an alloy with Ag on the organic electron hole transport emission layer by the binary deposition method. Then, in order to protect the Mg:Ag layer and ensure electrical conduction, Ag is deposited to 0.05 $\mu$m on the Mg:Ag alloy layer, and Al is further deposited to 0.1 $\mu$m thereon to form a cathode layer. The cathode layer is formed only in the diode portion, the periphery thereof and the necessary wiring portion by using a mask deposition method in which vacuum deposition is performed through a mask having appropriate apertures.

As shown in FIG. 25I, the organic hole transport layer is removed by using oxygen plasma except the portion covered with the patterned metallic cathode layer to again expose the surfaces of the ITO layer and the silicon nitride layer.

Next, as shown in FIG. 25J, Al is deposited to 0.4 $\mu$m to cover up to the ends of the element to form a cathode layer.

Where light emitting portions having a plurality of different colors are desired to be formed on the same substrate, the organic electron transport material and the fluorescent material dispersed in poly(N-vinylcarbazole) (PVK) are changed, and the steps from FIGS. 25G to 25I are repeated.

In this embodiment, the organic layer is made of a material comprising a polymer as a main component, and can thus be deposited by the spin coating method, thereby further improving productivity.

The thickness of the organic layer of the diode portion is smaller than that of the organic light emitting diode. With the organic light emitting diode comprising a too thin organic layer, holes and electrons injected from the anode and cathode are recombined without light emission, and flow out of the counter electrode, thereby causing the possibility of decreasing the efficiency of light emission. However, since the writing diode portion need not emit light, it is advantageous to decrease the thickness of the organic layer to some extent to decrease the resistance thereof.

Similarly, in order to efficiently recombine the holes and electrons injected from the anode and the cathode in the organic light emitting diode, the amounts of the holes and electrons injected from the anode and the cathode, respectively, must be balanced. Therefore, in some cases, an increase in conductivity of the organic layer is limited. However, the writing diode portion need not emit light, such a limit is removed, and the composition of the organic layer can be selected to obtain sufficient conductivity.

Sixth Embodiment

The equivalent circuits of a light emitting diode device of this embodiment are the same as the first embodiment.

FIG. 27 is a schematic sectional view showing the construction of the organic light emitting diode device of this embodiment.

Referring to FIG. 27, each of pixels comprises a diode (writing diode) 1, an organic light emitting diode 4 serving as a light emitting portion, and a substrate 100.

The writing diode 1 comprises a transparent electrode 101 serving as an anode and made of indium/tin oxide (ITO), a hole transport layer 103 made of poly(p-phenylenevinylene) (PPV) (Formula 11), and a cathode 106 comprising three layers including a MgAg alloy layer 106-1 formed by co-deposing Mg and Ag, an Ag layer 106-2 and an Al layer 106-3.

The organic light emitting diode 4 comprises a transparent electrode 401 serving as an anode and made of indium/tin oxide (ITO); a hole transport layer 403 made of poly(p-phenylenevinylene) (PPV) (Formula 11); an electron hole transport emission layer 404 made of an organic material such as poly(p-polyphenylenevinylene) (PPV) (Formula 11), cyanopoly(p-phenylenevinylene) (CN-PPV) (Formula 12), poly(alkylphenylene), or the like, which is selected according to the desired color emitted light; and a cathode 406 comprising three layers including a MgAg alloy layer 406-1 formed by co-deposing Mg and Ag, an Ag layer 406-2 and an Al layer 406-3.

Figure 29D:
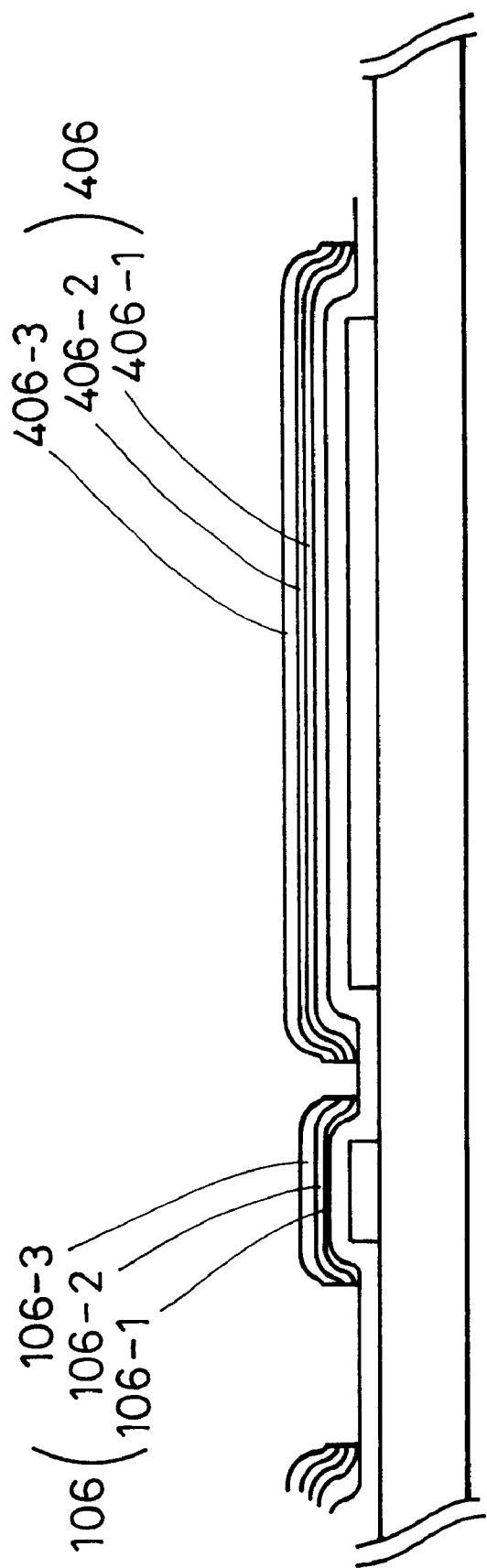
FIG. 29D is a schematic drawing showing the method of manufacturing the device in accordance with the sixth embodiment of the present invention.

FIGS. 28 and 29 are schematic sectional views showing the process for manufacturing the organic light emitting diode device of this embodiment.

First, as shown in FIG. 28A, indium/tin oxide (ITO) is deposited to 0.15 $\mu$m on the cleaned glass substrate 100 with good flatness by sputtering.

Next, as shown in FIG. 28B, polytetrathiophenylphenylene which is a precursor of poly(p-phenylenevinylene) (PPV) (Formula 11) as an organic hole transport material is coated, and heated to obtain a poly(p-phenylenevinylene) (PPV) (Formula 11) film having thickness of 0.05 $\mu$m as an organic hole transport layer.

Then, as shown in FIG. 28C, an electron hole transport emission layer is formed on the organic hole transport layer of the light emitting portion by an ink jet printing apparatus. At this time, where red emitted light is desired, cyanopoly (p-phenylenevinylene) (CN-PPV) (Formula 12) is used as an electron hole transport emission material. Where green emitted light is desired, poly(p-phenylenevinylene) (PPV) (Formula 11) is used as the electron hole transport emission material. Where blue emitted light is desired, poly(p-phenylenevinylene) (PPV) (Formula 11) and poly (alkylphenylene) are used as the electron hole transport emission materials.

Then, Mg which is a metal having a low work function is binary-deposited to 0.15 $\mu$m as an alloy with Ag on the electron hole transport emission layer by the vacuum deposition method to form a cathode layer.

In this embodiment, an organic layer is made of a material comprising a polymer as a main component, and can be deposited by using the ink jet printing apparatus, thereby improving productivity.

Seventh Embodiment

Figure 30:
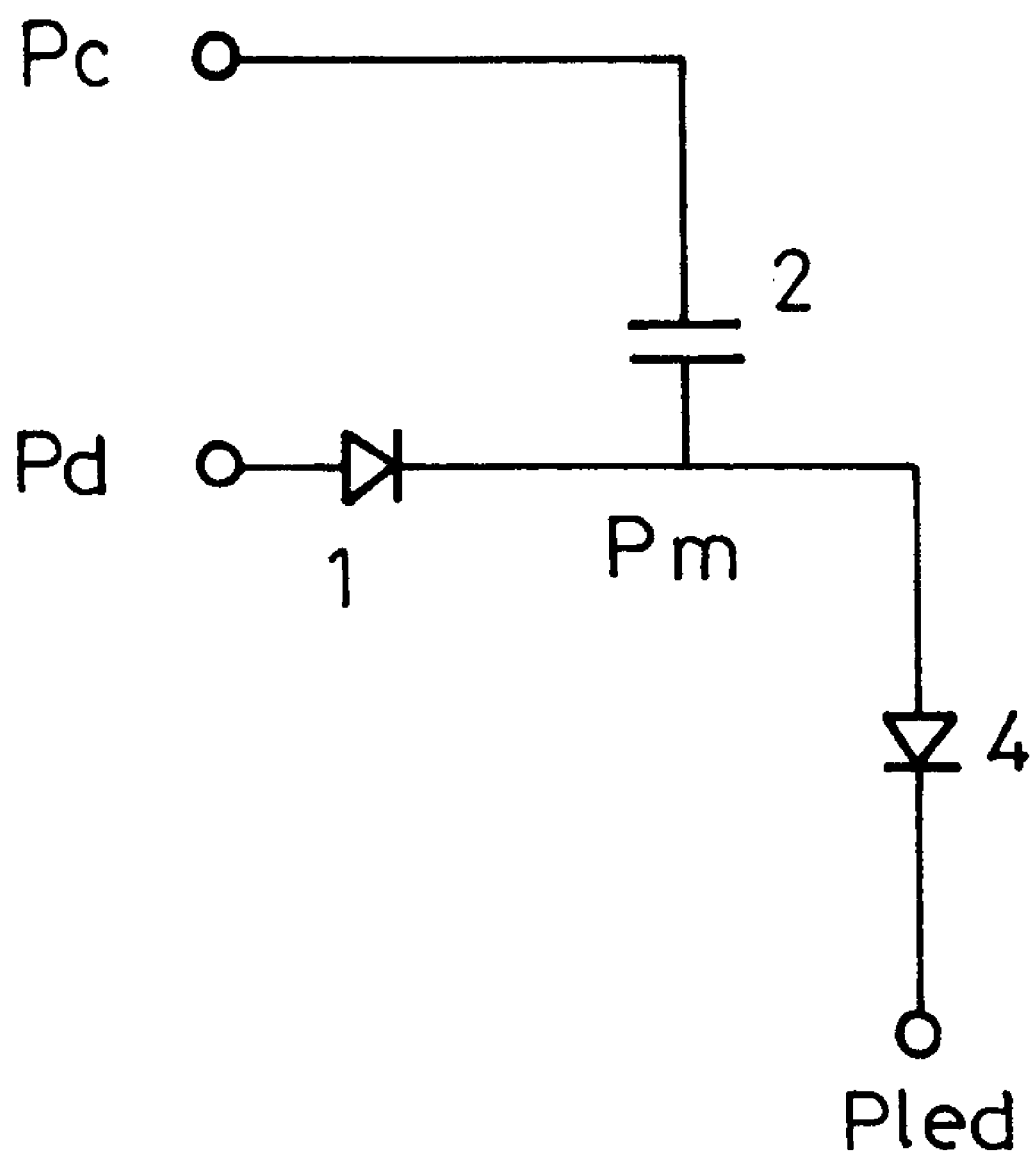
FIG. 30 is a drawing showing an equivalent circuit of a single pixel in a device in accordance with a seventh embodiment of the present invention.

FIG. 30 is a drawing showing an equivalent circuit of a single pixel in an organic light emitting diode device of this embodiment.

Referring to FIG. 30, the pixel comprises a diode (writing diode) 1, a storage capacitor 2, and an organic light emitting diode 4 serving as a light emitting portion. The pixel further comprises an electrode Pc connected to the first side of the storage capacitor 2, an electrode Pm connected to the second side of the storage capacitor 2, an electrode Pd connected to the anode of the writing diode, and an electrode Pled connected to the cathode of the organic light emitting diode.

In FIG. 30, the equivalent capacity component and the equivalent resistance component possessed by the organic light emitting diode are omitted.

A selection signal is applied to the electrode Pc, a data signal is applied to the electrode Pd, and a potential appears in the electrode Pm by charge and discharge of the storage capacitor 2 according to the data signal. The electrode Pled is at a fixed potential.

This embodiment is characterized in that a pixel comprises the storage capacitor separate from the equivalent capacity component possessed by the light emitting diode.

In a construction comprising no storage capacitor other than the equivalent capacity component of the organic light emitting diode, as described above in the first to sixth embodiments, the capacity value is determined by the size of the organic light emitting diode, and it is thus very difficult to ensure a capacity for storing a charge necessary for sufficient light emission. If a charge necessary for sufficient light emission is stored, it is necessary to increase the voltage applied to the organic light emitting diode. This is not necessarily desirable from the viewpoint of reliability.

In this embodiment, in consideration of these points, each of the pixels comprises the storage capacitor separate from the equivalent capacity component of the light emitting diode.

By providing another storage capacitor, it is possible to ensure a capacity for storing a charge necessary for sufficient light emission. Therefore, light can be emitted for an emission time corresponding to the signal without application of excessive voltage to the light emitting diode.

Furthermore, the equivalent capacity component of the light emitting diode 4 can be driven separately from its function as a light emitting diode. Therefore, in this embodiment, driving can be performed by applying a selection signal to only the electrode Pc connected to the first side of the storage capacitor with the electrode Pled connected to the cathode of the light emitting diode 4 kept at the fixed potential.

This permits free setting of the potential of a selection signal and the potential of a data signal for driving, i.e., this brings about an increase in the degree of design freedom.

It is also possible to omit patterning of the cathode of the light emitting diode, as described below. Namely, the presence of the storage capacitor enables driving by applying a selection signal to the electrode Pc connected to the first side of the storage capacitor. It is thus possible to keep the electrode Pled connected to the cathode of the light emitting diode 4 at the fixed potential, and set the cathode potentials of the light emitting diodes of all pixels at the same value, thereby making fine patterning of the cathode of the light emitting diode 4 unnecessary.

In the above-mentioned first to second embodiments, the anode of the light emitting diode 4 is connected to the cathode of the writing diode of each of the pixels, and must be thus patterned in each of the pixels, thereby requiring fine patterning of the cathode and anode of the light emitting diode 4.

The light emitting diode 4 has a structure in which an organic compound layer is held between the anode and the cathode on the substrate. Since the organic compound layer is weak against heat and solvents, an electrode (the anode or cathode) below the organic compound layer can be relatively easily patterned. However, an electrode (the cathode or anode) above the organic compound layer is patterned with difficulties. In other words, there are difficulties in fine patterning of both the cathode and anode of the light emitting diode 4, thereby complicating the process for producing the device.

This embodiment has the advantage of increasing the degree of design freedom in view of the above various points.

The circuit of this embodiment is operated as described below.

When the selection signal applied to the electrode Pc is brought to a selection state (low-potential state), the potential of the electrode Pc drops. As a result, the potential of the electrode Pm with the storage capacitor 2 held between the electrodes Pc and Pm also drops, and is superposed on the data signal applied to the electrode Pd to apply a forward voltage higher than the threshold voltage to the writing diode 1, to cause a conduction stage. Therefore, a current flows into the storage capacitor 2 according to the data signal applied to the electrode Pd.

When the selection signal applied to the electrode Pc is brought to the non-selection state (high-potential state), the potential of the electrode Pm increases, and the voltage applied to the writing diode 1 becomes lower than the threshold voltage to cause the non-conduction state. The charge stored according to the data signal applied to the electrode Pd during the selection period flows out through the organic light emitting diode 4 to emit light from the organic light emitting diode 4 with a luminance corresponding to the signal, or for an emission time corresponding to the signal.

During the time the selection signal applied to the electrode Pc is in the non-selection state (high-potential state), the writing diode 1 is in the non-conduction state, and thus no current flows into and out of the storage capacitor 2 through the writing diode 1 even if the data signal applied to the electrode Pd changes, thereby causing substantially no influence on the emission of light from the organic light emitting diode 4.

Figure 31:
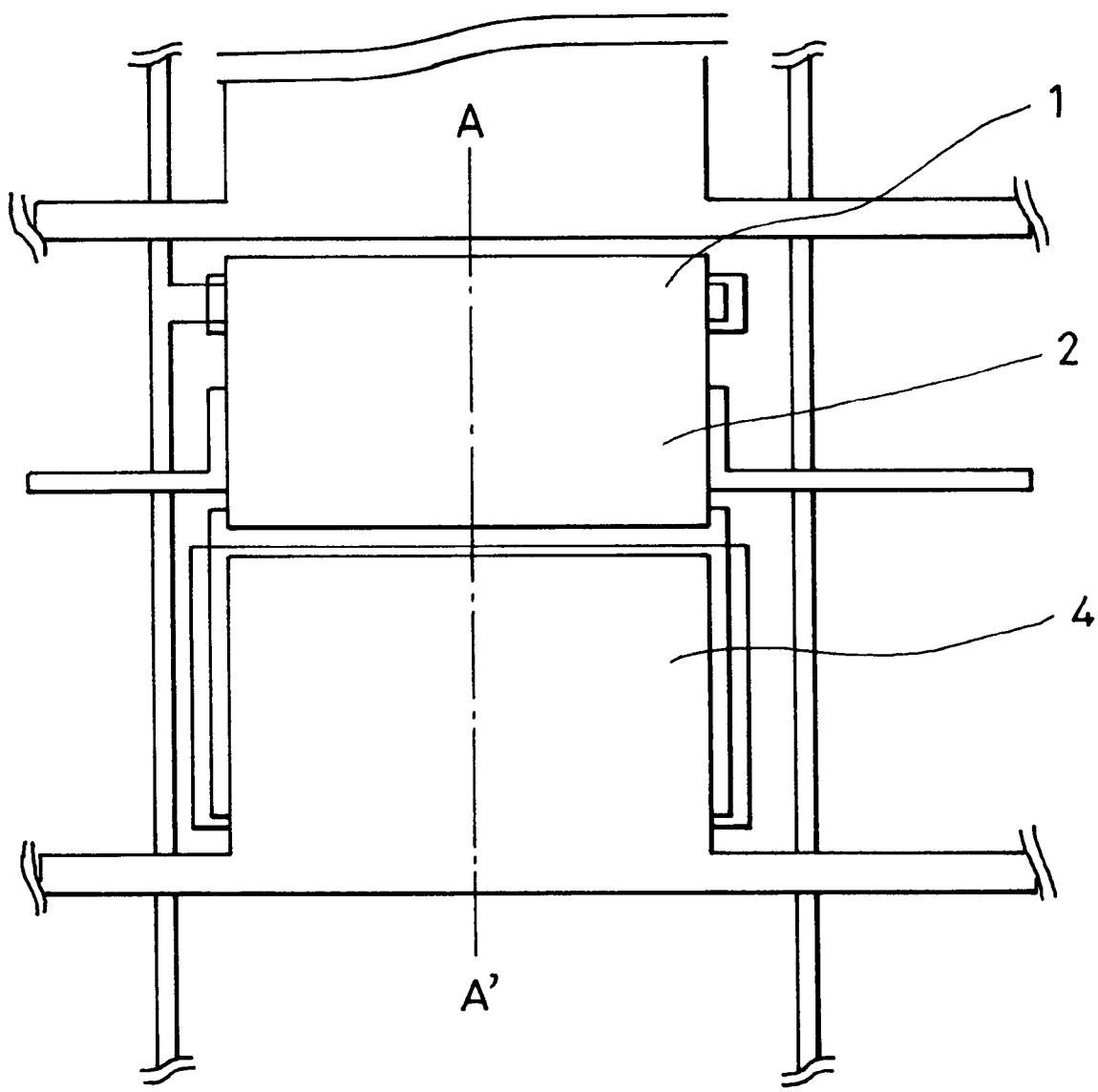
FIG. 31 is a plan view of a single pixel in the device in accordance with the seventh embodiment of the present invention.

FIG. 31 is a plan view showing a single pixel of the device of this embodiment. FIG. 31 shows an example in which the cathode of the light emitting diode is also patterned.

Referring to FIG. 31, the pixel comprises a diode (writing diode) 1, a storage capacitor 2, and a light emitting diode 4.

Figure 32:
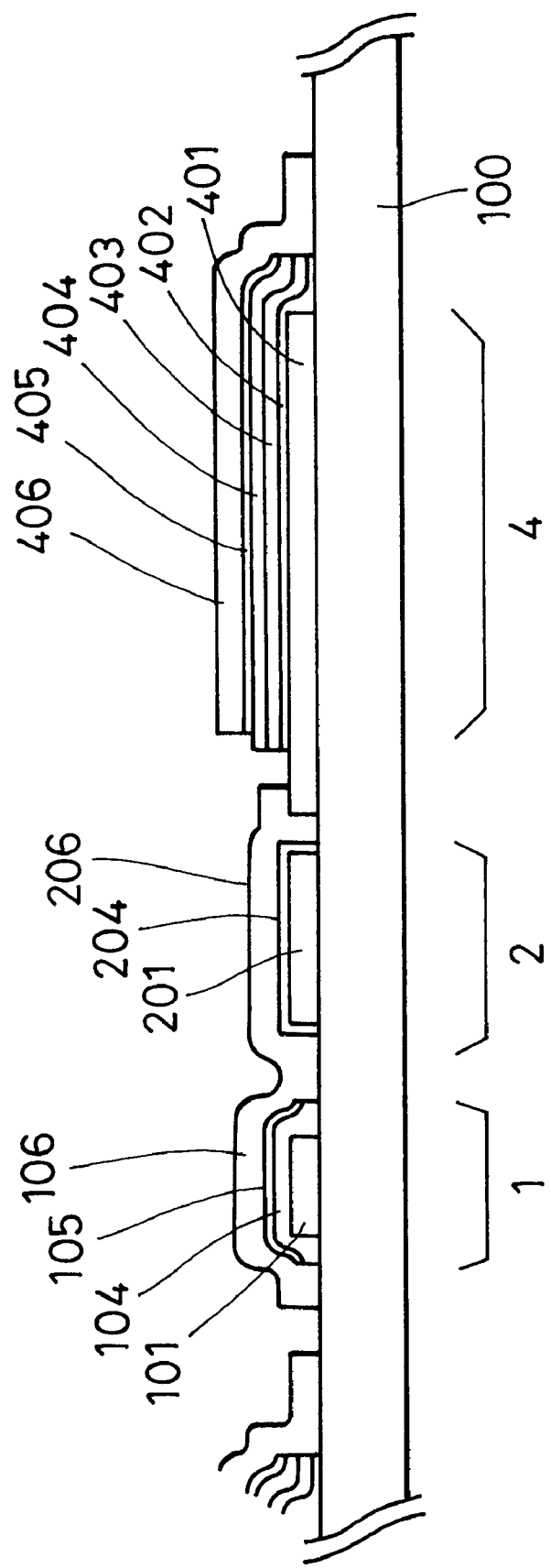
FIG. 32 is a schematic drawing showing the configuration of the device of the seventh embodiment of the present invention.

FIG. 32 is a sectional view of the device of this embodiment taken along line A–A' in FIG. 31.

Referring to FIG. 32, the pixel comprises the diode (writing diode) 1, the storage capacitor 2, the light emitting diode 4, and a substrate 100.

The writing diode 1 comprises an anode 101 made of Au, an organic electron transport layer 104 made of tris(8-quinolinolato)aluminum complex (Formula 3), and a cathode 106 made of Al.

The storage capacitor 2 comprises an anode 201 made of Al, an insulating layer 204 made of an Al anodic oxide film, and a cathode 206 made of Al.

The light emitting diode 4 comprises a transparent electrode 401 serving as an anode and made of indium/tin oxide (ITO), a hole injection layer 402 made of copper phthalocyanine (Formula 1), an organic hole transport layer 403 made of aromatic diamine (Formula 2), an electron transport emission layer 404 made of tris(8-quinolinolato)aluminum complex (Formula 3), an electron injection layer 405 made of LiF, and a cathode made of Al.

FIGS. 33, 34 and 35 are schematic sectional views showing the process for manufacturing the device of this embodiment.

Figure 33A:
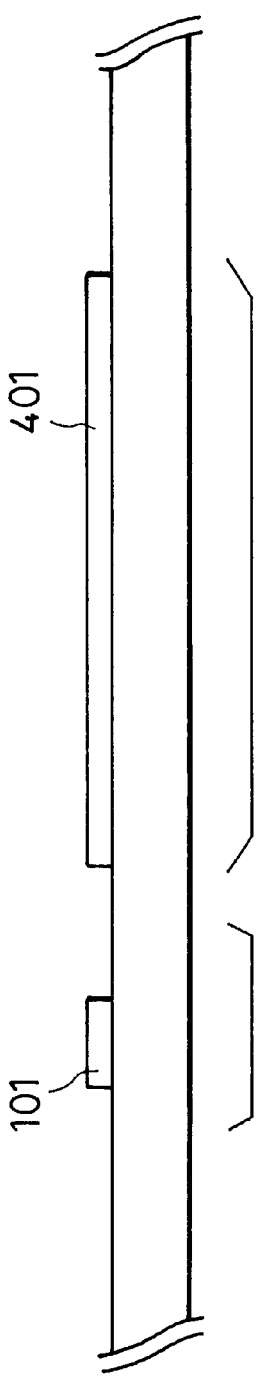
FIGS. 33A–33C are schematic drawings showing a method of manufacturing the device in accordance with the seventh embodiment of the present invention.

As shown in FIG. 33A, indium/tin oxide (ITO) is deposited to 0.15 $\mu$m on a portion of the cleaned glass substrate 100 having good flatness, in which the light emitting portion is formed, and Al is deposited to 0.15 $\mu$m on a portion in which the storage capacitor 2 is formed.

Figure 33B:
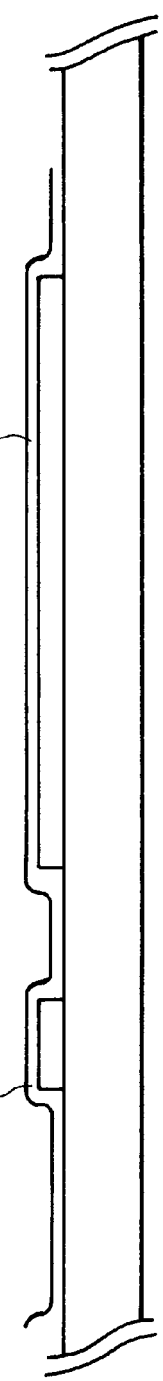

As shown in FIG. 33B, an oxide film is then formed on the surface of the Al layer in the portion where the storage capacitor 2 is formed, by anodic oxidation.

Figure 33C:
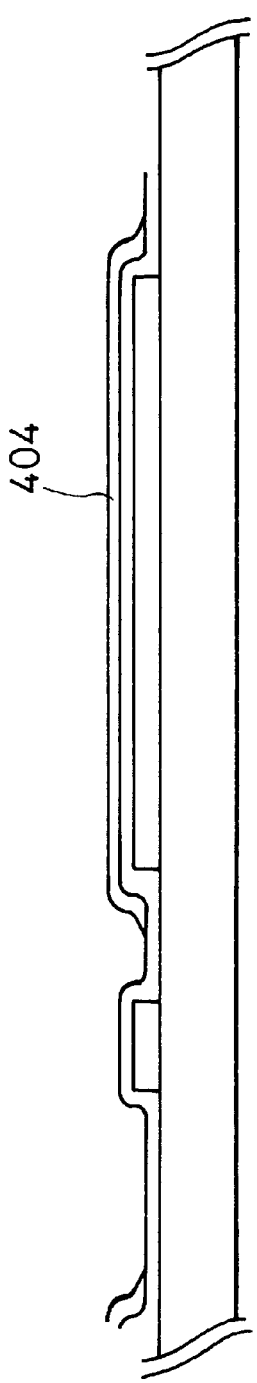

Then, as shown in FIG. 33C, Au is deposited to 0.15 μm on the portion where the writing diode is formed.

Figure 34D:
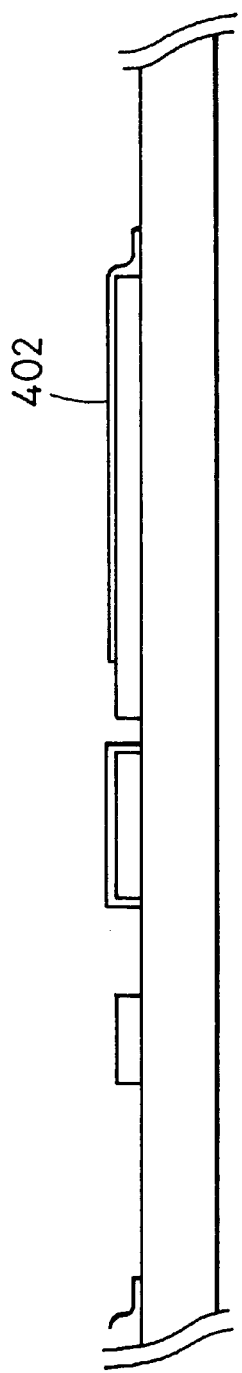
FIGS. 34D–34F are schematic drawings showing the method of manufacturing the device in accordance with the seventh embodiment of the present invention.

Then, as shown in FIG. 34D, copper phthalocyanine (Formula 1) is deposited to 0.15 μm on the portion where the light emitting portion is formed, by vacuum deposition.

Figure 34E:
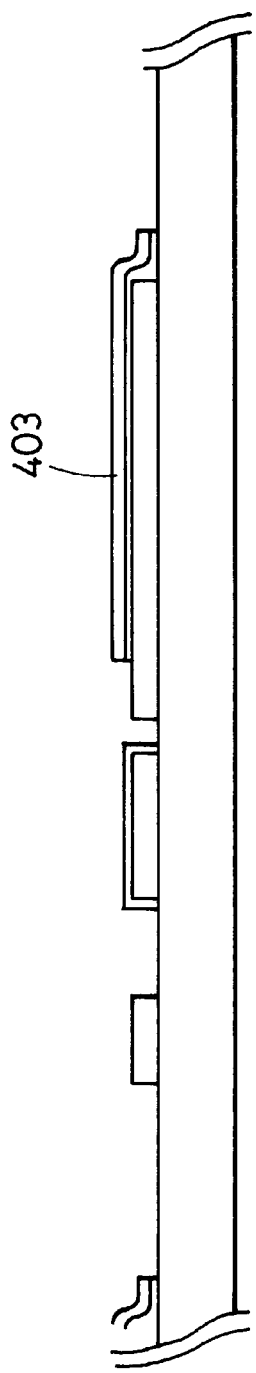

Next, as shown in FIG. 34E, aromatic diamine (Formula 2) is deposited to 0.05 μm on the portion where the light emitting portion is formed, by vacuum deposition.

Figure 34F:
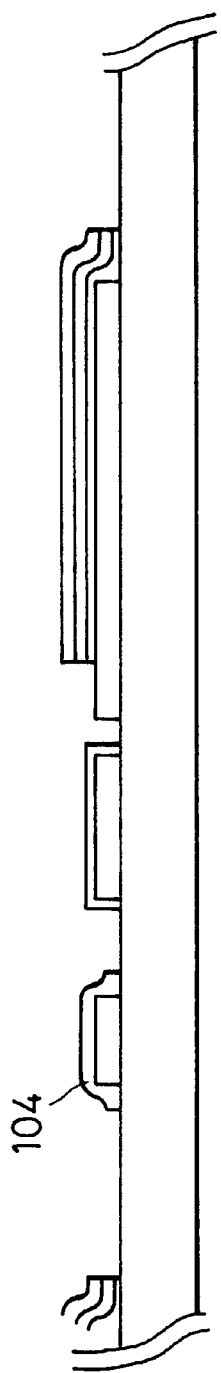

As shown in FIG. 34F, tris(8-quinolinolato)aluminum complex (Formula 3) is deposited to 0.05 m on the organic hole transport layer in the portion where the light emitting portion is formed, and on the indium/tin oxide (ITO) in the portion where the writing diode is formed, to form organic electron transport emission layers.

Figures 35G, 35H:
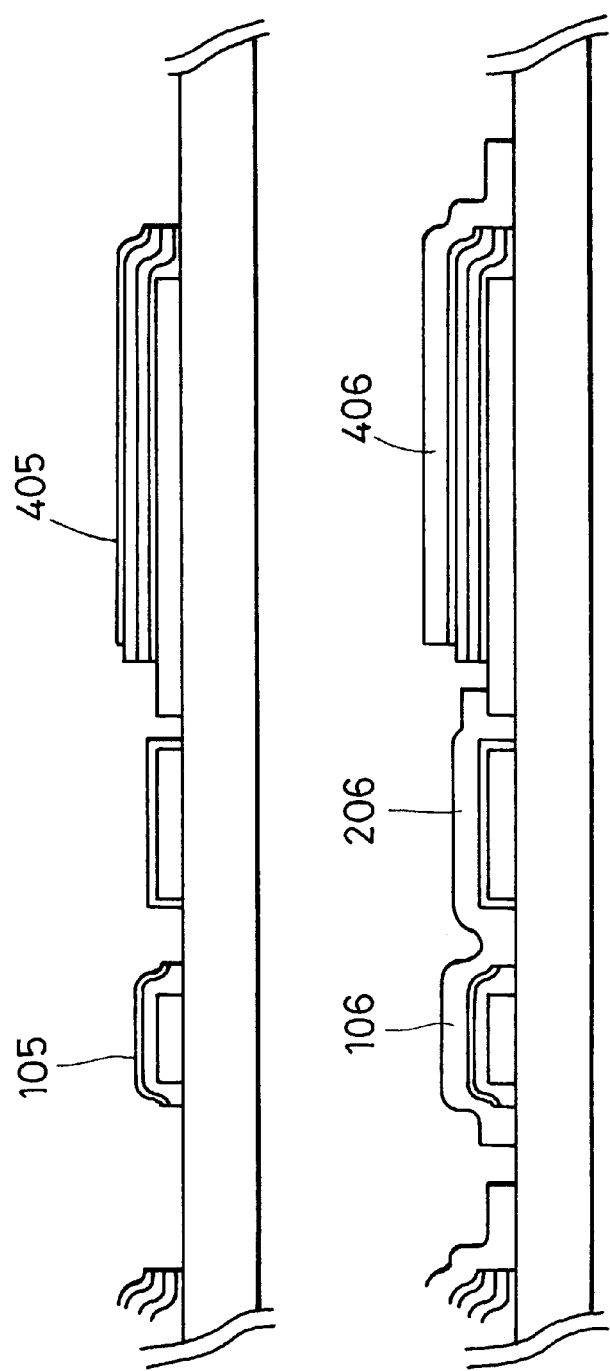
FIGS. 35G, 35H are schematic drawings showing the method of manufacturing the device in accordance with the seventh embodiment of the present invention.

Next, as shown in FIG. 35G, an electron injection material is deposited to 0.001 μm on the organic electron transport layers in the light emitting portion and the writing diode portion to form an electron injection layer. As the electron injection material, LiF is used.

As shown in FIG. 35H, a metal having a low work function is deposited to 0.15 μm on the organic electron injection layer of the light emitting portion, the organic hole transport layer of the diode portion, and the anodic oxide layer of the capacitor portion to form cathode layers. As the metallic material, Al is used.

In this embodiment, the writing diode and the light emitting diode can be formed by any one of the methods described above in the first to six embodiments of the present invention.

The storage capacitor 2 has a structure in which a dielectric layer is held between a pair of electrodes. The dielectric material may be an organic material or an inorganic material.

Eighth Embodiment

The equivalent circuits of a light emitting diode device of this embodiment are the same as the seventh embodiment.

Figure 36:
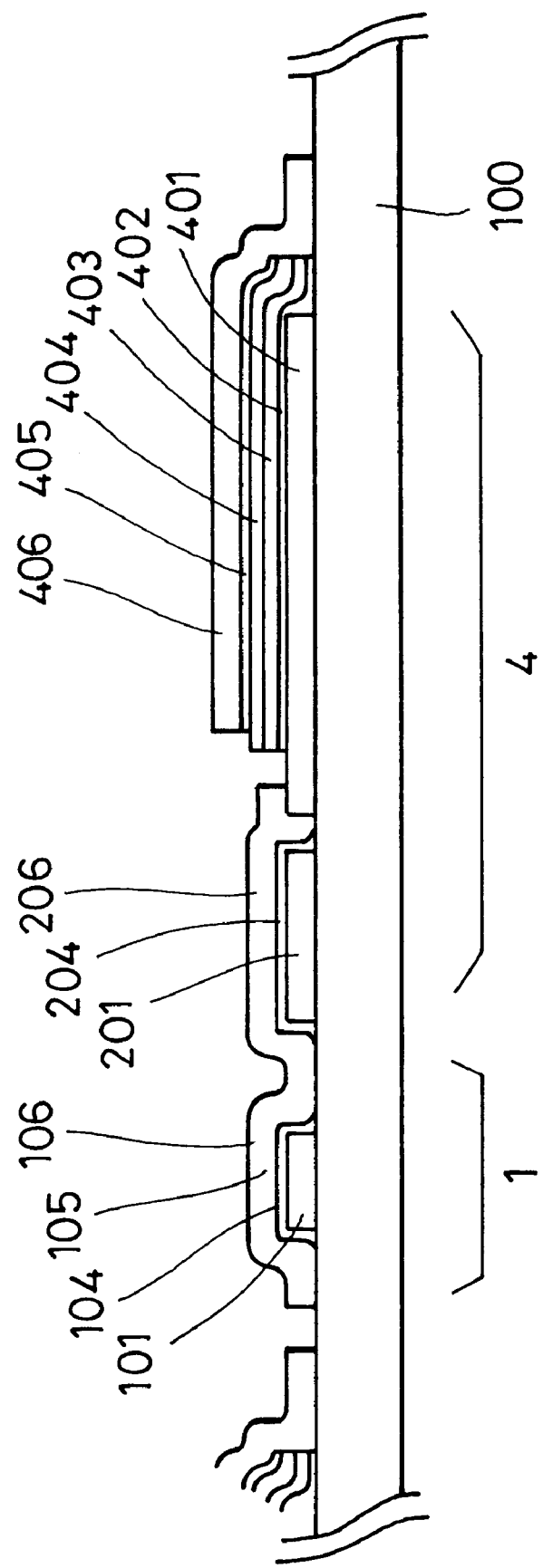
FIG. 36 is a schematic drawing showing the configuration of a device of an eighth embodiment of the present invention.

FIG. 36 is a schematic sectional view showing the construction of the light emitting diode device of this embodiment.

Referring to FIG. 36, each of pixels comprises a diode (writing diode) 1, a storage capacitor 2, a light emitting diode 4, and a substrate 100.

The writing diode 1 comprises a transparent electrode 101 serving as an anode and made of indium/tin oxide (ITO), a hole injection transport layer 102 made of copper phthalocyanine (Formula 1), and a cathode 106 made of Al.

The storage capacitor 2 comprises an anode 201 made of Al, an insulating layer 204 made of copper phthalocyanine (Formula 1), and a cathode 206 made of Al.

The organic light emitting diode 4 comprises a transparent electrode 401 serving as an anode and made of indium/tin oxide (ITO), a hole injection layer 402 made of copper phthalocyanine (Formula 1), a hole transport layer 403 made of aromatic diamine (Formula 2), an electron transport layer 404 made of tris(8-quinolinolato)aluminum complex (Formula 3), an electron injection layer 405 made of LiF, and a cathode 406 made of Al.

Figure 37:
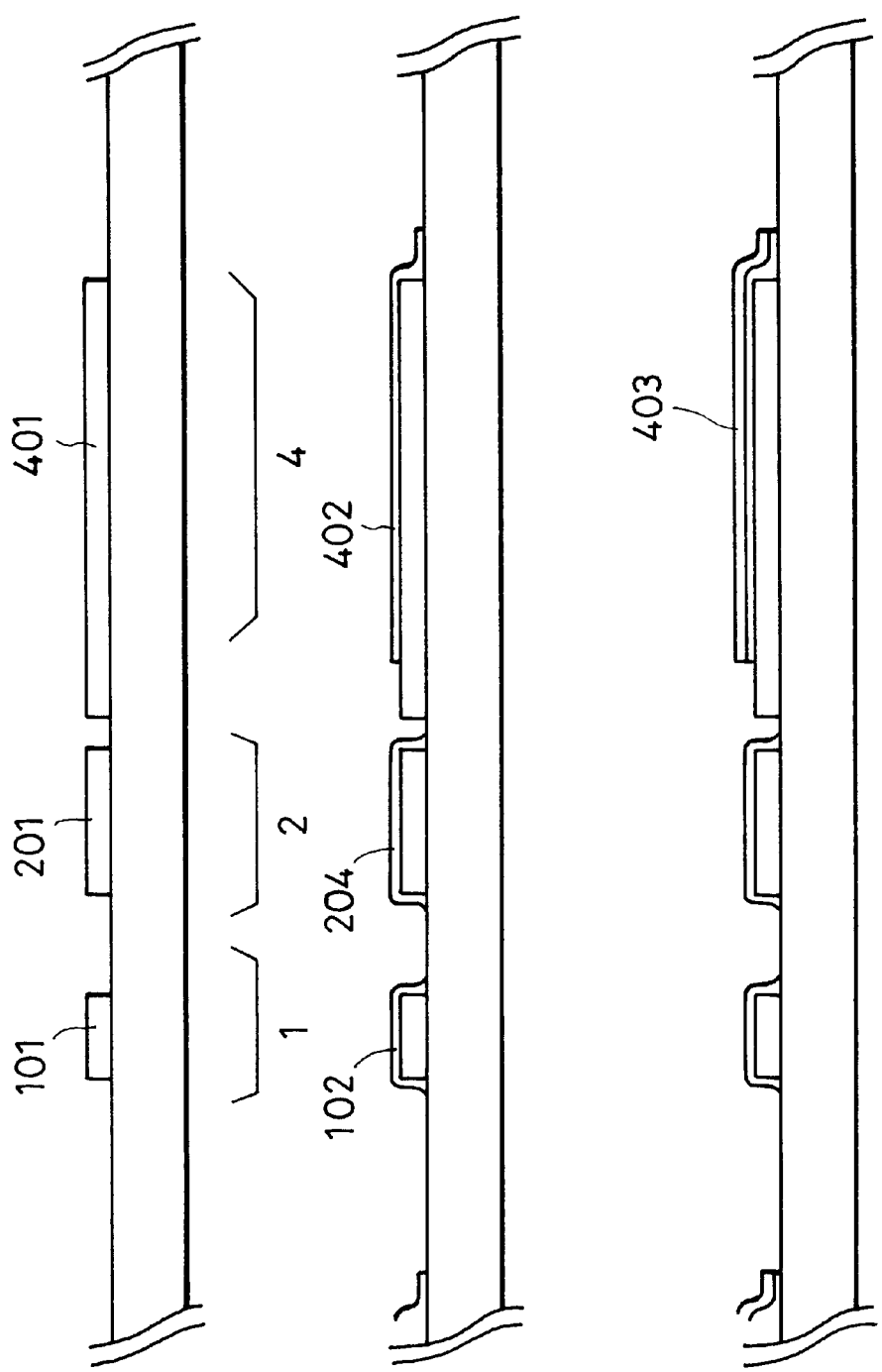
FIGS. 37A–37C are schematic drawings showing a method of manufacturing the device in accordance with the eighth embodiment of the present invention.
Figure 38:
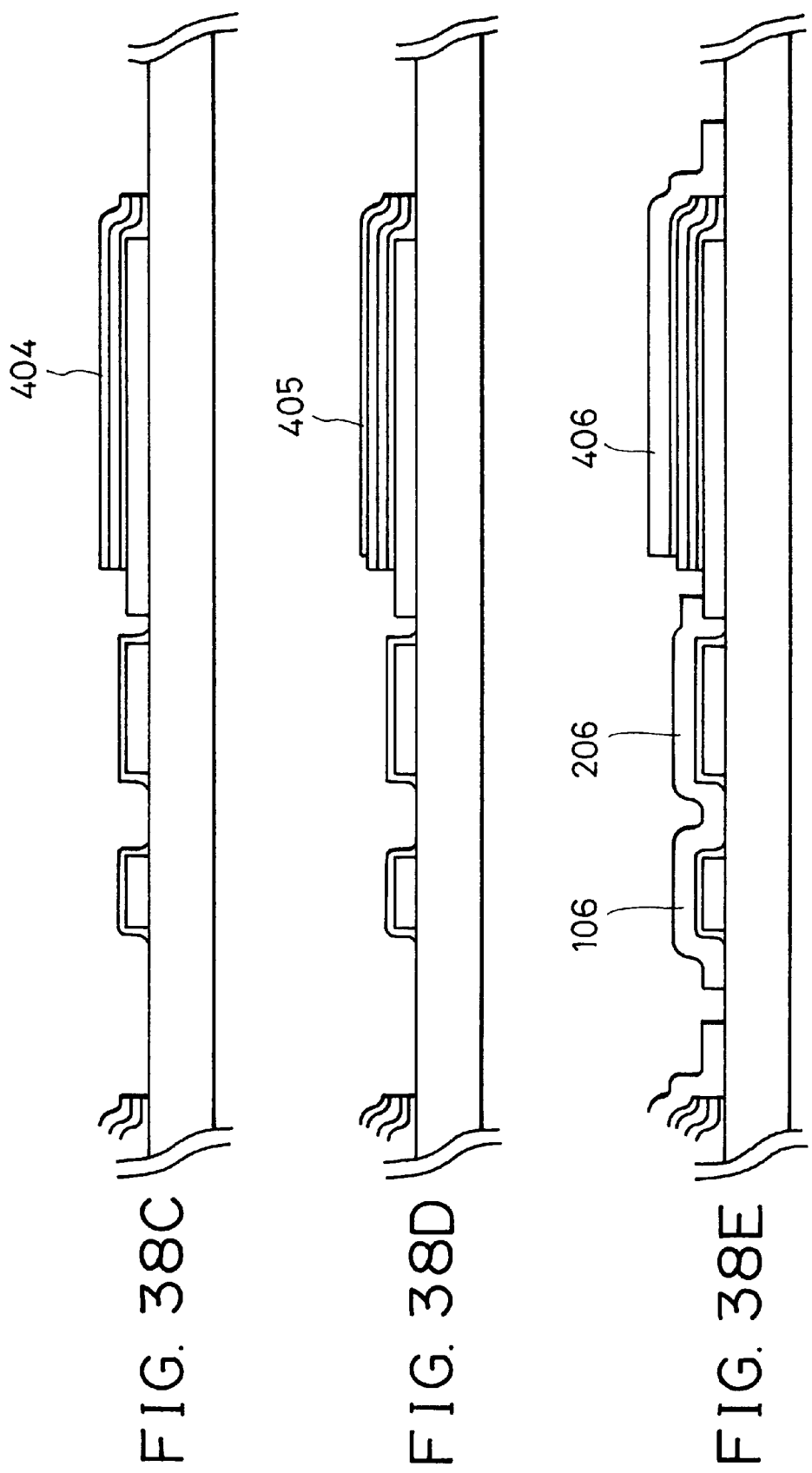
FIGS. 38C–38E are schematic drawings showing the method of manufacturing the device in accordance with the eighth embodiment of the present invention.

FIGS. 37 and 38 are schematic sectional views showing the process for manufacturing the organic light emitting diode device of this embodiment.

First, as shown in FIG. 37A, indium/tin oxide (ITO) is deposited to 0.15 μm on a portion of the cleaned glass substrate 100 having good flatness in which the light emitting portion is formed, by sputtering, Au is deposited to 0.15 μm on a portion thereof in which the writing diode is formed, and Al is deposited to 0.15 μm on a portion thereon in which the storage capacitor is formed.

Then, as shown in FIG. 37B, copper phthalocyanine (Formula 1) is deposited to 0.01 μm on the Au layer of the diode portion and the Al layer of the capacitor portion and the ITO layer of the light emitting portion, by vacuum deposition to form an organic hole transport layer of the diode portion, an organic hole injection layer of the light emitting portion, and an insulating layer of the capacitor portion.

As shown in FIG. 37C, an organic hole transport material is deposited to 0.05 μm on the organic hole injection layer of the light emitting portion by vacuum deposition to form an organic hole transport layer. As the organic hole transport material, aromatic diamine represented by Formula 2 is used.

Next, as shown in FIG. 38D, an organic electron transport material is deposited to 0.05 μm on the organic hole transport layer of the light emitting portion. At this time, the organic electron transport material is selected, and a fluorescent material is doped, according to the desired color emitted light. In this embodiment, when green emitted light is desired, tris(8-quinolinolato)aluminum complex (Formula 3) is used as the organic electron transport material, and a fluorescent material represented by Formula 4 is simultaneously binary-deposited. When red emitted light is desired, tris(8-quinolinolato)aluminum complex (Formula 3) is used as the organic electron transport material, and a fluorescent material represented by Formula 5 is simultaneously binary-deposited. When blue emitted light is desired, a distyryl derivative represented by Formula 6 is used as the organic electron transport material, a fluorescent material represented by Formula 7 is simultaneously binary-deposited, and tris(8-quinolinolato)aluminum complex (Formula 3) is further used as the organic electron transport material to form the organic electron transport layer.

Next, as shown in FIG. 38E, an electron injection material is deposited to 0.001 μm o the organic electron transport layer of the light emitting portion to form an electron injection layer. As the electron injection material, LiF is used.

Then, Al is deposited to 0.15 μm on the organic electron injection layer of the light emitting portion, the organic hole transport layer of the diode portion, and the insulating layer of the capacitor portion to form cathode layers of the light emitting portion and the diode portion, and an upper electron of the capacitor portion.

In this embodiment, the organic hole transport layer of the diode portion, the organic hole injection layer of the light emitting portion, and the insulating layer of the capacitor portion are made of the same material, i.e., copper phthalocyanine (Formula 1). In the capacitor portion, since both the upper and lower electrodes are made of Al having a low work function, substantially no current flows because the interface energy barrier between either of both electrodes and the copper phthalocyanine (Formula 1) layer forms obstruction regardless of the polarity of the voltage applied to the upper and lower electrodes, thereby causing the function as a capacitor.

Besides the above material for the organic insulating layer, other various materials can be used. Typical examples of such materials include polypyrometimide (polyimide) (Formula 13), and the like.

In this embodiment, since the organic hole transport layer of the diode portion, the organic hole injection layer of the light emitting portion, and the insulating layer of the capacitor portion are formed by using the same organic material in the same step, there is the advantage of simplifying the process.

Ninth Embodiment

Figure 39:
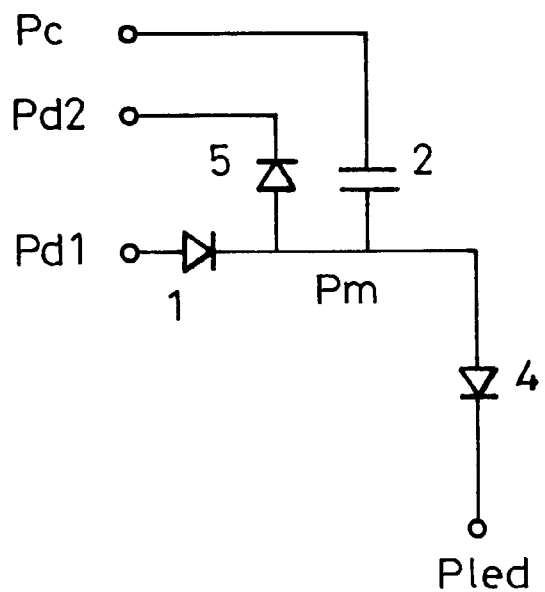
FIG. 39 is a drawing showing an equivalent circuit of a single pixel in a device in accordance with a ninth embodiment of the present invention.

FIG. 39 is a drawing showing an equivalent circuit of a single pixel of this embodiment. Referring to FIG. 39, the pixel comprises a first diode (writing diode) 1, a storage capacitor 2, a light emitting diode 4, and a second diode (reset diode) 5.

In FIG. 39, the equivalent capacity component and the equivalent resistance component possessed by the light emitting diode are omitted.

The pixel further comprises an electrode Pc connected to the first side of the storage capacitor 2, an electrode Pm connected to the second side of the storage capacitor 2, an electrode Pd1 connected to the anode of the writing diode 1, an electrode Pd2 connected to the cathode of the reset diode 5, and an electrode Pled connected to the cathode of the light emitting diode 4.

A selection signal is applied to the electrode Pc, a data signal is applied to the electrode Pd1, a reset signal is applied to the electrode Pd2, and a potential appears in the electrode Pm due to charge and discharge of the storage capacitor 2 corresponding to the data signal. The electrode Pled is at a fixed potential.

This embodiment is characterized in that each pixel comprises the reset diode for resetting a portion of the charge stored in the storage capacitor 2 according to the data signal, which remains after outflow through the organic light emitting diode, through the reset diode the predetermined time after. There is thus the advantage of permitting the organic light emitting diode of a pixel to correctly emit light corresponding to the data signal.

The circuit is operated as described below.

When the reset signal applied to the electrode Pd2 is brought to a reset state (low-potential state), the potential of the electrode Pd drops. As a result, a forward voltage is applied to the reset diode 5 to cause a conduction state. Therefore, a current flows out of the storage capacitor 2, and thus the potential of the electrode Pm is reset to the reset potential.

When the reset signal applied to the electrode Pd2 is brought to a non-reset state (high-potential state), the potential of the electrode Pd2 increases. As a result, no forward voltage hither than the threshold voltage is applied to the reset diode 5, thereby causing a non-conduction state.

At the same time, when the selection signal applied to the electrode Pc is put into the selection state (low-potential state), the potential of the electrode Pc drops. As a result, the potential of the electrode Pm with the storage capacitor 2 held between both electrodes Pc and Pm also drops, and is superposed on the data signal applied to the electrode Pd to apply a forward voltage higher than the threshold voltage to the writing diode 1, thereby causing the conduction state. Therefore, a current flows into the storage capacitor 2 according to the data signal applied to the electrode Pd.

When the selection signal applied to the electrode Pc is brought to the non-selection state (high-potential state), the potential of the electrode Pm increases, and the voltage applied to the writing diode 1 becomes lower than the threshold voltage, thereby causing the non-conduction state. The charge stored according to the data signal applied to the electrode Pd during the selection period flows out through the light emitting diode 4 to emit light from the light emitting diode 4 with a luminance corresponding to the signal, or for an emission time corresponding to the signal.

During the time the selection signal applied to the electrode Pc is in the non-selection state (high-potential state), the writing diode 1 is in the non-conduction state. Therefore, no current flows in and out of the storage capacitor 2 through the writing diode 1 even if the data signal applied to the electrode Pd changes, thereby substantially no influence on the emission of light from the light emitting diode 4.

In this embodiment, the writing diode and the light emitting diode can be formed by any one of the methods described above in the first to sixth embodiments of the present invention. The storage capacitor 2 has a structure in which a dielectric layer is held between a pair of electrodes. The dielectric material is either an organic material or an inorganic material.

Tenth Embodiment

Figure 40:
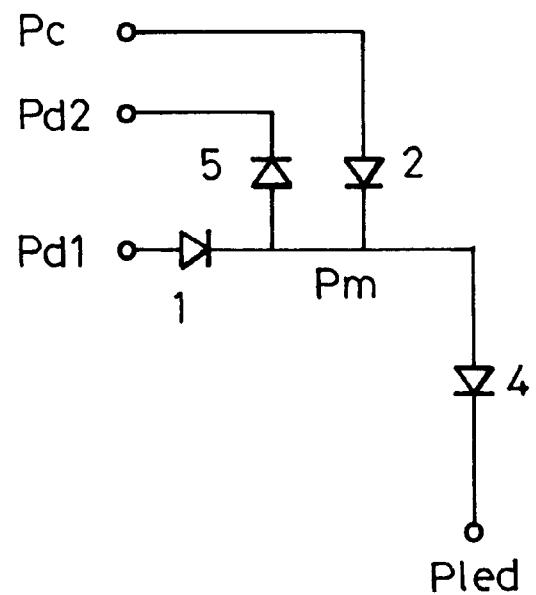
FIG. 40 is a drawing showing an equivalent circuit of a single pixel in a device in accordance with a tenth embodiment of the present invention.

FIG. 40 is a drawing showing an equivalent circuit of a single pixel of this embodiment. Referring to FIG. 40, the pixel comprises a first diode (writing diode) 1, a diode (storage diode) 2 functioning as a storage capacitor 2, a light emitting diode 4, and a second diode (reset diode) 5.

In FIG. 40, the equivalent capacity component and the equivalent resistance component possessed by the light emitting diode are omitted.

The pixel further comprises an electrode Pc connected to the anode of the storage diode 2, an electrode Pm connected to the cathode of the storage diode 2, an electrode Pd1 connected to the anode of the writing diode 1, an electrode Pd2 connected to the cathode of the reset diode 5, and an electrode Pled connected to the cathode of the light emitting diode 4.

A selection signal is applied to the electrode Pc, a data signal is applied to the electrode Pd1, a reset signal is applied to the electrode Pd2, and a potential appears in the electrode Pm due to charge and discharge of the storage diode 2 corresponding to the data signal. The electrode Pled is at a fixed potential.

This embodiment is characterized in that an equivalent capacity component of a diode is used as the storage capacitor. A diode generally stores a charge in an junction thereof, and thus has an equivalent capacity component. Particularly, in this embodiment, the potentials of the data signal, the selection signal and the reset signal are set so that a reverse voltage is applied to the storage diode, thereby preventing loss of a signal charge through the storage diode and inflow of an unnecessary charge. Therefore, the diode can be made function as a storage capacitor.

The circuit is operated as described below.

When the reset signal applied to the electrode Pd2 is brought to a reset state (low-potential state), the potential of the electrode Pd2 drops. As a result, a forward voltage is applied to the reset diode 5 to cause a conduction state. Therefore, a current flows out of the storage diode 2, and the potential of the electrode Pm is reset to a reset potential.

When the reset signal applied to the electrode Pd2 is brought to the non-reset state (high-potential state), the potential of the electrode Pd increases. Therefore, no forward voltage higher than the threshold potential is applied to the reset diode 5, thereby causing the non-conduction state.

At the same time, when the selection signal applied to the electrode Pd is brought to the selection state (low-potential state), the potential of the electrode Pc drops. As a result, the potential of the electrode Pm with the storage diode 2 held between both electrodes Pc and Pm also drops, and is superposed on the data signal applied to the electrode Pd to apply a forward voltage higher than the threshold voltage to the writing diode 1, thereby causing the conduction state. Therefore, a current flows into the storage diode 2 according to the data signal applied to the electrode Pd.

When the selection signal applied to the electrode Pc is brought to the non-selection state (high-potential state), the potential of the electrode Pm rises, and the voltage applied to the writing diode 1 becomes lower than the threshold voltage, thereby causing the non-conduction state. The charge stored according to the data signal applied to the electrode Pd during the selection period flows out through the light emitting diode 4 to emit light from the light emitting diode 4 with a luminance corresponding to the signal, or for an emission time corresponding to the signal.

During the time the selection signal applied to the electrode Pc is in the non-selection state (high-potential state), the writing diode 1 is in the non-conduction state. Therefore, no current flows in and out of the storage diode 2 through the writing diode 1 even if the data signal applied to the electrode Pd changes, thereby substantially no influence on the emission of light from the light emitting diode 4.

In this embodiment, the potentials of the data signal, the selection signal and the reset signal are set so that a reverse voltage is applied to the storage diode, thereby preventing loss of a signal charge through the storage diode and inflow of an unnecessary charge, and making the diode function as a storage capacitor. However, even in a structure in which a forward voltage is applied to the storage diode, the storage diode can be made function as a storage capacitor as long as the storage diode has a high forward threshold voltage, and the forward voltage is kept in a range lower than the forward threshold voltage.

Figure 41:
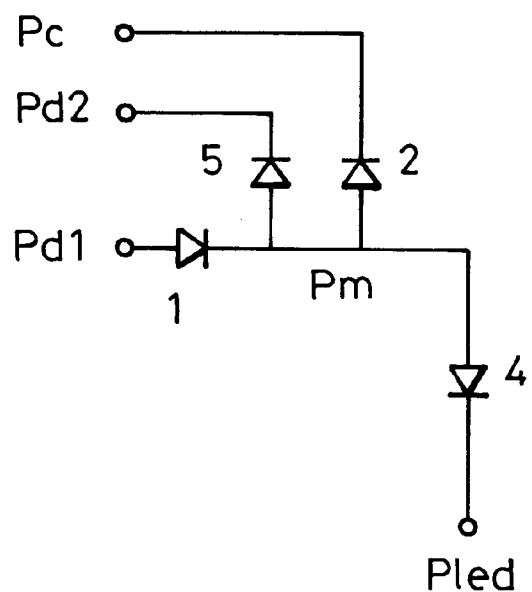
FIG. 41 is a drawing showing the circuit of an example of a configuration in which a forward voltage is applied to a storage diode to function as a storage capacitor.

Such an example is shown in FIG. 41.

A storage diode comprises a plurality of diodes combined in series in the reverse direction. In this case, even if a forward voltage is applied to one of the diodes, the other diode is at a reverse voltage, thereby preventing loss of a signal charge through the diodes and inflow of an unnecessary charge as long as a high voltage reaching the reverse breakdown voltage is not applied. Therefore, the storage diode can be made function as a storage capacitor in a wider operation range.

Figure 42:
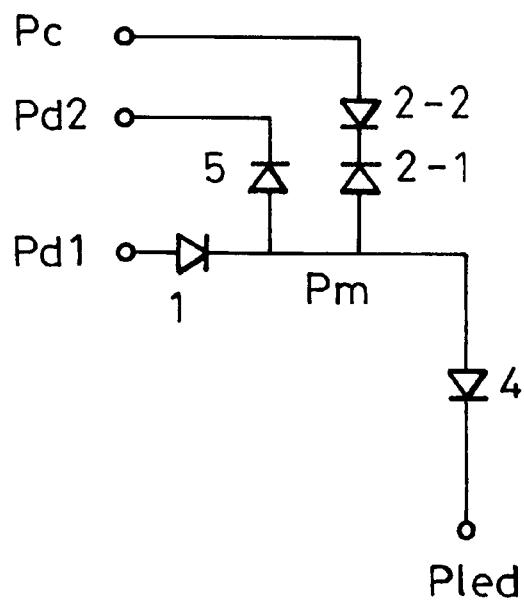
FIG. 42 is a drawing showing the circuit of an example of a configuration in which a plurality of diodes are arranged in series opposite to each other.

Such an example is shown in FIG. 42.

In this example, the diodes and the light emitting diode can be formed by any one of the methods described above in the first to sixth embodiments and other portions.

Eleventh Embodiment

Figure 43:
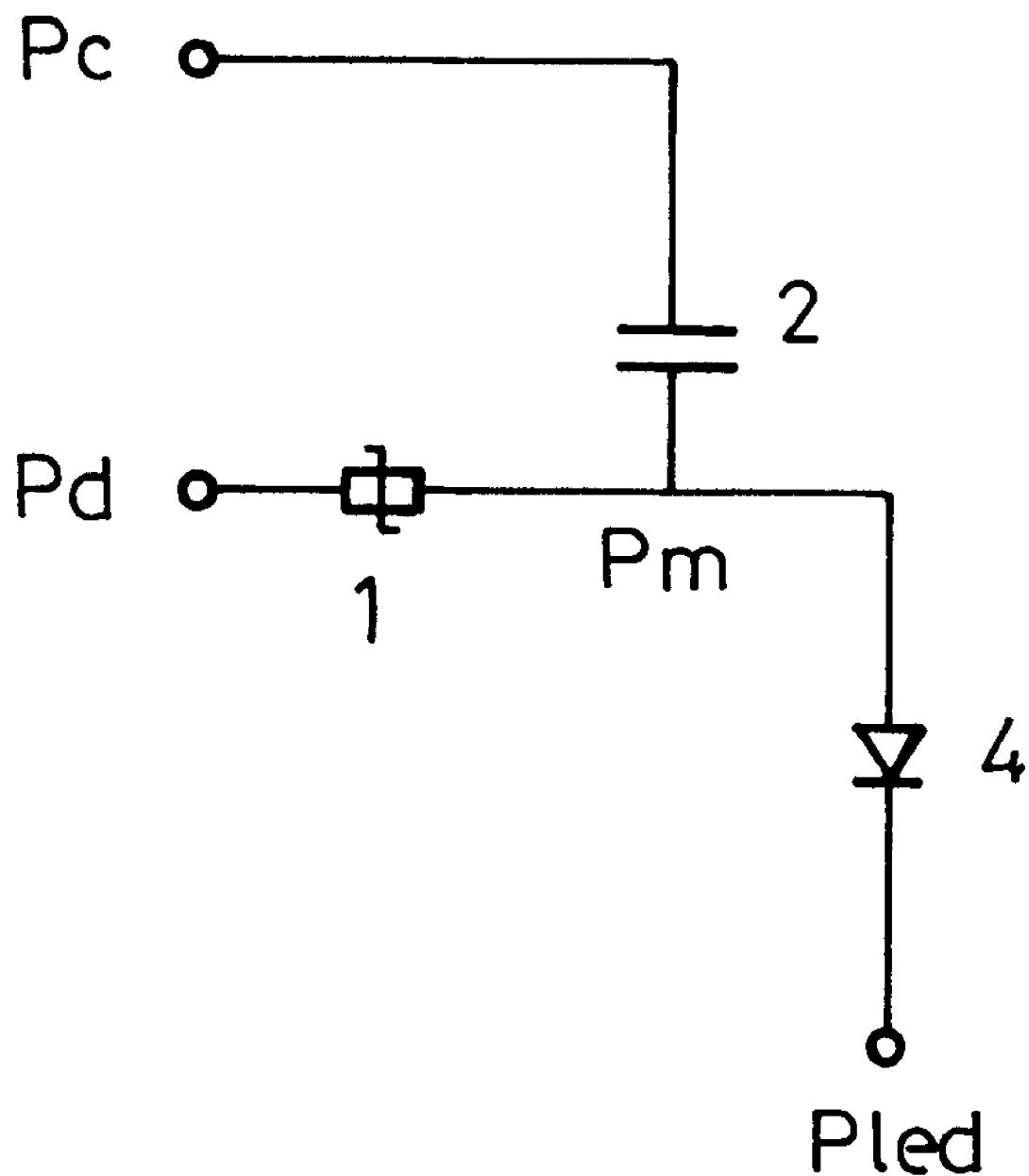
FIG. 43 is a drawing showing an equivalent circuit of a single pixel in a device in accordance with an eleventh embodiment of the present invention.

FIG. 43 a drawing showing an equivalent circuit of a single pixel of a light emitting diode device of this embodiment. Referring to FIG. 43, the pixel comprises a MIM (Metal-Insulator-Metal) element 1 serving as a non-linear element having bi-directional diode characteristics, a storage capacitor 2, and a light emitting diode 4.

In FIG. 43, the equivalent capacity component and the equivalent resistance component possessed by the light emitting diode are omitted.

The pixel further comprises an electrode Pc connected to the first side of the storage capacitor 2, an electrode Pm connected to the second side of the storage capacitor 2, an electrode Pd connected to the MIM element 1, and an electrode Pled connected to the cathode of the light emitting diode 4.

A data signal is applied to the electrode Pc, a selection reset signal is applied to the electrode Pd, and a potential appears in the electrode Pm due to charge and discharge of the storage diode 2 according to the data signal. The electrode Pled is at a fixed potential.

This embodiment is characterized in that the MIM element as a non-linear two-terminal element functions as a writing diode and a reset diode. The MIM element comprises an insulating thin layer held between two metallic or transparent conductive layers, and has bi-directional diode characteristics.

Figure 44:
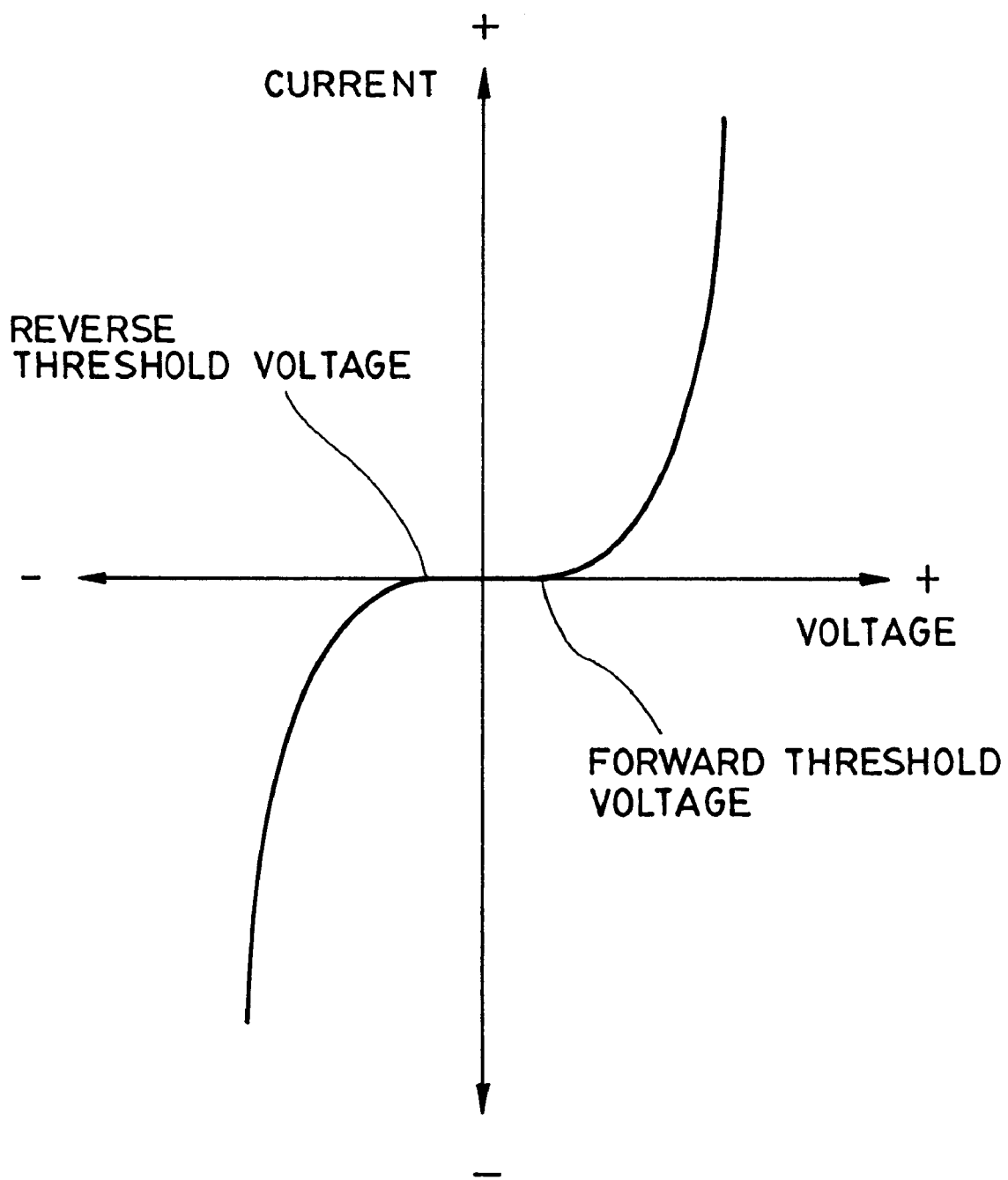
FIG. 44 is a drawing showing an example of voltage-current characteristics of an MIM element.

FIG. 44 shows an example of the voltage-current characteristics of the MIM element.

The MIM element has the property that resistance is high when the applied voltage is in the specified range lower than the forward threshold voltage and higher than the reverse threshold voltage, while the resistance rapidly decreases beyond this range.

The use of such an MIM element can decrease the number of elements of a pixel, and exhibits the advantage of ameliorating the complexity of a pixel.

The circuit is operated as described below.

When the selection reset signal applied to the electrode Pd is brought to a reset state (low-potential state), the potential of the electrode Pd drops. As a result, a reverse voltage higher than the reverse threshold voltage is applied to the MIM element 1 to cause a conduction state. Therefore, a current flows out of the storage capacitor 2. At this time, the data signal applied to the electrode Pc is fixed at a potential lower than the reset potential by the reverse threshold voltage of the MIM element. Thus, the potential of the electrode Pm is reset to the reset potential.

When the selection reset signal applied to the electrode Pd is brought to a selection state (high-potential state), the potential of the electrode Pd increases. The data signal applied to the electrode Pc is superposed on the potential to apply a forward voltage higher than the forward threshold potential to the MIM element 1, thereby causing a conduction state. Therefore, a current flows into the storage capacitor according to the data signal applied to the electrode Pc.

When the selection reset signal applied to the electrode Pd is brought to a non-selection state (medium-potential state), the voltage applied to the MIM element does not reach either of the forward threshold voltage and the reverse threshold voltage to cause a non-conduction state. The charge stored during the selection period according to the data signal applied to the electrode Pd flows out through the light emitting diode 4 to emit light from the light emitting diode 4 with a luminance corresponding to the signal, or an emission time corresponding to the signal.

During the time the selection rest signal applied to the electrode Pd is in the non-selection state (medium-potential state), the voltage applied to the MIM element 1 does not reach either of the forward threshold voltage and the reverse threshold voltage even if the data signal applied to the electrode Pc is superposed thereon, thereby causing the non-conduction state. Therefore, no current flows in and out of the storage capacitor 2 through the MIM element 1 even if the data signal applied to the electrode Pc changes, thereby substantially no influence on the emission of light from the light emitting diode 4.

Twelfth Embodiment

Figure 45:
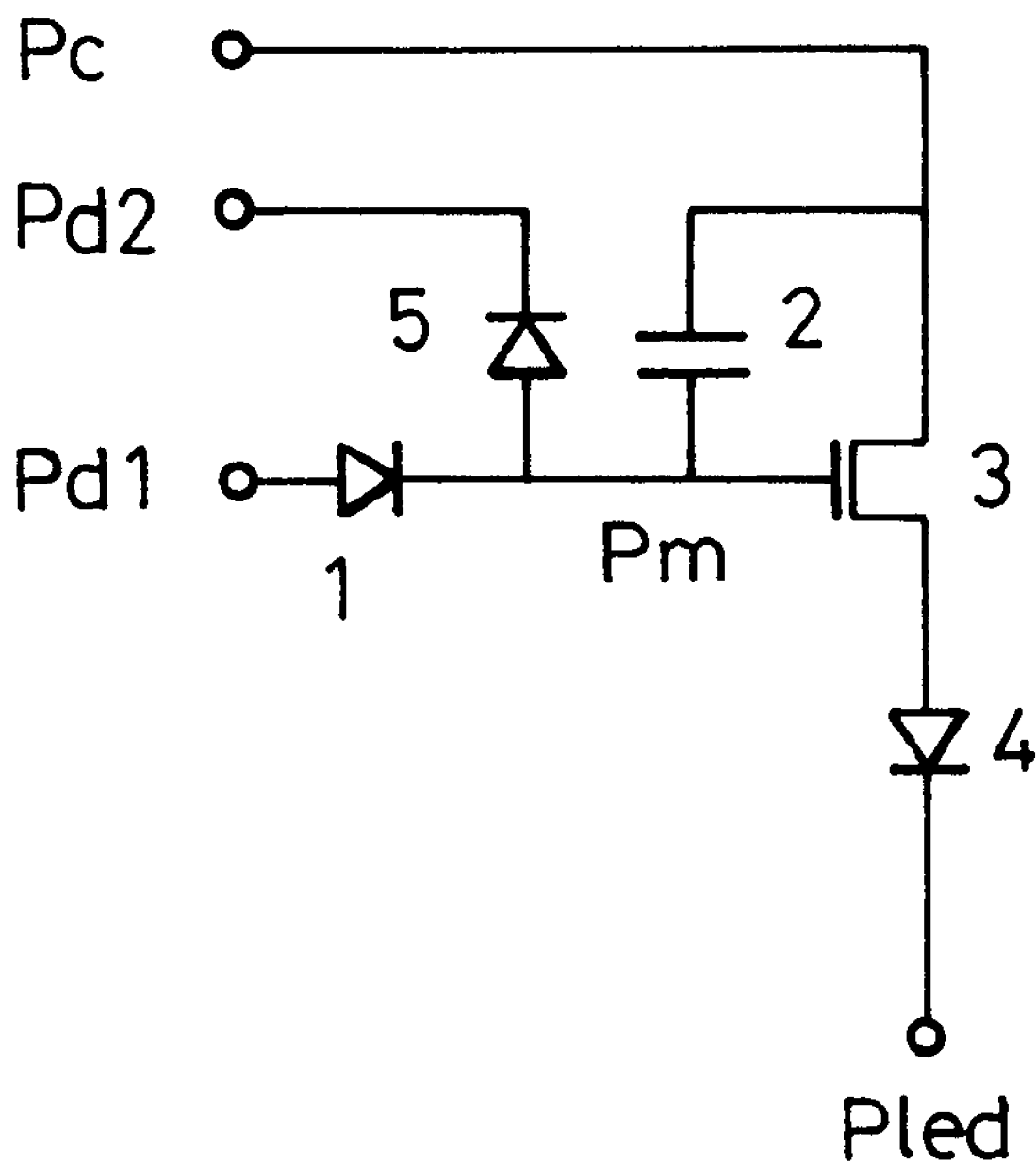
FIG. 45 is a drawing showing an equivalent circuit of a single pixel in a device in accordance with a twelfth embodiment of the present invention.

FIG. 45 is a drawing showing an equivalent circuit of a single pixel of a light emitting diode device of this embodiment. Referring to FIG. 45, the pixel comprises a first diode (writing diode) 1, a storage capacitor 2, a thin film transistor (driving transistor) 3, a light emitting diode 4, and a second diode (reset diode) 5.

In FIG. 45, the equivalent capacity component and the equivalent resistance component possessed by the light emitting diode are omitted.

The pixel further comprises an electrode Pc connected to the first side of the storage capacitor 2, an electrode Pm connected to the second side of the storage capacitor 2, an electrode Pd1 connected to the anode of the writing diode 1, an electrode Pd2 connected to the cathode of the reset diode 5, and an electrode Pled connected to the cathode of the light emitting diode 4.

A selection signal is applied to the electrode Pc, a data signal is applied to the electrode Pd1, a reset signal is applied to the electrode Pd2, and a potential appears in the electrode Pm due to charge and discharge of the storage diode 2 corresponding to the data signal. The electrode Pled is at a fixed potential.

This embodiment is characterized in that a transistor is provided on a pixel in order to control a current flowing through the organic light emitting diode serving as a light emitting portion. This controls the current flowing through the light emitting diode serving as a light emitting portion by the signal charge stored in the storage capacitor according to the data signal so that a current continuously flows through the light emitting diode even when the selection signal is brought to the non-selection state, to continuously emit light from the light emitting diode 4.

Where the transistor has a sufficiently high current amplification factor or a sufficiently low gate capacity, a sufficient current can be caused to flow through the organic light emitting diode even with the small signal charge stored in the storage capacitor according to the data signal.

In a case in which a pixel comprises no transistor, as described above in the first to eleventh embodiments, a charge corresponding to the integrated current flowing through the light emitting diode during the selection period and the non-selection period must be instantaneously stored in the storage capacitor during the selection period. Therefore, the writing diode in which a large current instantaneously flows must be formed to have a large area, accordingly decreasing the effective area of the light emitting diode. Also a large current instantaneously flows through a data signal line for applying the data signal to a pixel and a selection line for applying the selection signal thereto, thereby causing the problem of a voltage reduction due to wiring resistance.

In this embodiment, where the transistor has a sufficiently high amplification factor or a sufficiently low gate capacity, the current flowing through the light emitting diode can be controlled by a small signal charge, and a large current does not instantaneously flow. Therefore, the size of the writing diode can be decreased, and there is thus the advantage of avoiding the problem of a voltage reduction due to wiring resistance.

The circuit is operated as described below.

When the reset signal applied to the electrode Pd2 is brought to the reset state (low-potential state), the potential of the electrode Pd2 drops. As a result, a forward voltage is applied to the reset diode 5 to cause the conduction state. Thus, the potential of the electrode Pm is reset to the reset potential.

When the selection signal applied to the electrode Pc is brought to the selection state (low-potential state), the potential of the electrode Pc drops. As a result, the potential of the electrode Pm with the storage capacitor 2 held between both electrodes Pc and Pm also drops, and a forward voltage is applied to the writing diode 1, thereby causing the conduction state. Therefore, a current flows into the storage capacitor 2 according to the data signal applied to the electrode Pd1.

When the selection signal applied to the electrode Pc is brought to the non-selection state (high-potential state), the potential of the electrode Pm increases and reaches a potential corresponding to the data signal applied to the electrode Pd1 during the selection period. A current flows into the driving transistor 3 according to the data signal to emit light from the light emitting diode 4 with a luminance corresponding to the data signal, or for an emission time corresponding to the data signal.

During the time the selection signal applied to the electrode Pc is in the non-selection state (high-potential state), the writing diode 1 is in the non-conduction state, and thus no current flows into and out of the storage capacitor 2 through the writing diode 1 even if the data signal applied to the electrode Pd changes, thereby substantially no influence on the emission of light from the light emitting diode 4.

Figure 46:
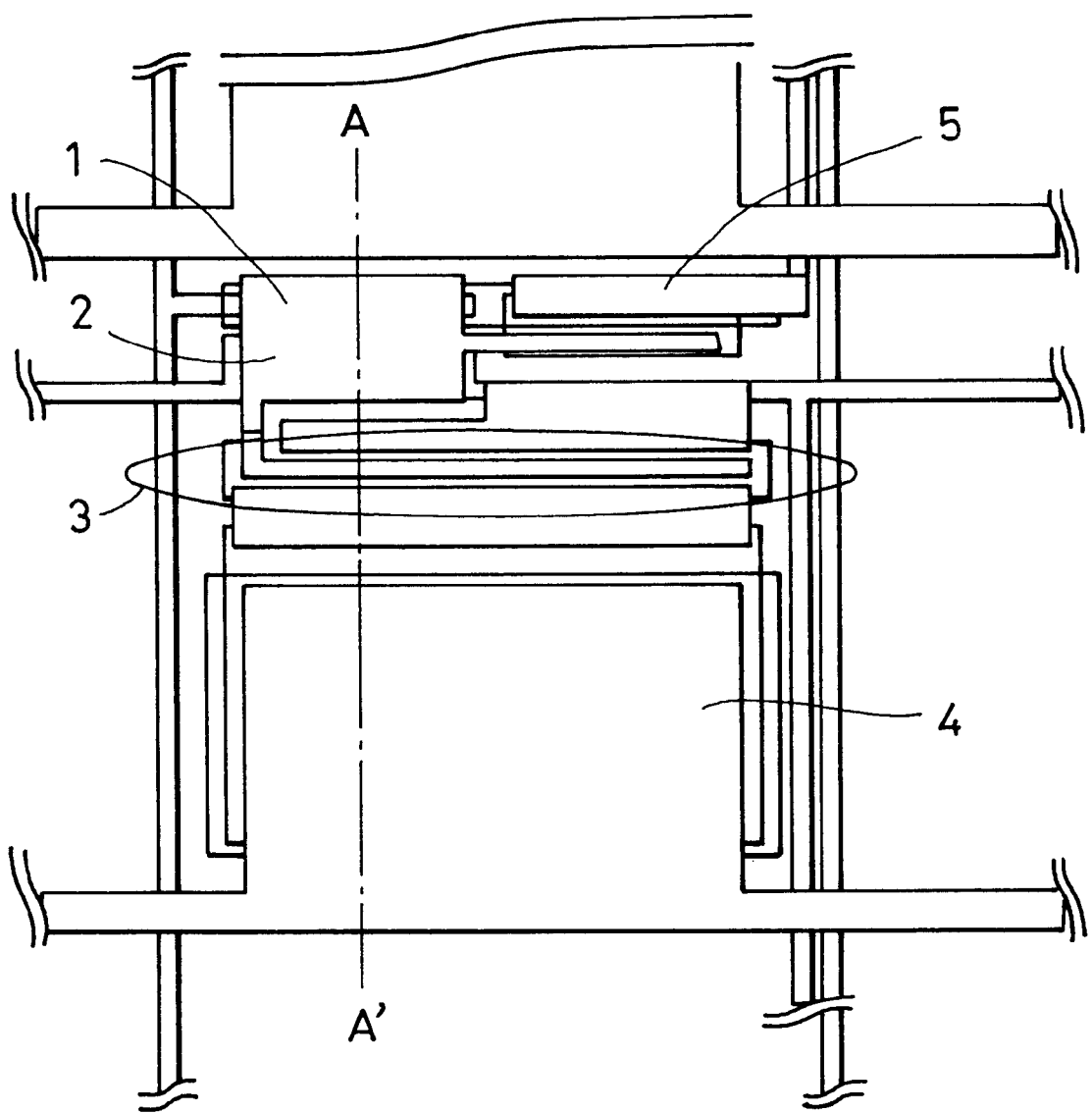
FIG. 46 is a plan view of a single pixel in the device in accordance with the twelfth embodiment of the present invention.

FIG. 46 is a plan view of a single pixel of the device of this embodiment.

Referring to FIG. 46, the pixel comprises the first diode (writing diode), the storage capacitor 2, the thin film transistor (driving transistor) 3, the light emitting diode 4, and the second diode (reset diode) 5.

In this embodiment, the writing diode and the light emitting diode can be formed by any one of the methods described above in the first to sixth embodiments and other portions. The storage capacitor 2 is formed to a structure in which a dielectric layer is held between a pair of electrodes. The dielectric material may be either an organic material or an inorganic material.

The transistor can also be formed by using an inorganic semiconductor, amorphous silicon or polycrystalline silicon, or the like.

However, even when the writing diode and reset diode are formed by using an organic layer, the formation of the transistor by using amorphous or polycrystalline silicon cannot omit the process of forming an element by using amorphous or polycrystalline silicon, thereby causing a disadvantage.

In order to form the transistor by using an organic layer, an example of possible structures is as follows.

Figure 47:
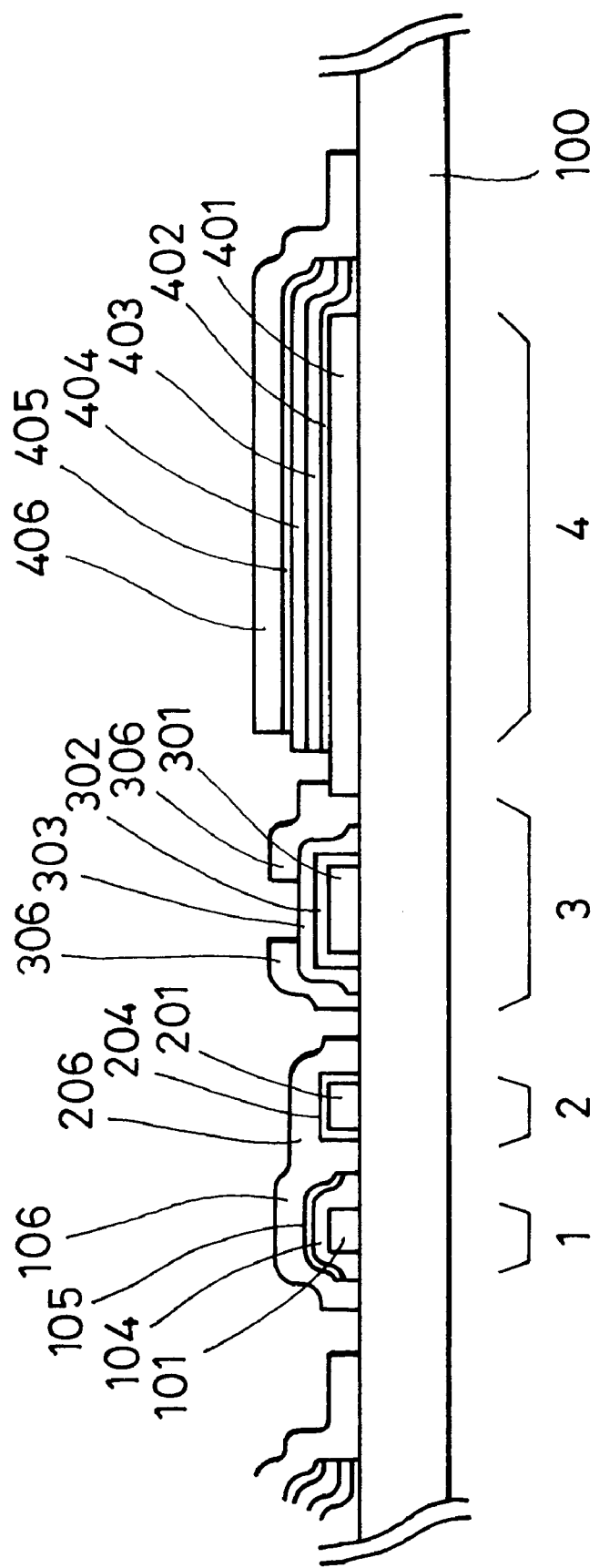
FIG. 47 is a schematic drawing showing the configuration of the device of the twelfth embodiment of the present invention.

FIG. 47 is a schematic drawing showing the construction of the device of this embodiment.

Referring to FIG. 47, the single pixel comprises the writing diode 1, the storage capacitor 2, the driving transistor 3, the light emitting diode 4, the reset diode 5, and a substrate 100.

The writing diode 1 comprises an anode 101 made of Au, an organic electron transport layer 104 made of tris(8-quinolinolato)aluminum complex (Formula 3), an electron injection layer 105 made of LiF, and a cathode 106 made of Al.

The storage capacitor 2 comprises an anode 201 made of Al, an insulation layer 204 made of an anodic oxide film of Al, and a cathode made 206 of Al.

The driving transistor 3 comprises a gate electrode 301 made of Cr, a gate insulating layer 302 made of $SiO_2$, an active layer made 303 of oligothiophene (Formula 1 4), and source and drain electrodes 306 made of Au.

The light emitting diode 4 comprises a transparent electrode 401 serving as an anode and made of indium/tin oxide (ITO), a hole injection layer 402 made of copper phthalocyanine (Formula 1), an organic hole transport layer 403 made of aromatic amine (Formula 2), an electron transport emission layer 404 made of tris(8-quinolinolato)aluminum complex (Formula 3), an electron injection layer 405 made of LiF, and a cathode 406 made of Al.

FIGS. 48 to 41 are schematic sectional views showing the process for manufacturing the device of this embodiment.

As shown in FIG. 48A, indium/tin oxide (ITO) is deposited to 0/15 µm by sputtering on a portion of the cleaned glass substrate 100 with good flatness, in which the light emitting portion is formed, and Al is deposited to 0.15 µm on a portion thereof in which the storage capacitor is formed.

As shown in FIG. 48B, an oxide film is formed, by anodic oxidation, on the surface of the Al layer in the portion in which the storage capacitor is formed.

As shown in FIG. 48C, Au is deposited to 0.15 µm on a portion in which the writing diode is formed, and Cr is deposited to 0.15 µm on a portion in which the driving transistor is formed.

Next, as shown in FIG. 49D, SiO$_2$ is deposited on Cr in the portion in which the driving transistor is formed, by sputtering or vacuum deposition.

As shown in FIG. 49E, oligothiophene (Formula 14) is deposited to 0.05 µm on the portion, in which the driving transistor is formed, by vacuum deposition to obtain the active layer of the driving transistor.

Next, as shown in FIG. 49F, Au is deposited to 0.15 µm on the portion in which the driving transistor is formed, to form the source and drain electrodes.

Figure 50G:
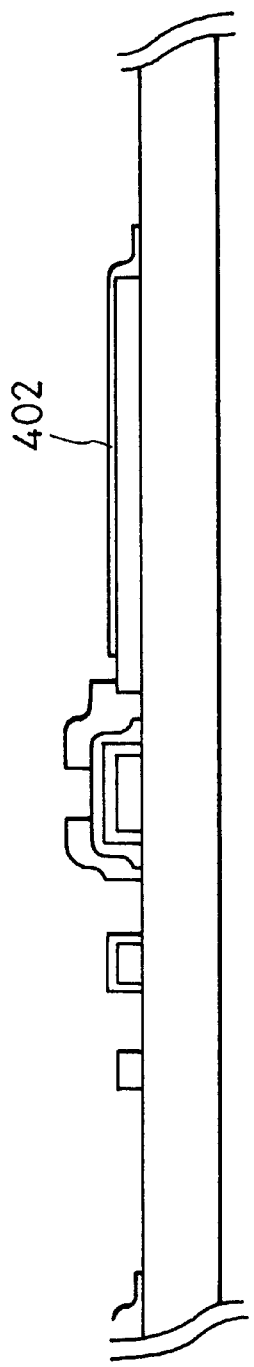
FIGS. 50G–50I are schematic drawings showing the method of manufacturing the device in accordance with the twelfth embodiment of the present invention.

Next, as shown in FIG. 50G, copper phthalocyanine (Formula 1) is deposited to 0.01 µm on the portion in which the light emitting portion is formed, by vacuum deposition.

Figure 50H:
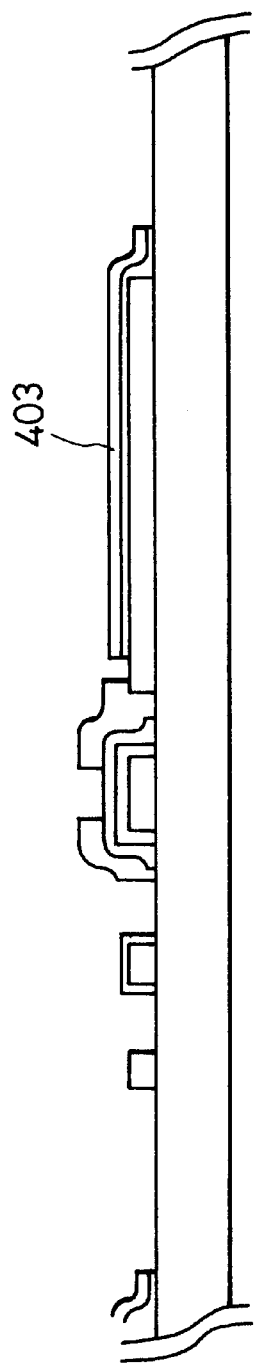

As shown in FIG. 50H, aromatic diamine (Formula 2) is deposited to 0.05 µm on the portion in which the light emitting portion is formed, by vacuum deposition.

Figure 50I:
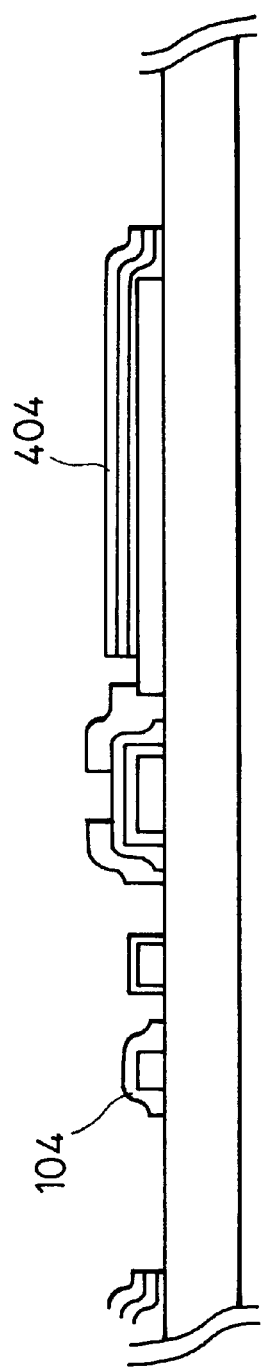

As shown in FIG. 50I, tris(8-quinolinolato)aluminum complex (Formula 3) is deposited to 0.05 µm on the organic hole transport layer of the portion in which the light emitting portion is formed, and on the indium/tin oxide (ITO) of the portion in which the writing diode is formed, to form an organic electron transport emission layer.

Figures 51J, 51K:
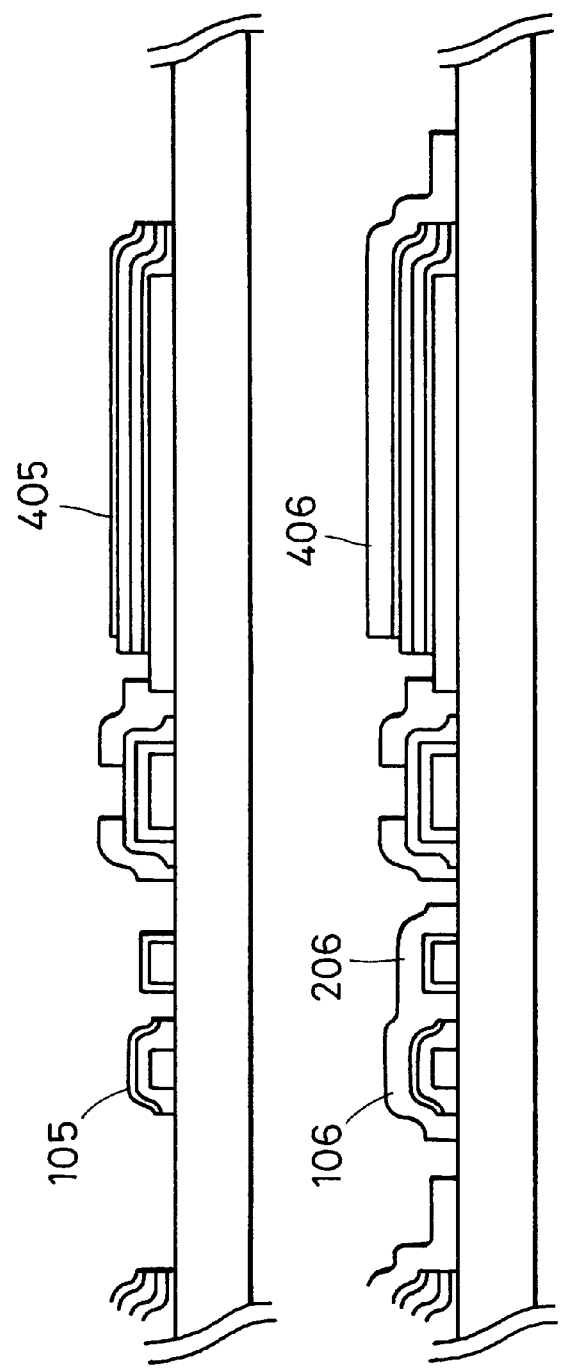
FIGS. 51J, 51K are schematic drawings showing the method of manufacturing the device in accordance with the twelfth embodiment of the present invention.

Next, as shown in FIG. 51J, an electron injection material is deposited to 0.001 µm on the organic electron transport layers of the light emitting portion and the writing diode to form an electron injection layer. As the electron injection material, LiF is used.

As shown in FIG. 51K, a metal having a low work function is deposited to 0.15 µm on the organic electron injection layer of the light emitting portion, the organic hole transport layer of the diode, and the anodic oxide layer of the capacitor portion to form cathode layers. As a metallic material, Al is used.

In a thin film field effect transistor which constitutes the driving transistor of this embodiment, it is generally necessary for the active layer to have high mobility. Organic materials which satisfy this requirement include other low-molecular materials and oligomers such as oligothiophene having a polymerization degree and substituent, which are different from those of the compound represented by Formula 1; porphyrin organic materials, for example, such as various phthalocyanine compounds, and the like; all of which have a relatively large π conjugate orbit in their molecules. Examples of conjugate high molecular compounds include poly(2,5-thienylenevinylene) (PVT) (Formula 15), poly(p-phenylenevinylene) (PPV) (Formula 11), polyacethylene (Formula 16), and the like.

However, of course, the organic material is not limited these compounds.

In this embodiment, the driving transistor can be formed without using an inorganic semiconductor such as amorphous or polycrystalline silicon or the like. It is thus possible to avoid an increase in cost which is due to the presence of the process for forming an element using amorphous or polycrystalline silicon.

Thirteenth Embodiment

The equivalent circuit of a device of this embodiment is the same as the twelfth embodiment.

FIG. 52 is a schematic sectional view showing the construction of the device of this embodiment.

Referring to FIG. 52, a pixel comprises a writing diode 1, a storage capacitor 2, a driving transistor 3, a light emitting diode 4, a reset diode 5, and a substrate 100.

The writing diode 1 comprises an anode 101 made of Au, an organic electron transport layer 104 made of tris(8-quinolinolato)aluminum complex (Formula 3), an electron injection layer 105 made of LiF, and a cathode 106 made of Al.

The storage capacitor 2 comprises an anode 201 made of Al, an insulation layer 204 made of an anodic oxide film of Al, and a cathode made 206 of Al.

The driving transistor 3 comprises a gate electrode 301 made of Cr, a gate insulating layer 302 made of SiO$_2$, an active layer made 303 of oligothiophene (Formula 14), and source and drain electrodes 306 made of Au.

The light emitting diode 4 comprises a transparent electrode 401 serving as an anode and made of indium/tin oxide (ITO), a hole transport emission layer 403 made of oligothiophene (Formula 14), and a cathode 406 made of Al.

FIGS. 53 to 55 are schematic sectional views showing the process for manufacturing the device of this embodiment.

As shown in FIG. 53A, indium/tin oxide (ITO) is deposited to 0.15 µm by sputtering on a portion of the cleaned glass substrate 100 with good flatness, in which the light emitting portion is formed, and Al is deposited to 0.15 µm on a portion thereof in which the storage capacitor is formed.

As shown in FIG. 53B, an oxide film is formed, by anodic oxidation, on the surface of the Al layer in the portion in which the storage capacitor is formed.

As shown in FIG. 53C, Au is deposited to 0.15 µm on a portion in which the writing diode is formed, and Cr is deposited to 0.15 µm on a portion in which the driving transistor is formed.

Next, as shown in FIG. 54D, Al is deposited to 0.15 µm on the anodic oxide film in the portion in which the storage capacitor is formed, to form a cathode layer.

As shown in FIG. 54E, SiO$_2$ is deposited on Cr in the portion in which the driving transistor is formed, by sputtering or vacuum deposition.

As shown in FIG. 54F, oligothiophene (Formula 14) is deposited to 0.05 µm on the portion, in which the driving transistor is formed, and 0.02 µm on the portion in which the light emitting portion is formed, by vacuum deposition to obtain the active layer of the driving transistor and the organic hole transport emission layer of the light emitting portion.

Figure 55G:
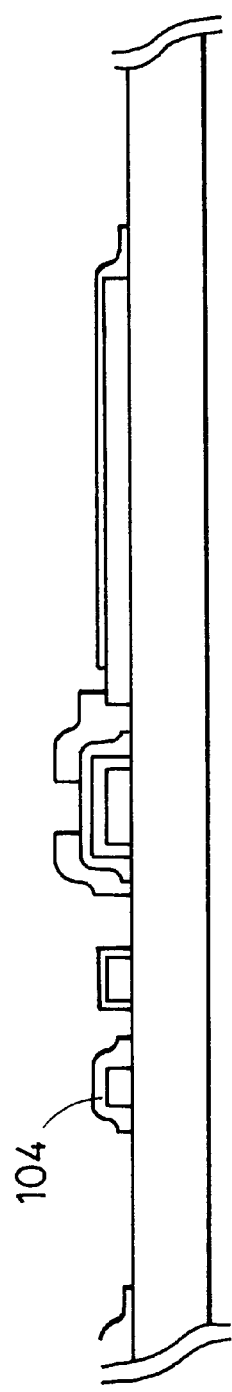
FIGS. 55G–55I are schematic drawings showing the method of manufacturing the device in accordance with the thirteenth embodiment of the present invention.

Next, as shown in FIG. 55G, Au is deposited to 0.15 µm on the portion in which the driving transistor is formed, to form the source and drain electrodes.

Figure 55H:
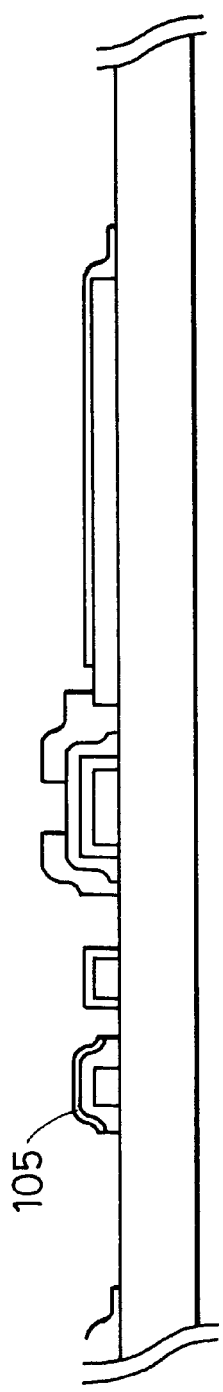

Next, as shown in FIG. 55H, tris(8-quinolinolato) aluminum complex (Formula 3) is deposited to 0.05 µm on the indium/tin oxide (ITO) in the portion in which the writing diode is formed, to form an organic electron transport layer.

Figure 55I:
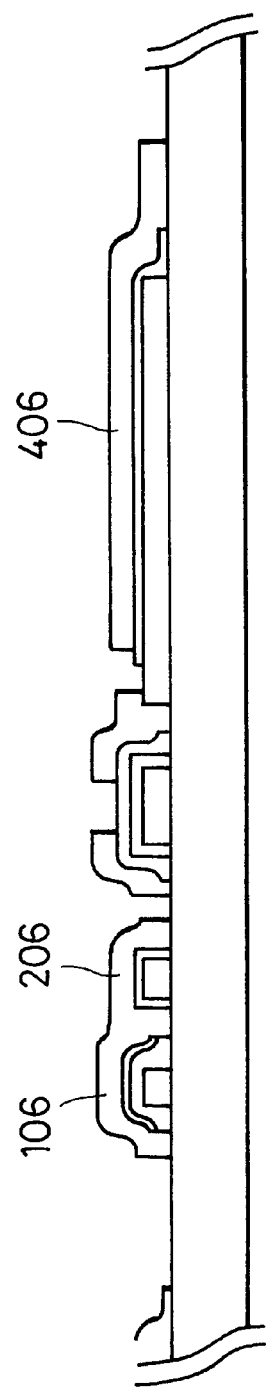

As shown in FIG. 55I, an electron injection material is deposited to 0.001 µm on the organic electron transport layers of the writing diode to form an electron injection layer. As the electron injection material, LiF is used.

Next, Al which is a metal having a low work function is deposited on the electron hole transport emission layer of the light emitting portion (organic light emission portion), and the organic electron transport layer of the writing diode to form cathode layers.

In this embodiment, the organic layers which respectively constitute the writing diode, the reset diode, the light emitting diode, and the driving transistor partially comprise a common layer containing a common organic substance and simultaneously formed by the same step, thereby improving productivity. The organic hole transport emission layer of the light emitting portion may be formed by using oligothiophene having a different degree of polymerization.

In the above-described twelfth and thirteenth embodiments, writing of a data signal in the storage capacitor of a pixel and reset are performed by using the diode, control of a current flowing through the light emitting diode is performed by using the transistor according to the stored charge. In this case, the driving transistor is required to have the properties that it has the ability to drive a current sufficient to emit light from the light emitting diode with a sufficient luminance, and that the current amplification factor is high for controlling the current by a slight charge stored in the storage capacitor. The ON/OFF ratio of current may be a relatively low value.

In order that writing of a data signal in the storage capacitor of a pixel, and reset are also performed by the transistor, a transistor having a sufficiently high ON/OFF ratio of a current is demanded for avoiding a cross talk due to a signal appearing in the data signal line during the non-selection period of a pixel When such properties are obtained, or when the light emitting diode comprises a small number of pixels so that the time length of the non-section period is not so long, as compared with the time length of the selection period, the construction below is also possible.

Fourteenth Embodiment

Figure 56:
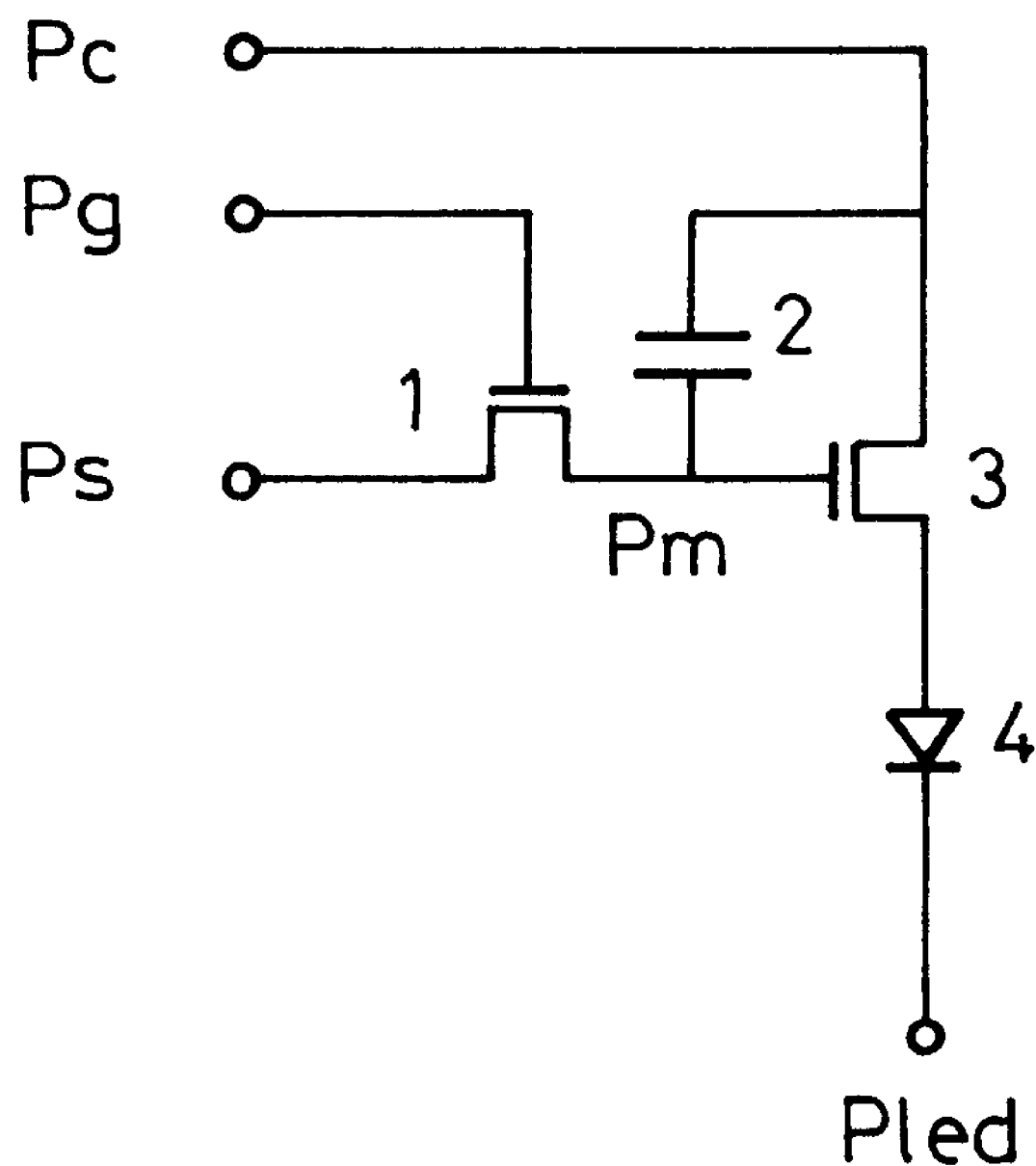
FIG. 56 is a drawing showing an equivalent circuit of a single pixel in a device in accordance with a fourteenth embodiment of the present invention.

FIG. 56 is a schematic sectional view showing the construction of the device of this embodiment.

Referring to FIG. 56, a pixel comprises a first thin film transistor (address transistor) 1, a storage capacitor 2, a second thin film transistor (driving transistor) 3, and a light emitting diode 4. In FIG. 56, the equivalent capacity component and the equivalent resistance component possessed by the light emitting diode are omitted.

The pixel further comprises an electrode Ps connected to the source electrode of the address transistor 1, an electrode Pm connected to the second side of the storage capacitor 2 and the gate electrode of the driving transistor 3, an electrode Pg connected to the gate electrode of the address transistor 1, an electrode Pc connected to the first side of the storage capacitor 2 and the source electrode of the driving transistor 3, and an electrode Pled connected to the anode of the organic light emitting diode 4.

A selection signal is applied to the electrode Pg, a data signal is applied to the electrode Ps, and a potential appears in the electrode Pm due to charge and discharge of the storage diode 2 according to the data signal. The electrodes Pc and Pled is at a fixed potential.

The circuit is operated as follows.

When the selection signal applied to the electrode Pg is brought to the selection state (high-potential state), the potential of the electrode Pg increases, thereby causing conduction between the source and drain of the address transistor. As a result, a current flows in and out of the storage capacitor 2 according to the data signal applied to the electrode Ps to set a potential difference between the source and gate electrodes of the driving transistor, i.e., a potential difference between the electrode Pc and Pm, to a value corresponding to the data signal applied to the electrode Ps. Therefore, a current corresponding to the data signal flows through the driving transistor 3 to emit light from the light emitting diode 4 with a luminance corresponding to the data signal. When the selection signal applied to the electrode Pg is brought to the non-selection state (low-potential state), the source and drain of the address transistor are made non-conductive. As a result, even if the data signal applied to the electrode Pd changes, no current flows into and out of the storage capacitor 2 through the address transistor 1. Therefore, the potential difference between the electrodes Pc and Pm slightly changes, thereby causing substantially no influence on the emission of light from the light emitting diode 4.

Figure 57:
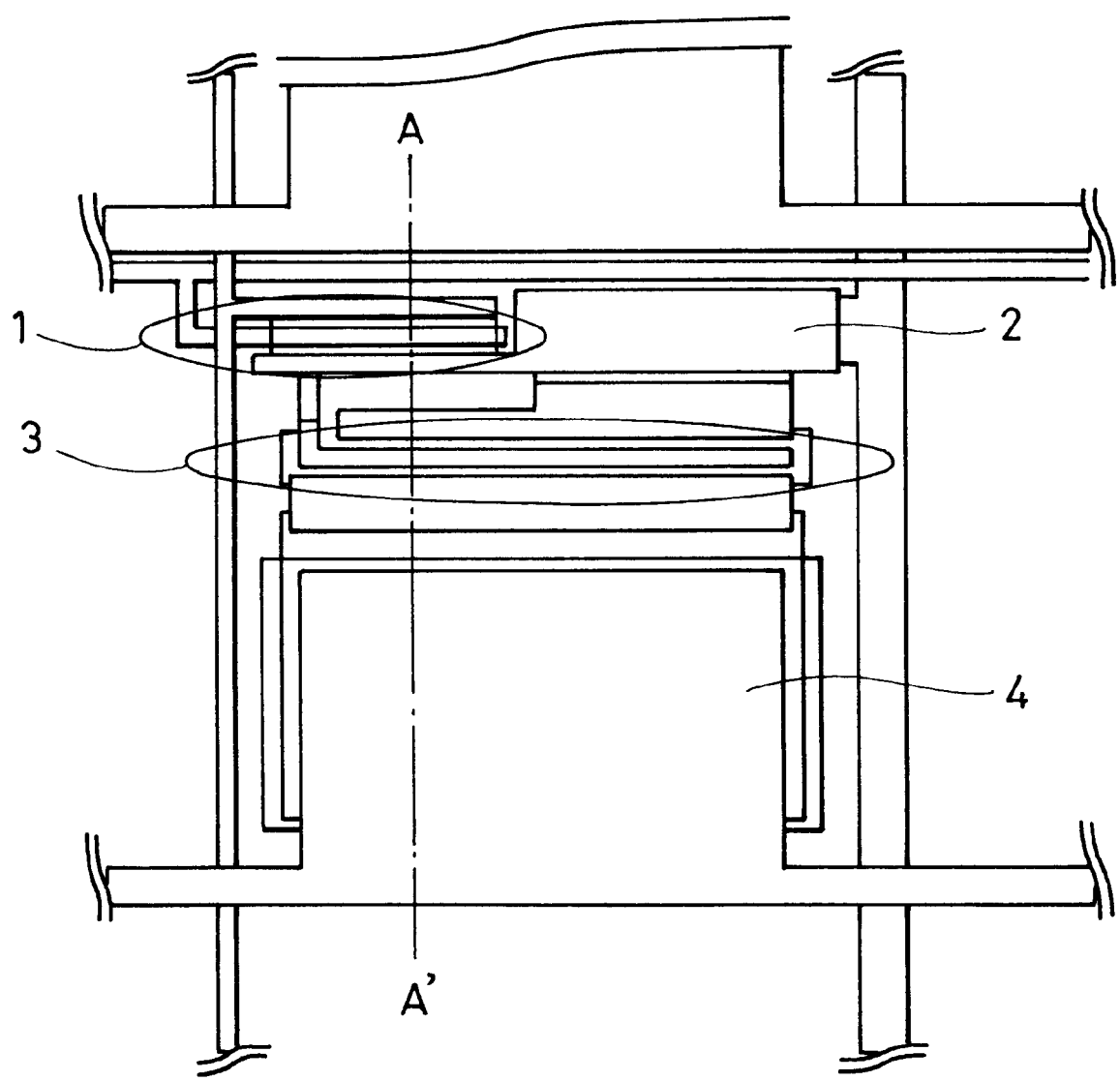
FIG. 57 is a plan view of a single pixel in the device in accordance with the fourteenth embodiment of the present invention.

FIG. 57 is a plan view of a single pixel of the device of this embodiment.

Referring to FIG. 57, a pixel comprises the first thin film transistor (address transistor) 1, the storage capacitor 2, the second thin film transistor (driving transistor) 3, and the light emitting diode 4.

In this embodiment, the light emitting diode can be formed by any one of the methods described above in the first to sixth embodiments and other portions. The storage capacitor 2 is formed to a structure in which a dielectric layer is held between a pair of electrodes. The dielectric material may be an organic material or an inorganic material.

Figure 58:
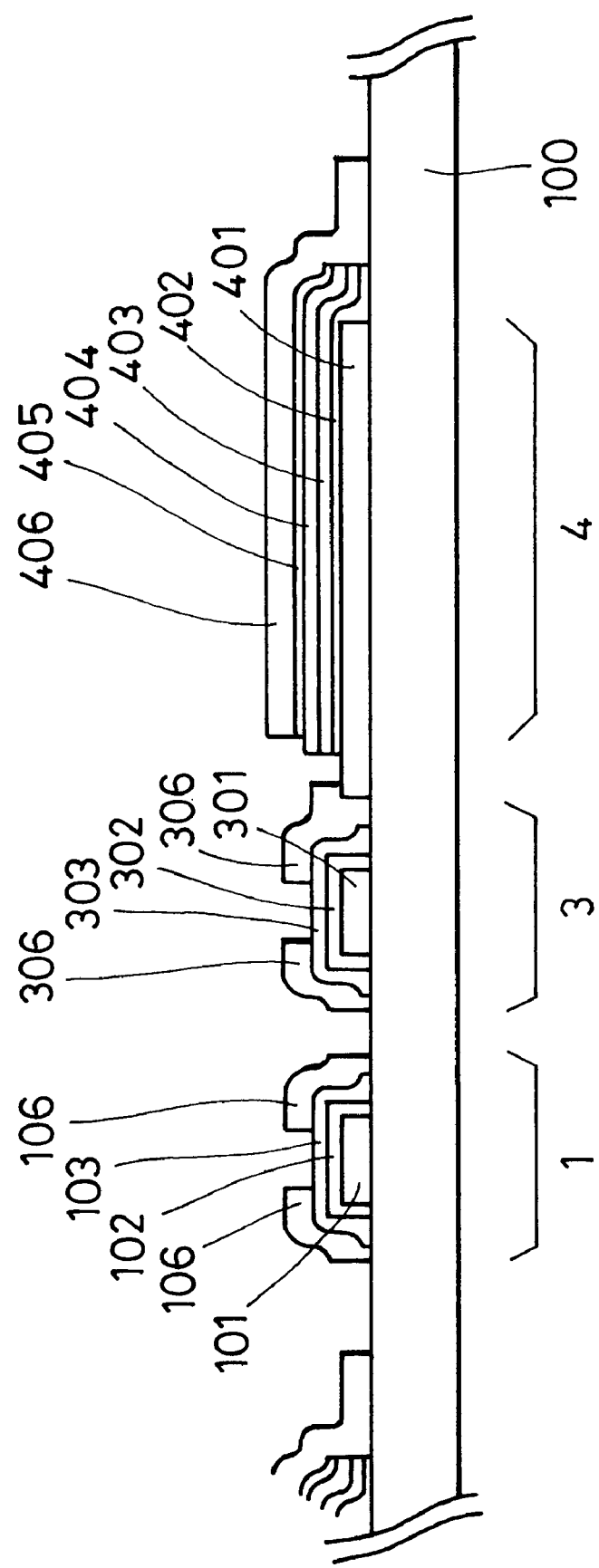
FIG. 58 is a schematic drawing showing the configuration of the device of the fourteenth embodiment of the present invention.

FIG. 58 is a schematic sectional view showing the construction of the device of this embodiment.

Referring to FIG. 58, a pixel comprises the address transistor 1, the storage capacitor 2, the driving transistor 3, the light emitting diode 4, and a substrate 100.

The address transistor 1 comprises a gate electrode 101 made of Cr, a gate insulating layer 102 made of $SiO_2$, an active layer 103 made of oligothiophene (Formula 14), and source and drain electrodes 106 made of Au.

The driving transistor 3 comprises a gate electrode 301 made of Cr, a gate insulating layer 302 made of $SiO_2$, an active layer made 303 of oligothiophene (Formula 14), and source and drain electrodes 306 made of Au.

The light emitting diode 4 comprises a transparent electrode 401 serving as an anode and made of indium/tin oxide (ITO), a hole injection layer 402 made of copper phthalocyanine (Formula 1), an organic hole transport layer 403 made of aromatic diamine (Formula 2), an electron transport emission layer 404 made of tris(8-quinolinolato)aluminum complex (Formula 3), an electron injection layer 405 made of LiF, and a cathode 406 made of Al.

FIGS. 59 to 62 are schematic sectional views showing the process for manufacturing the device of this embodiment.

As shown in FIG. 59A, indium/tin oxide (ITO) is deposited to 0.15 μm by sputtering on a portion of the cleaned glass substrate 100 with good flatness, in which the light emitting portion is formed, and Al is deposited to 0.15 μm on a portion thereof in which the storage capacitor is formed.

An oxide film is formed, by anodic oxidation, on the surface of the Al layer in the portion in which the storage capacitor is formed.

As shown in FIG. 59B, Cr is deposited to 0.15 μm on portions in which the address transistor and the driving transistor are respectively formed.

Next, as shown in FIG. 59C, SiO$_2$ is deposited on Cr in the portions in which the address transistor and the driving transistor are respectively formed, by sputtering or vacuum deposition.

As shown in FIG. 60D, oligothiophene (Formula 14) is deposited to 0.05 μm on the portions, in which the address transistor and the driving transistor are respectively formed, by vacuum deposition to obtain active layers of the address transistor and the driving transistor.

Next, as shown in FIG. 60E, Au is deposited to 0.15 μm on the portions in which the address transistor and the driving transistor are respectively formed, to form the source and drain electrodes.

As shown in FIG. 60F, copper phthalocyanine (Formula 1) is deposited to 0.01 μm on the portion, in which the light emitting portion is formed, by vacuum deposition.

Figure 61G:
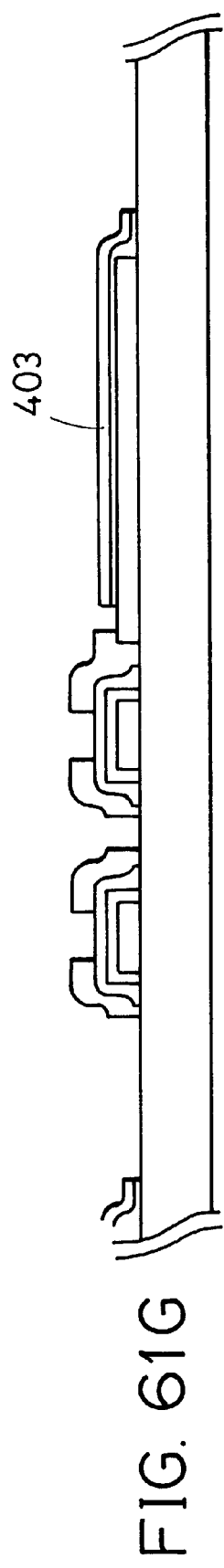
FIGS. 61G–61I are schematic drawings showing the method of manufacturing the device in accordance with the fourteenth embodiment of the present invention.

Next, as shown in FIG. 61G, aromatic diamine (Formula 2) is deposited to 0.05 μm on the portion, in which the light emitting portion is formed, by vacuum deposition.

Figure 61H:
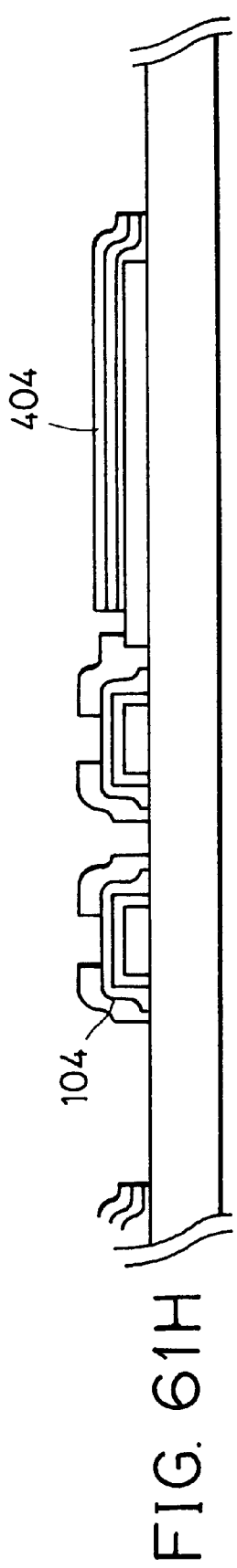

As shown in FIG. 61H, tris(8-quinolinolato)aluminum complex (Formula 3) is deposited to 0.05 μm on the organic hole transport layer in the portion in which the light emitting portion is formed, to form an organic electron transport emission layer.

Figure 61I:
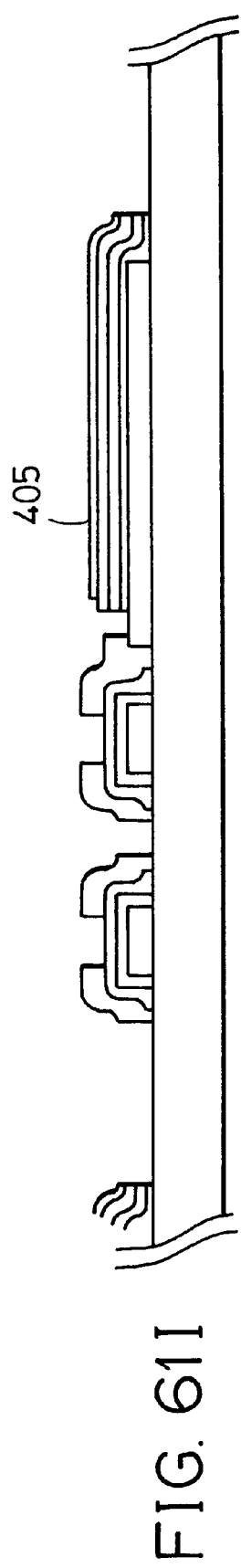

As shown in FIG. 61I, an electron injection material is deposited to 0.001 μm on the organic electron transport layer of the light emitting portion to form an electron injection layer. As the electron injection material, LiF is used.

Figure 62J:
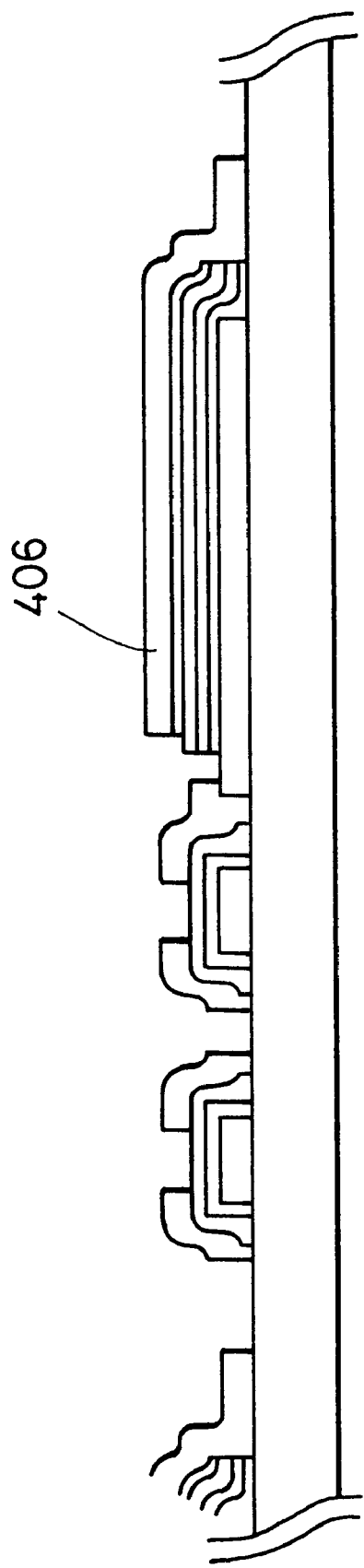
FIG. 62J is a schematic drawing showing the method of manufacturing the device in accordance with the fourteenth embodiment of the present invention.

Next, as shown in FIG. 62J, Al which is a metal having a low work function is deposited to 0.15 μm on the electron injection layer of the light emitting portion, and the anodic oxide layer of the capacitor to form cathode layers. As the metallic material, Al is used.

This embodiment is characterized in that the address diode is provided in place of a writing diode and reset diode. The configuration of the circuit is the same as a conventional example. In the same circuit configuration as a conventional example, the transistor comprises an active layer made of an organic material without using amorphous silicon or polycrystalline silicon. Of course, this configuration is possible as long as the transistor have satisfactory performance.

Fifth Embodiment

An organic light emitting diode of this embodiment will be described with reference to FIGS. 56, 57 and 66 to 69.

Referring to FIGS. 56 and 57, a pixel comprises an address transistor 1, a storage capacitor 2, a driving transistor 3, an organic light emitting diode 4, and a substrate 100.

Figure 66:
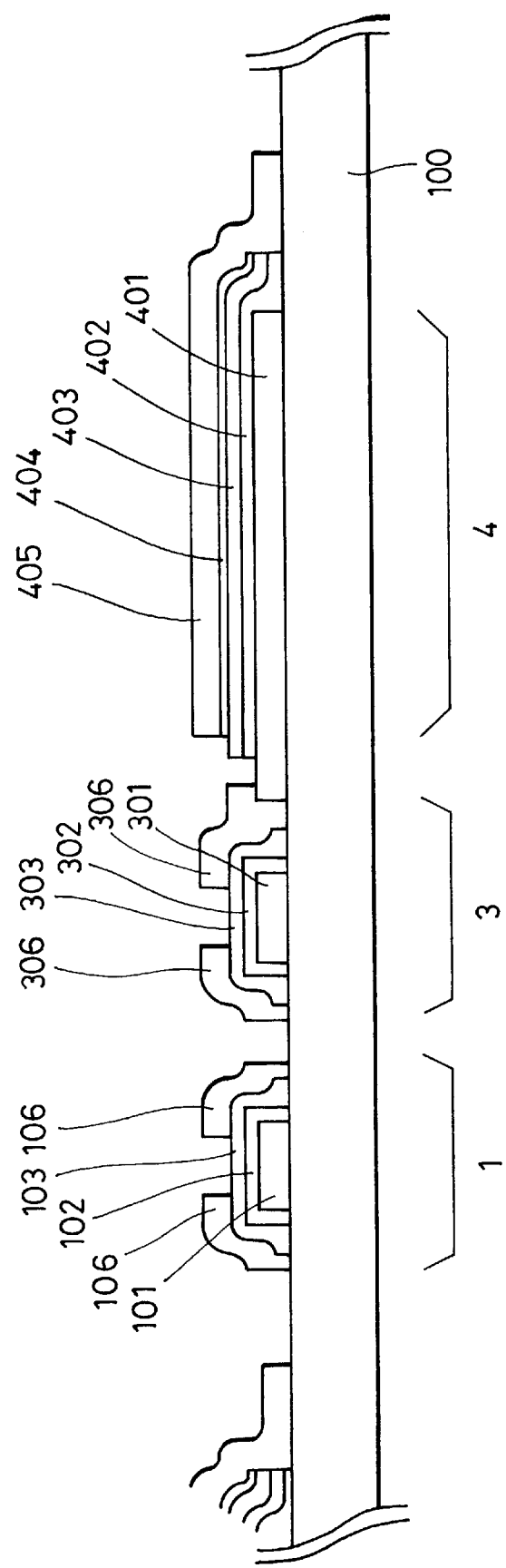
FIG. 66 is a schematic drawing showing an example of the device of the present invention.

FIG. 66 is a sectional view taken along line A–A7 in FIG. 57.

Referring to FIG. 66, the address transistor 1 comprises a gate electrode 101 made of Cr, a gate insulating layer 102 made of SiO$_2$, an active layer 103 made of polythiophene (Formula 18), and source and drain electrodes 106 made of Au.

The driving transistor 3 comprises a gate electrode 301 made of Cr, a gate insulating layer 302 made of SiO$_2$, an active layer made 303 of polythiophene (Formula 18), and source and drain electrodes 306 made of Au.

The light emitting diode 4 comprises a transparent electrode (indium/tin oxide (ITO)) 401 serving as an anode, an organic hole transport layer 402 made of polythiophene (Formula 18), an electron transport emission layer 403 made of tris(8-quinolinolato)aluminum complex (Formula 3), an electron injection layer 404 made of LiF, and a cathode 405 made of Al.

FIGS. 67 to 69 are schematic sectional views showing the process for manufacturing the light emitting diode device of this embodiment.

As shown in FIG. 67A, indium/tin oxide (ITO) is deposited to 0.15 μm by sputtering on a portion of the substrate 100, in which the light emitting portion is formed, and Al is deposited to 0.15 μm on a portion thereof in which the storage capacitor is formed. Then, an oxide film is formed, by anodic oxidation, on the surface of the Al layer in the portion in which the storage capacitor is formed.

As shown in FIG. 67B, Cr is deposited to 0.15 μm on portions in which the address transistor and the driving transistor are respectively formed.

Next, as shown in FIG. 67C, SiO$_2$ is deposited on the Cr layers in the portions in which the address transistor and the driving transistor are respectively formed, by sputtering.

Figure 68D:
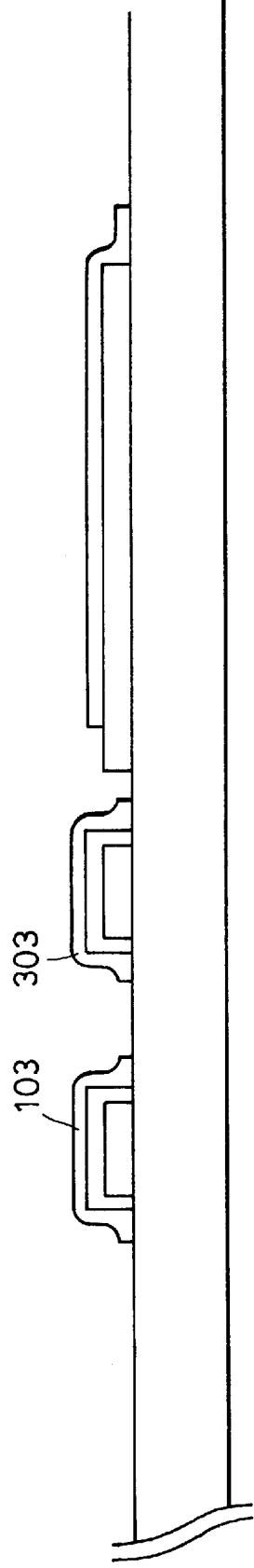
FIGS. 68D–68F are schematic drawings showing the method of manufacturing the device shown in FIG. 66.

As shown in FIG. 68D, polythiophene (Formula 18) is coated to 0.05 μm on the portions, in which the address transistor and the driving transistor are respectively formed, by spin coating to obtain active layers of the address transistor and the driving transistor.

Figure 68E:
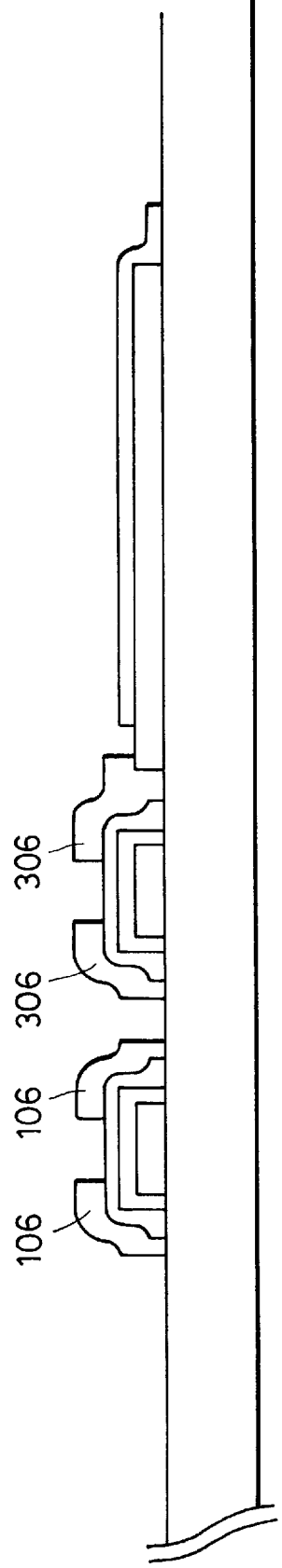

Then, as shown in FIG. 68E, Au is deposited to 0.15 μm on the portions in which the address transistor and the driving transistor are respectively formed, to form the source and drain electrodes.

Figure 68F:
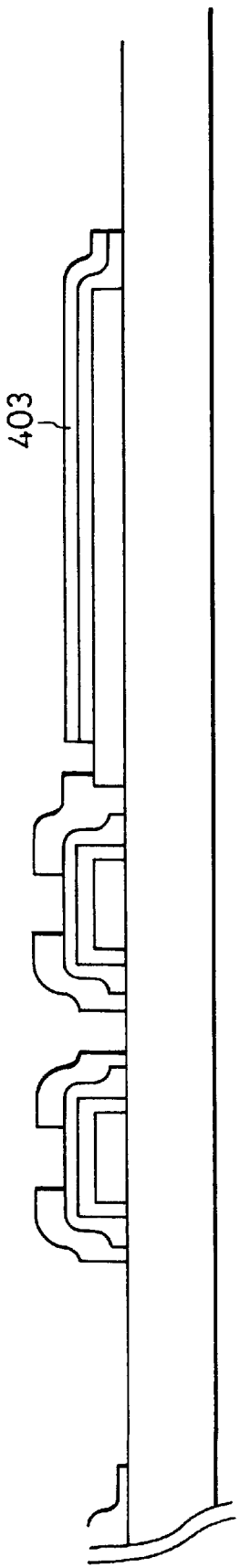

As shown in FIG. 68F, tris(8-quinolinolato)aluminum complex (Formula 3) is deposited to 0.05 μm on organic hole transport layer in the portion, in which the light emitting portion is formed, to form an organic electron transport emission layer.

Figure 69G:
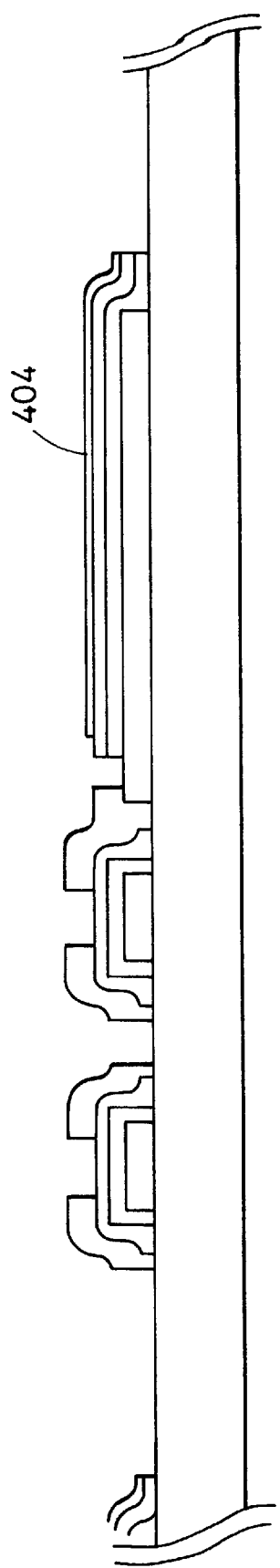
FIGS. 69G, 69H are schematic drawings showing the method of manufacturing the device shown in FIG. 66.

Then, as shown in FIG. 69G, an electron injection material is deposited to 0.001 μm on the organic electron transport layer to form an electron injection layer. As the electron injection material, LiF is used.

Figure 69H:
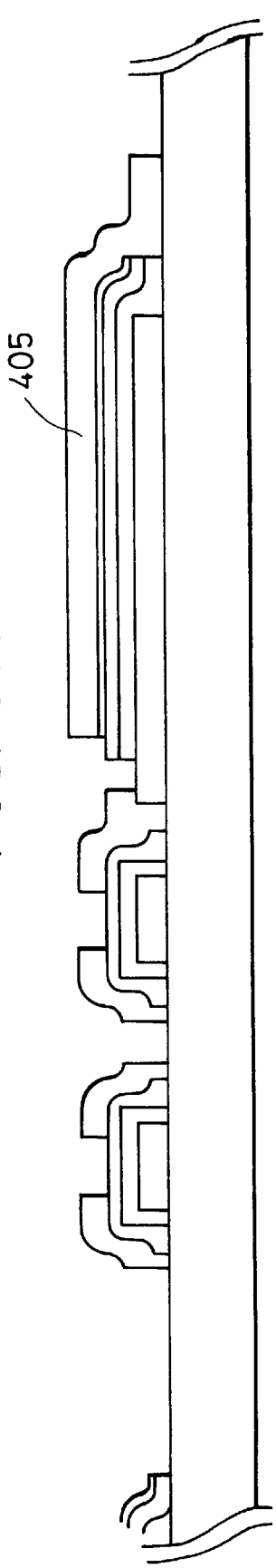
Figure 70:
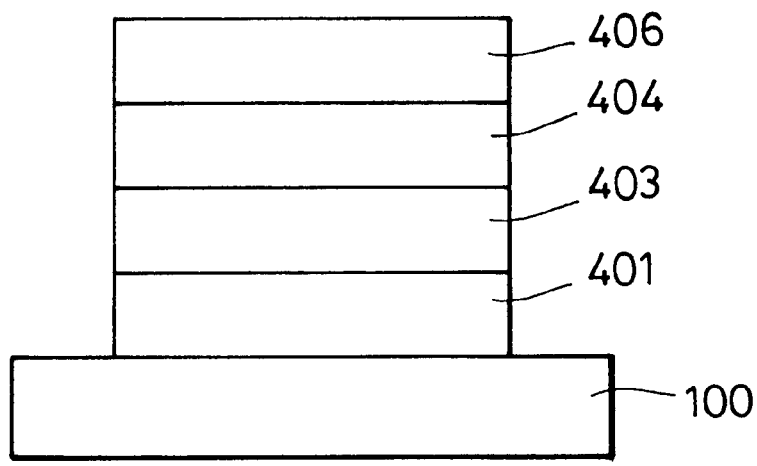
FIG. 70 is a schematic drawing showing a typical configuration of a conventional organic light emitting element.
Figure 71:
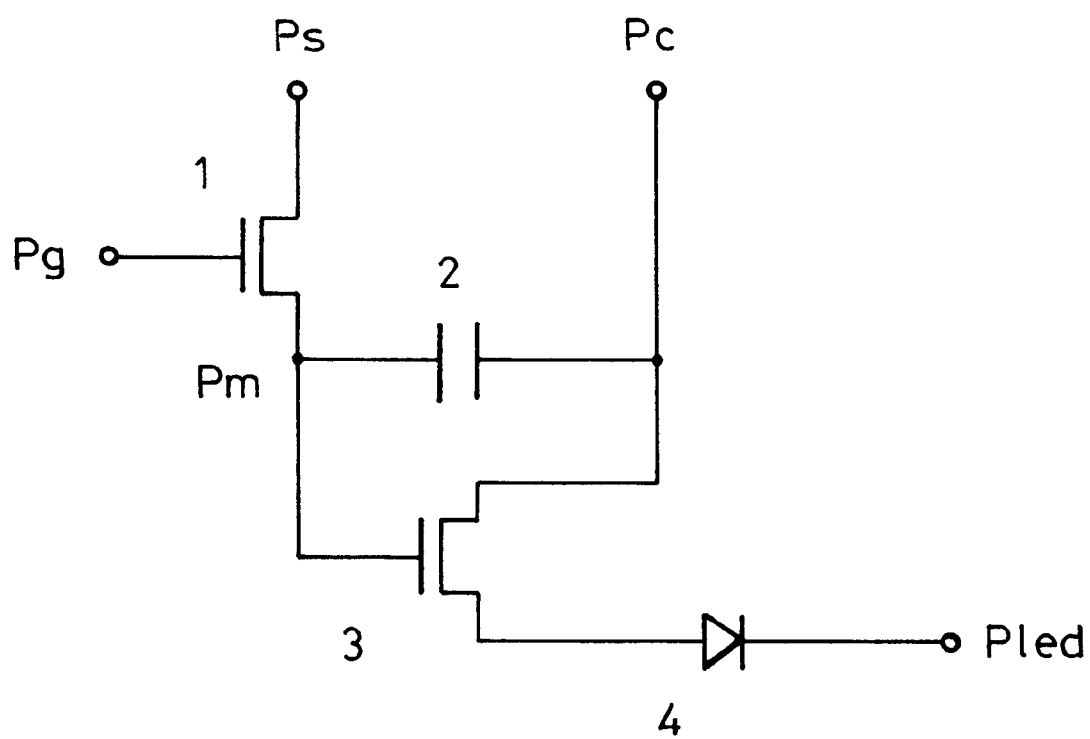
FIG. 71 is a drawing showing an equivalent circuit of a single pixel in a conventional organic light emitting device.
Figure 72:
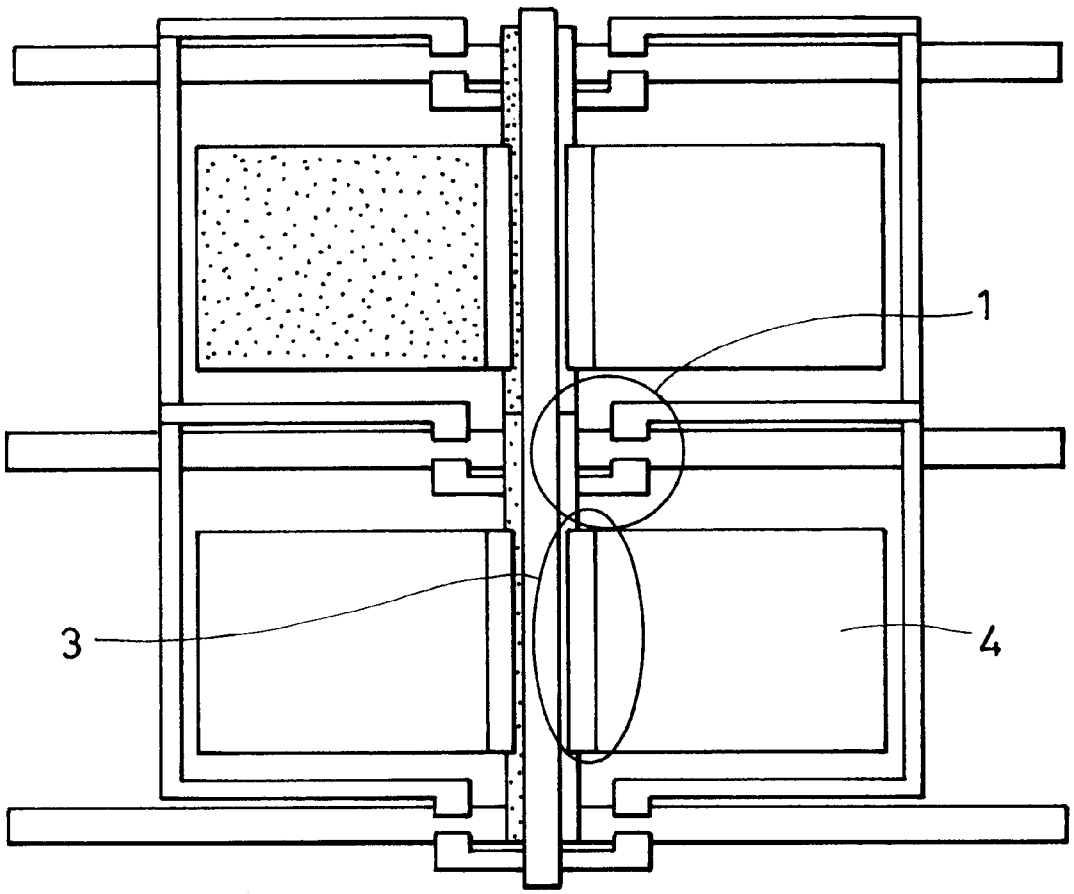
FIG. 72 is a plan view showing four pixels in a portion of a conventional organic light emitting device.
Figure 73:
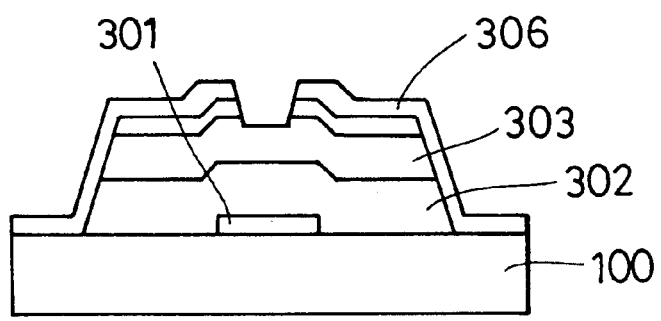
FIG. 73 is a schematic drawing of a thin film transistor which constitutes a pixel of a conventional organic light emitting element.

Next, as shown in FIG. 69H, Al which is a metal having a low work function is deposited to 0.15 μm on the electron injection layer of the light emitting portion, and the anodic oxide layer of the capacitor to form cathode layers. As the metallic material, Al is used.

This embodiment is characterized in that the transistor and the light emitting portion (organic light emitting diode) are provided by the coating method using the same material.

Since polythiophene (Formula 18) used in this embodiment is luminescent, the light emitting portion comprising only a polythiophene (Formula 18) layer can function as a light emitting portion (organic light emitting diode) with an electrode layer directly formed on the polythiophene layer without another layer of an organic material such as tris(8-quinolinolato)aluminum complex (Formula 3) deposited thereon.

In this case, the manufacturing cost of the device can further be decreased.

In the present invention, the material which constitutes the light emitting diode is not limited to the materials described in the above embodiments.

As material for the anode, besides indium/tin oxide (ITO), metals such as gold, silver, palladium, platinum, and the like; metal oxides; conductive polymers; and the like can also be used.

As the hole injection material, besides the materials described above in the embodiments, other porphyrin compounds, compounds such as m-MTDATA referred to as "star-burst amine", and the like can also be used.

As the hole transport material, besides the materials described above in the embodiments, aromatic amine compounds, hydrazone compounds, silazane compounds, polymers such as poly(2,5-thienylenevinylene), polysilazane, and the like, and other organic compounds can also be used as long as the hole transport ability is exhibited. Also these materials may be doped with various fluorescent materials, or inorganic materials such as silicon, diamond, and the like, which are doped with impurities, may be used.

Whether the material used is a hole transport material or a hole injection material depends upon not only its characteristics but also its role in the configuration of the device, i.e., whether the contribution of the material is due to hole injection from an anode or transport of the injected holes in the configuration of the device. The discrimination between hole injection and hole transport is not limited to this.

As the electron transport material, besides the materials described above in the embodiments, other organic metal complexes, aromatic compounds such as tetraphenylbutadiene, and the like, oxadiazole derivatives, triazole derivatives, and other organic materials may be used as long as the electron transport ability is exhibited. Also these materials may be doped with various fluorescent materials.

As the electron injection material, besides the materials described above in the embodiments, other materials may be used.

Besides a Mg—Ag alloy, the cathode may be made of an alloy of Al and Li, a metal having a low work function, such as tin, magnesium, indium, aluminum, calcium, or the like.

Besides the materials described above in the embodiments, various materials such as rubrene (Formula 17) and the like may be used as the fluorescent material doped.

As described above in the fifth embodiment, a structure comprising only one organic layer may be used in place of a laminated structure comprising a hole transport layer and an electron transport layer. Although, in this embodiment, molecules of any one of various organic materials are dispersed in poly(N-vinylcarbazole) (PVK) (Formula 8), one of various functional side chains may be added to a main chain of a polymer, or various functions may be added to the main chain. Also a π conjugate polymer such as poly(p-phenylenevinylene) (PPV), poly(2,5-thienylenevinylene) (PTV) (Formula 15), or the like may be used, or a structure comprising laminated polymer layers may be used.

The structure of the light emitting layer is also not limited to the structure described above in the embodiments.

All the hole injection layer, the hole transport layer, the electron transport layer, and the electron injection layer are not necessarily required. For example, as in the first embodiment, any of these layers may be omitted according to characteristics. Conversely, another light emitting layer and recombination layer may be further provided between the hole transport layer and the electron transport layer.

Other various film structures may be used.

The whole layer structure may be reversed, i.e., a structure comprising a cathode, an electron transport layer, a hole transport layer and an anode, which are deposited on a substrate in this order, may be used.

This structure is particularly required when a non-transmitting substrate such as a ceramic, metal or single crystal silicon substrate or the like is used in place of a light transmitting insulating substrate.

The method of manufacturing the organic light emitting diode is not limited to the above-described methods.

Besides the vacuum deposition and spin coating, various other deposition methods such as Langmuir-Blodgett technique, and the like can also be used.

In the above-described embodiments, the writing diode, the reset diode or the MIM element may comprise either a single element or a plurality of diodes, which are connected in series or parallel in the forward direction to form a circuit as a single unit, as long as the diode has the properties as a non-linear element in which the resistance changes with the applied voltage. This is employed for the reason of combining operation voltages, or the reason of ensuring an operation current.

The same is true for the storage capacitor and the thin film transistor. Such elements can be substituted by a circuit unit having an equivalent function.

The storage capacitor may be an element which is clearly formed as a capacitor, or a parasitic capacitor parasitic to wiring or an element such as the driving transistor, the reset diode, or the like.

Of course, the storage capacitor may be an equivalent capacity component of a diode, which functions as a storage capacitor.

The present invention has the effect of obtaining a light emitting diode device having high emission strength at low cost, and can provide various devices having good characteristics at low cost.

FIG. 63 is a drawing showing a display device using the device of the present invention, and a computer system.

This figure shows a display device using a light emitting device in which many pixels are arranged in a two-dimensional form so that light is emitted from each of the pixels according to a signal to display information, a computer for controlling and storing information, and a keyboard for inputting information. The use of the light emitting device of the present invention permits achievement of a device with low power consumption at low cost.

Figure 64:
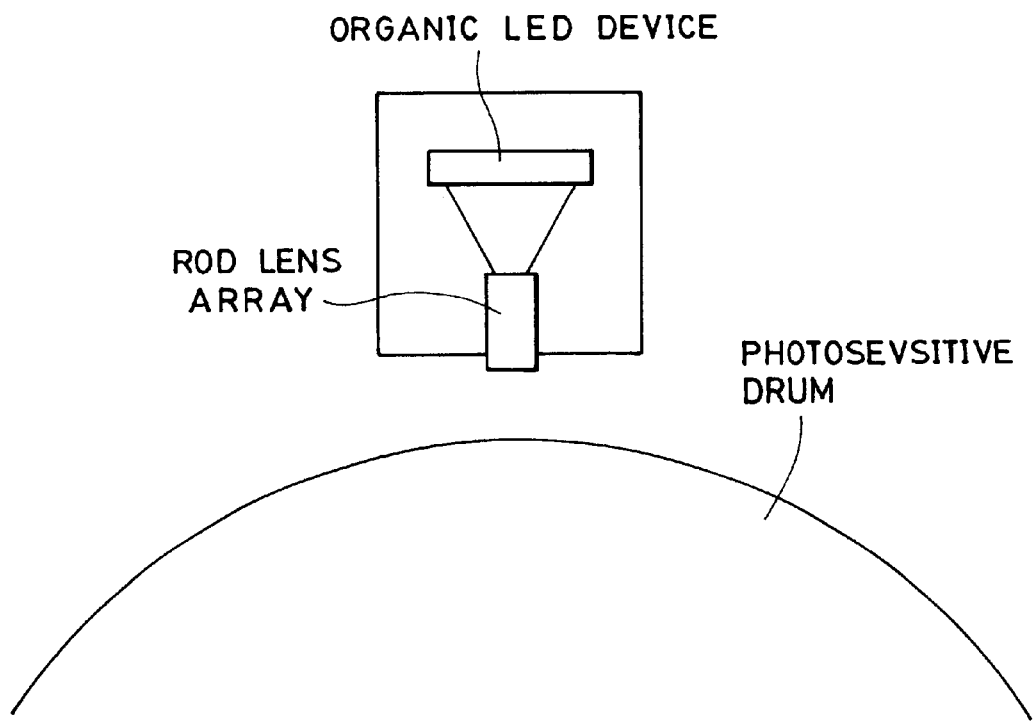
FIG. 64 is a schematic drawing showing an image forming apparatus using the device of the present invention.

FIG. 64 is a schematic drawing showing an image forming apparatus using the light emitting device of the present invention.

The image forming apparatus comprises an organic light emitting device comprising many pixels which are arranged in a one-dimensional form so that light is emitted from each of the pixels according to a signal. The emitted light is projected on a photosensitive drum by using a rod lens array to obtain an electrostatic latent image. The latent image is developed by a development device (not shown) to a toner image, which is then transferred onto printing paper or the like to form an image.

Figure 65:
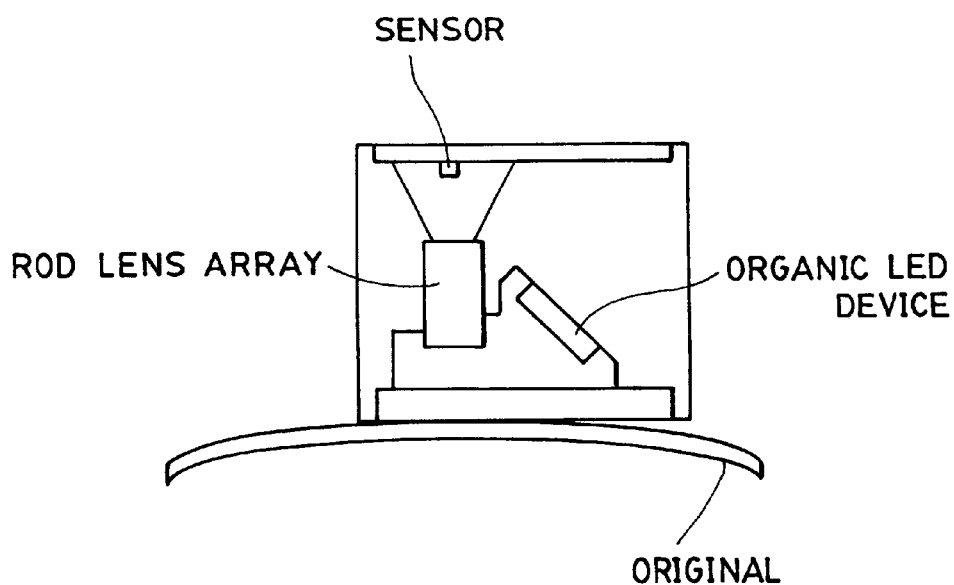
FIG. 65 is a schematic drawing showing an image reading apparatus using the device of the present invention.

FIG. 65 is a schematic drawing showing an image reading apparatus using the light emitting device of the present invention.

In an organic light emitting device comprising a plurality of pixels which emit different color lights, the pixels are switched to emit light from each of the pixels according to a signal, to illuminate an original. Reflected light is projected onto a sensor by a rod lens array to obtain image information on the original.

Formula 1
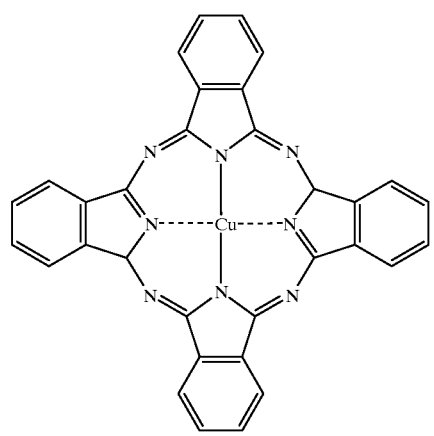
Formula 2
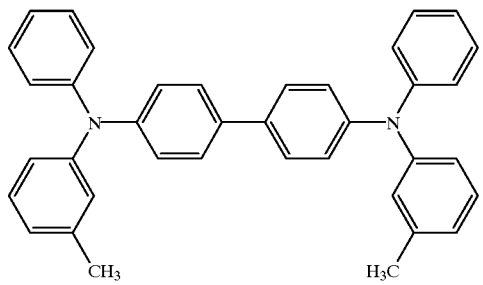
Formula 3
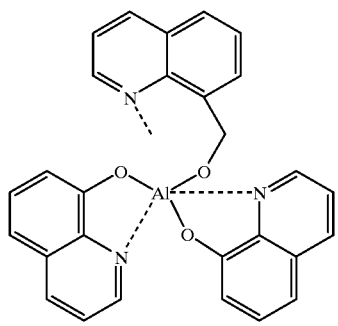
Formula 4
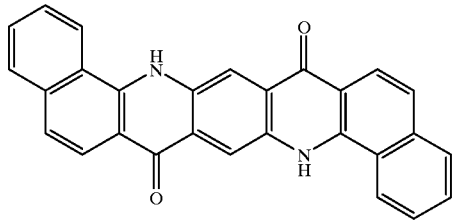
Formula 5
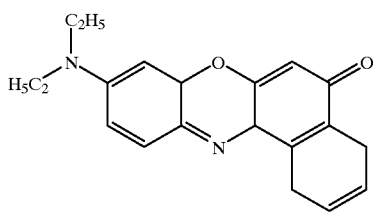
Formula 6
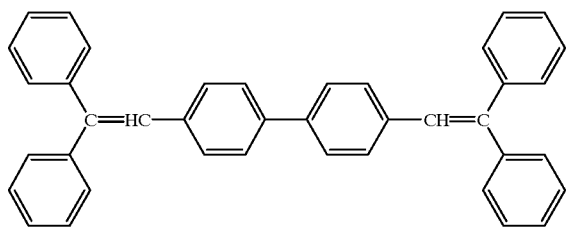
Formula 7
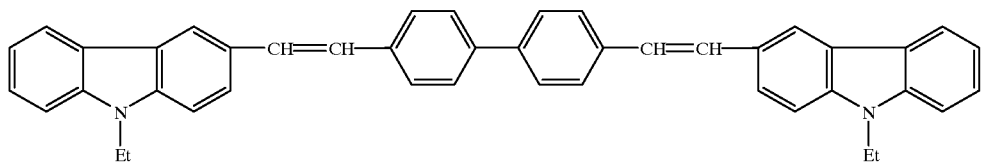
Formula 8
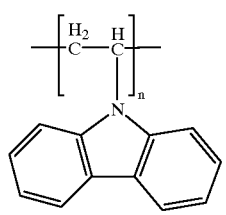
Formula 9
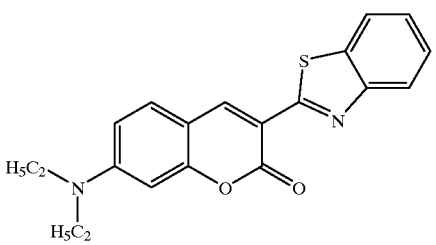
Formula 10
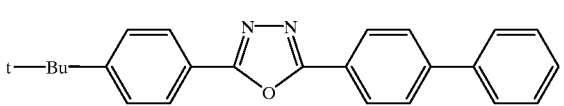
Formula 11
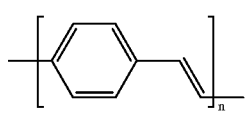

-continued

Formula 12

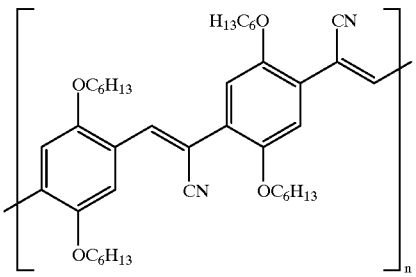

Formula 13

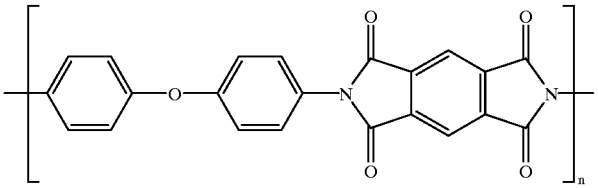

Formula 14

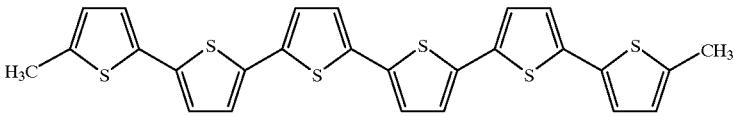

Formula 15

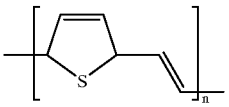

Formula 16

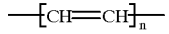

Formula 17

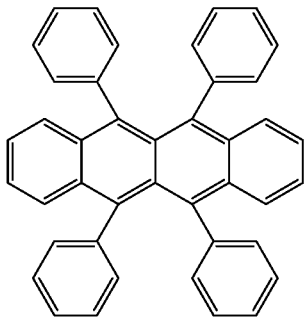

Formula 18

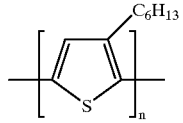

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A light emitting diode device comprising:
   a light emitting diode and a non-linear element, which are arranged on a substrate,
   wherein electric current or electric charge flowing through said light emitting diode corresponds to a signal charge applied through the non-linear element, and
   wherein the non-linear element has diode or bi-directional diode characteristics and comprises an organic compound layer.

2. A light emitting diode device according to claim 1, wherein the light emitting diode comprises a light emitting layer held between an anode and a cathode.

3. A light emitting diode device according to claim 2, wherein the light emitting layer comprises an organic compound.

4. A light emitting diode device according to claim 3, wherein the organic compound layers which respectively constitute the non-linear element and the light emitting diode have at least one common material.

5. A light emitting diode device according to claim 4, wherein the organic compound layers which respectively constitute the non-linear element and the light emitting diode are made of the same material.

6. A light emitting diode device according to claim 3, wherein the organic compound layers which respectively constitute the non-linear element and the light emitting diode are made of different materials.

7. A light emitting diode device according to claim 1, wherein the non-linear element controls a resistance of an element for a current flowing in the thickness direction of the organic compound layer to control charge storage in or discharge from a pixel according to the data signal.

8. A light emitting diode device according to claim 1, wherein the non-linear element has a light shielding layer.

9. A light emitting diode device according to claim 1, wherein the non-linear element has a low emission efficiency or emits substantially no light, as compared with the light emitting diode.

10. A method of manufacturing a light emitting diode device according to claim 1, wherein each of the light emitting diode and the non-linear element comprises an organic compound layer.

11. A method of manufacturing a light emitting diode device according to claim 10, wherein the organic compound layers which respectively constitute the non-linear element and the light emitting diode are made of different materials.

12. A method of manufacturing a light emitting diode device according to claim 10, wherein the organic compound layers which respectively constitute the non-linear element and the light emitting diode are made of the same material.

13. A method of manufacturing a light emitting diode device according to claim 10, wherein the non-linear element has diode characteristics.

14. A method of manufacturing a light emitting diode device according to claim 10, wherein the non-linear element has bidirectional diode characteristics.

15. A method of manufacturing a light emitting diode device according to claim 10, wherein the non-linear element comprises a transistor.

16. A method of manufacturing a light emitting diode device according to claim 15, wherein two transistors are arranged for one pixel.

17. A method of manufacturing a light emitting diode device according to claim 16, wherein one of the transistors is connected in series to the light emitting diode, and the other transistor is connected in series to the gate of the one transistor.

18. A light emitting diode device according to claim 1, wherein the non-linear element is connected in series to the light emitting diode.

19. A light emitting diode device according to claim 1, wherein a transistor is connected to the light emitting diode.

20. A light emitting diode device according to claim 19, wherein a drain or source terminal is connected to the light emitting diode.

21. A light emitting diode device according to claim 20, wherein the non-linear element is connected to a gate of the transistor.

\* \* \* \* \*

UNITED STATES PATENT AND TRADEMARK OFFICE
CERTIFICATE OF CORRECTION

PATENT NO. : 6,350,996 B1
DATED : February 26, 2002
INVENTOR(S) : Tatsundo Kawai et al.

It is certified that error appears in the above-identified patent and that said Letters Patent is hereby corrected as shown below:

<u>Drawings,</u>
FIG. 64, "PHOTOSEVSITIVE" should read -- PHOTOSENSITIVE --.

<u>Column 5,</u>
Line 50, "are a" should read -- are --.

<u>Column 20,</u>
Line 66, "s the" should read -- as the --; and
Line 67, "an nile" should read -- and Nile --.

<u>Column 21,</u>
Line 1, "sued" should read -- used --; and
Line 3, "s the" should read -- as the --; and "an nile" should read -- and Nile --.

<u>Column 26,</u>
Line 39, "o the" should read -- on the --.

<u>Column 28,</u>
Line 51, "made" should read -- made to --.

<u>Column 29,</u>
Lines 32 and 44, "made" should read -- made to --;
Line 52, "FIG. 43 a" should read -- FIG. 43 is a --.

<u>Column 32,</u>
Line 62, "made 206" should read -- 206 made --; and
Line 66, "(Formula 1 4)," should read -- (Formula 14), --.

<u>Column 34,</u>
Line 5, "limited" should read -- limited to --; and
Line 30, "made 206" should read -- 206 made --.

<u>Column 35,</u>
Line 44, "pixel" should read -- pixel. --.

<u>Column 36,</u>
Line 7, "is" should read -- are --.

UNITED STATES PATENT AND TRADEMARK OFFICE
CERTIFICATE OF CORRECTION

PATENT NO. : 6,350,996 B1
DATED : February 26, 2002
INVENTOR(S) : Tatsundo Kawai et al.

It is certified that error appears in the above-identified patent and that said Letters Patent is hereby corrected as shown below:

<u>Column 37,</u>
Line 52, "have" should read -- has --.

<u>Column 38,</u>
Line 38, "on" should read -- on an --.

<u>Column 39,</u>
Line 41, as the" should read -- as the doped --.
Line 42, "doped" should be deleted;
Line 51, "Also" should read -- Also, --; and
Line 57, "All the" should read -- The --.

<u>Column 40,</u>
Line 24, "which" should read -- , which --.

Signed and Sealed this

Eighteenth Day of June, 2002

Attest:

JAMES E. ROGAN
*Attesting Officer*   *Director of the United States Patent and Trademark Office*